(12) United States Patent
Cheng et al.

(10) Patent No.: US 11,340,398 B2
(45) Date of Patent: May 24, 2022

(54) WAVEGUIDE STRUCTURE AND OPTOELECTRONIC DEVICE COMPRISING THE SAME

(71) Applicant: ARTILUX, INC., Menlo Park, CA (US)

(72) Inventors: Szu-Lin Cheng, Hsinchu County (TW); Chien-Yu Chen, Hsinchu County (TW); Han-Din Liu, Hsinchu County (TW); Chia-Peng Lin, Hsinchu County (TW); Chung-Chih Lin, Hsinchu County (TW); Yun-Chung Na, Hsinchu County (TW); Pin-Tso Lin, Hsinchu County (TW); Tsung-Ting Wu, Hsinchu County (TW); Yu-Hsuan Liu, Hsinchu County (TW); Kuan-Chen Chu, Hsinchu County (TW)

(73) Assignee: ARTILUX, INC., Menlo Park, CA (US)

(*) Notice: Subject to any disclaimer, the term of this patent is extended or adjusted under 35 U.S.C. 154(b) by 278 days.

(21) Appl. No.: 16/663,266

(22) Filed: Oct. 24, 2019

(65) Prior Publication Data

US 2020/0132927 A1 Apr. 30, 2020

Related U.S. Application Data

(60) Provisional application No. 62/854,987, filed on May 31, 2019, provisional application No. 62/838,319,
(Continued)

(51) Int. Cl.
*G02B 6/10* (2006.01)
*G01J 1/04* (2006.01)
(Continued)

(52) U.S. Cl.
CPC ............ *G02B 6/102* (2013.01); *G01J 1/0407* (2013.01); *G01J 1/42* (2013.01);
(Continued)

(58) Field of Classification Search
CPC . G02B 6/102; G02B 6/10; G02B 6/00; G02B 6/24; G02B 6/42; G02B 6/4201;
(Continued)

(56) References Cited

U.S. PATENT DOCUMENTS

2007/0187787 A1* 8/2007 Ackerson .......... H01L 27/14643
257/428
2007/0200055 A1* 8/2007 Reznik .............. H01L 27/14625
250/208.1
(Continued)

FOREIGN PATENT DOCUMENTS

JP 06224398 A * 8/1994

*Primary Examiner* — Thanh Luu
*Assistant Examiner* — Monica T Taba
(74) *Attorney, Agent, or Firm* — WPAT, P.C., Intellectual Property Attorneys; Anthony King

(57) ABSTRACT

A waveguide structure includes a first surface having a first width, a second surface having a second width, the second surface being opposite to the first surface, and a sidewall surface connecting the first surface and the second surface. The first width is greater than the second width.

17 Claims, 72 Drawing Sheets

Related U.S. Application Data filed on Apr. 25, 2019, provisional application No. 62/784,534, filed on Dec. 23, 2018, provisional application No. 62/750,798, filed on Oct. 25, 2018.

(51) Int. Cl.
  *G01J 1/42*     (2006.01)
  *H01L 31/0232*  (2014.01)
  *H01L 31/0304*  (2006.01)
  *H01L 31/028*   (2006.01)

(52) U.S. Cl.
  CPC ...... *H01L 31/02327* (2013.01); *H01L 31/028* (2013.01); *H01L 31/03046* (2013.01)

(58) Field of Classification Search
  CPC ......... H01L 31/02327; H01L 31/03046; H01L 31/028; G01J 1/0407; G01J 1/42; G01J 1/0266; G02F 1/011
  See application file for complete search history.

(56)         References Cited

U.S. PATENT DOCUMENTS

| | | | |
|---|---|---|---|
| 2010/0244167 A1* | 9/2010 | Konno | H01L 27/14625 |
| | | | 257/432 |
| 2012/0050600 A1* | 3/2012 | Ahn | H01L 27/14629 |
| | | | 348/336 |
| 2012/0273907 A1* | 11/2012 | Lim | H01L 27/14629 |
| | | | 257/432 |
| 2018/0040651 A1* | 2/2018 | Lee | H01L 27/1461 |
| 2018/0190698 A1 | 7/2018 | Na et al. | |
| 2019/0393255 A1* | 12/2019 | Lee | H01L 27/14689 |

\* cited by examiner

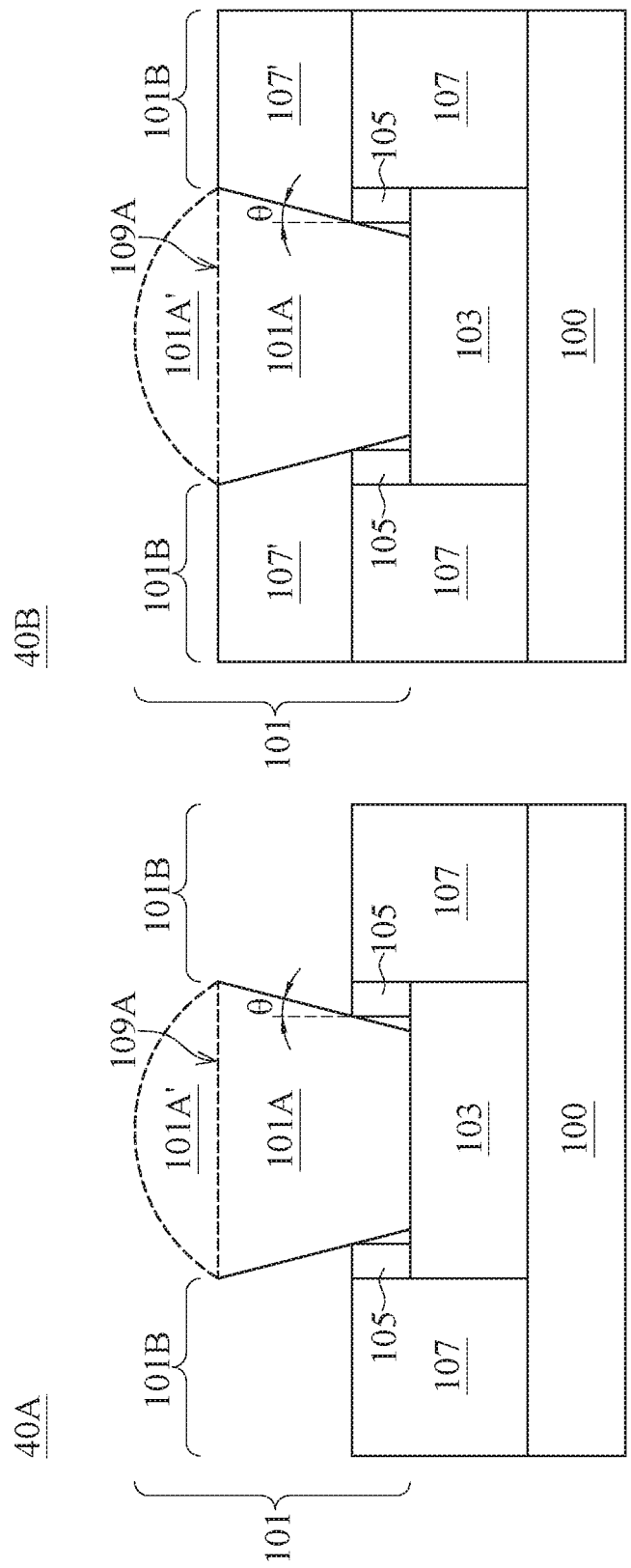

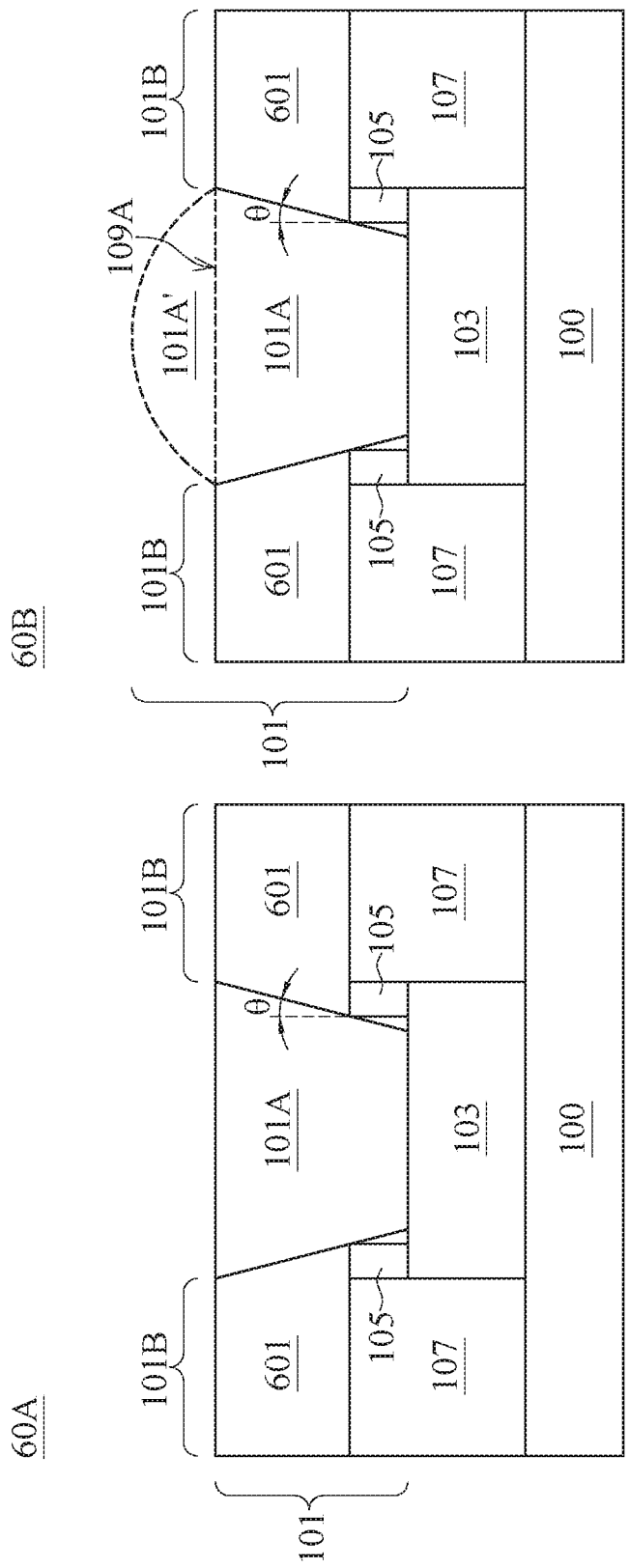

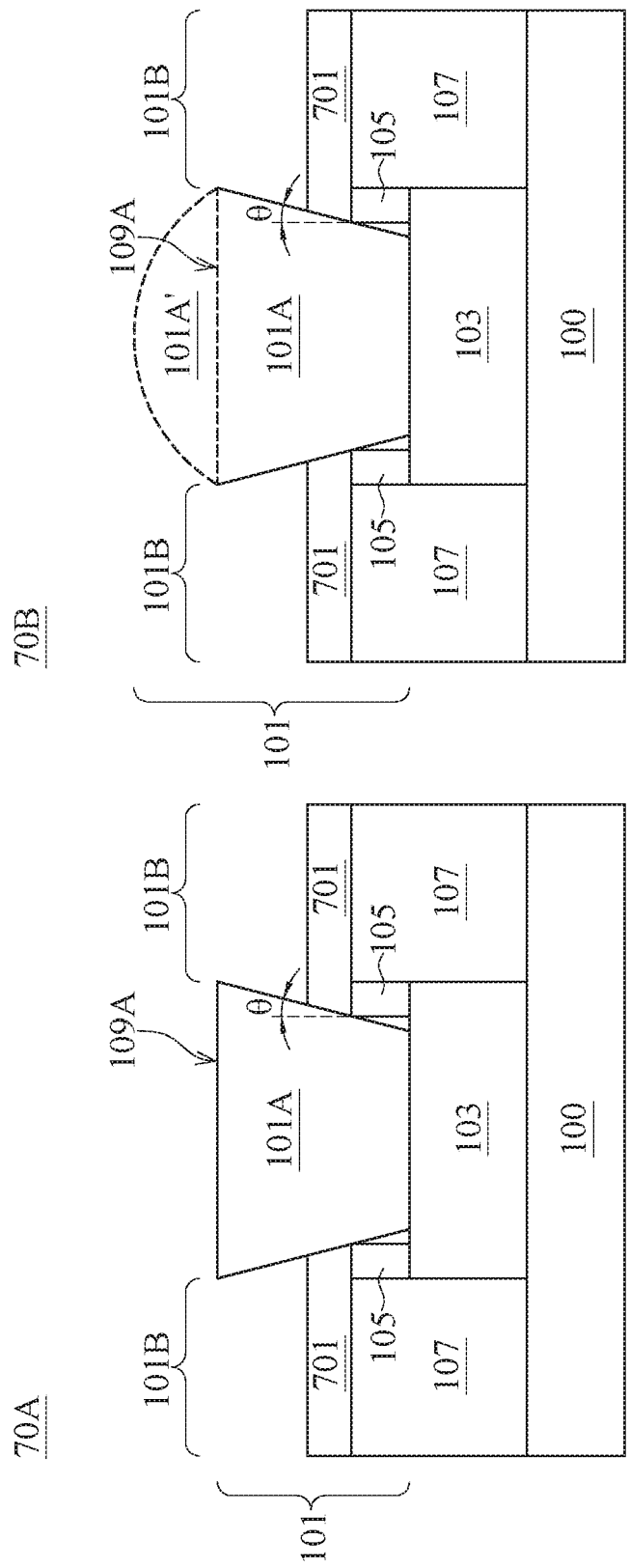

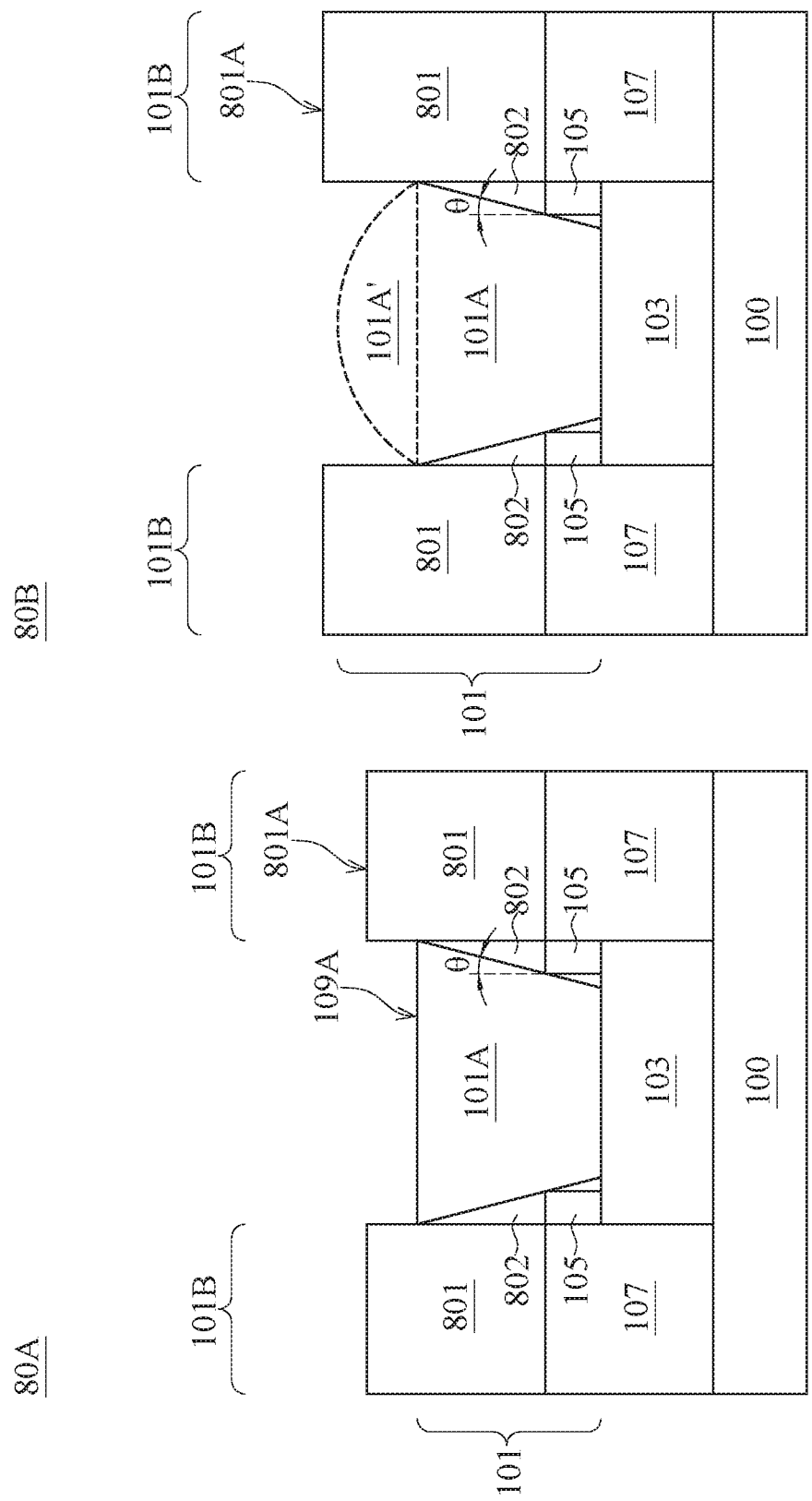

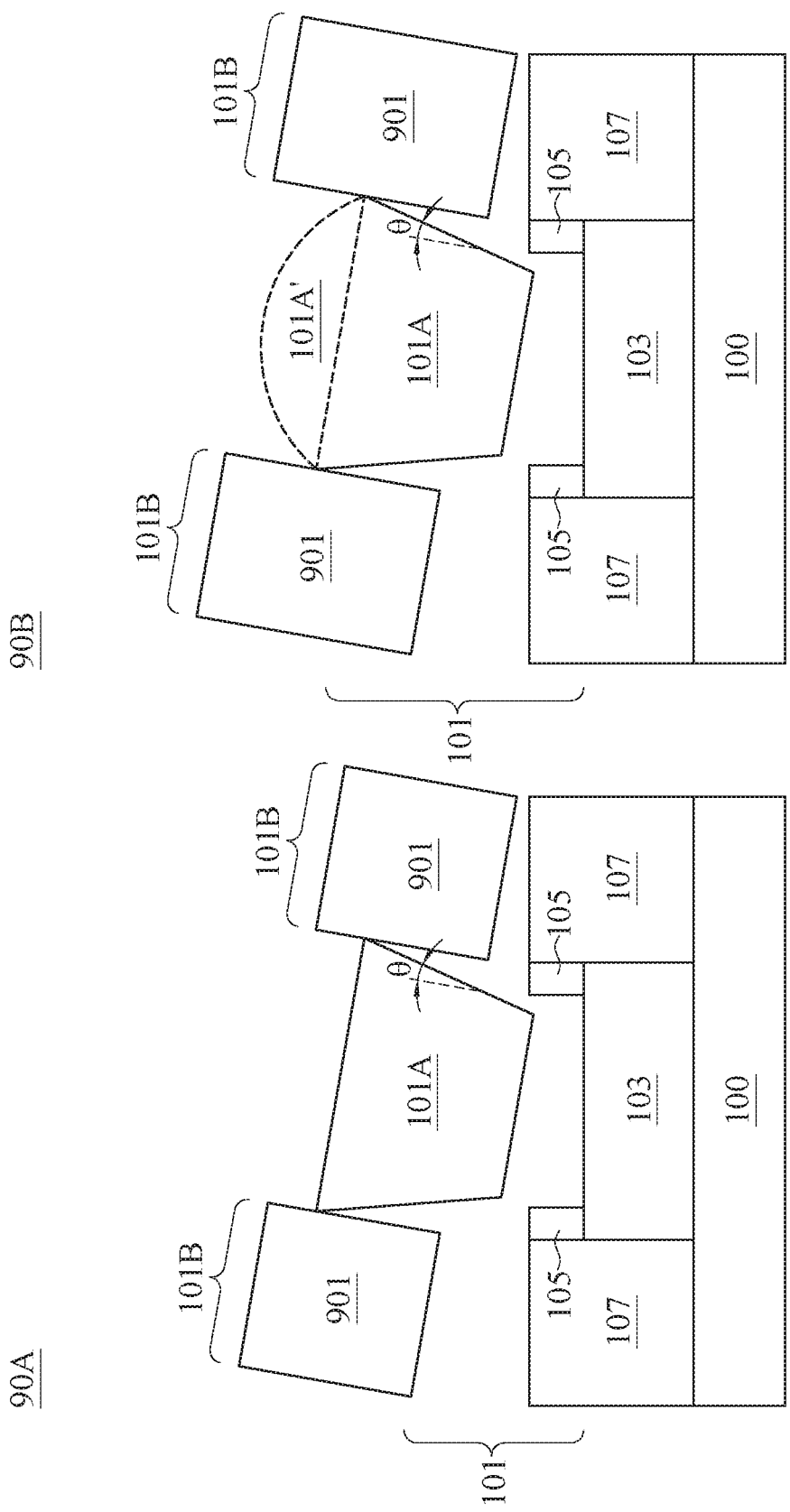

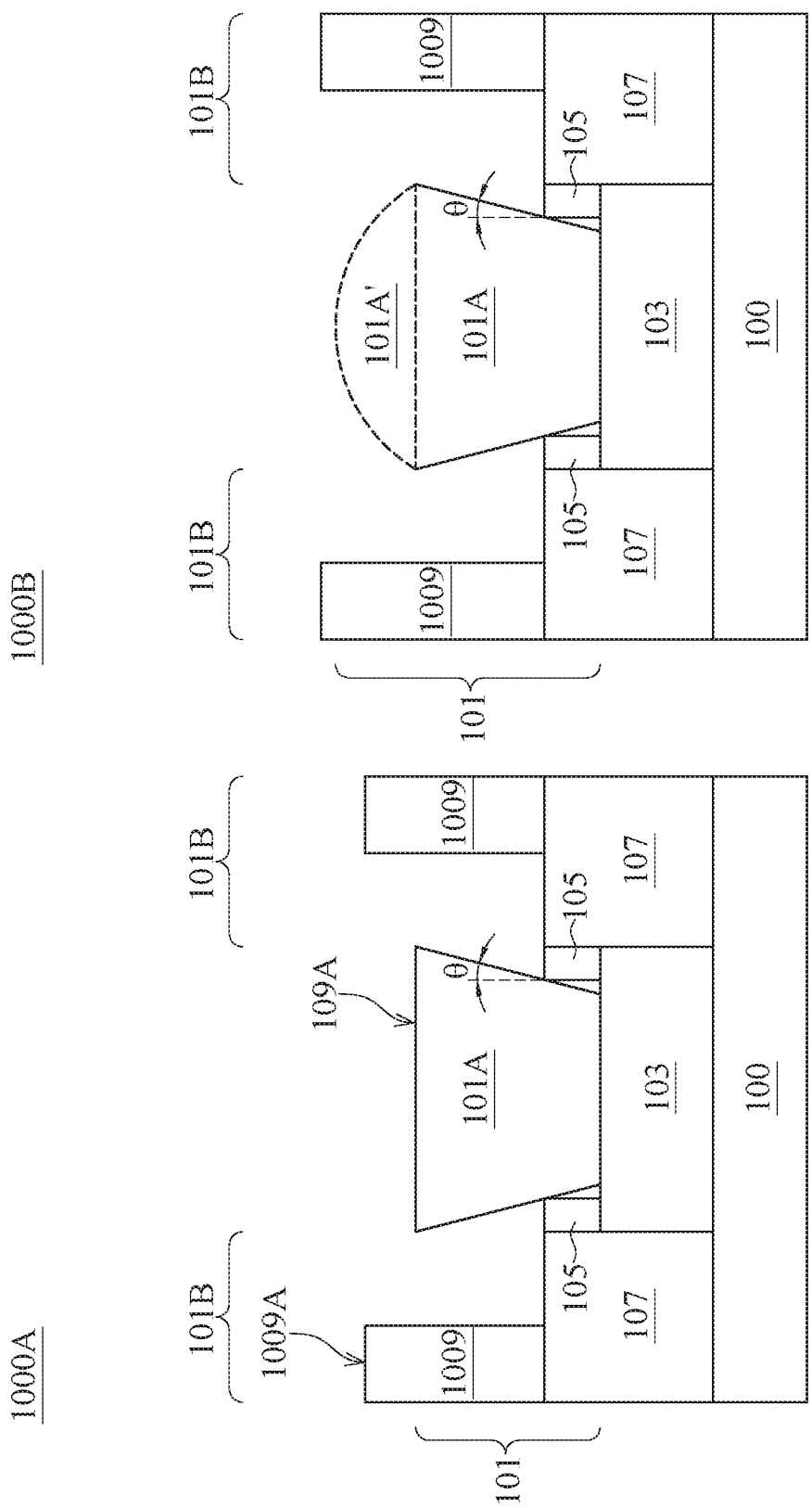

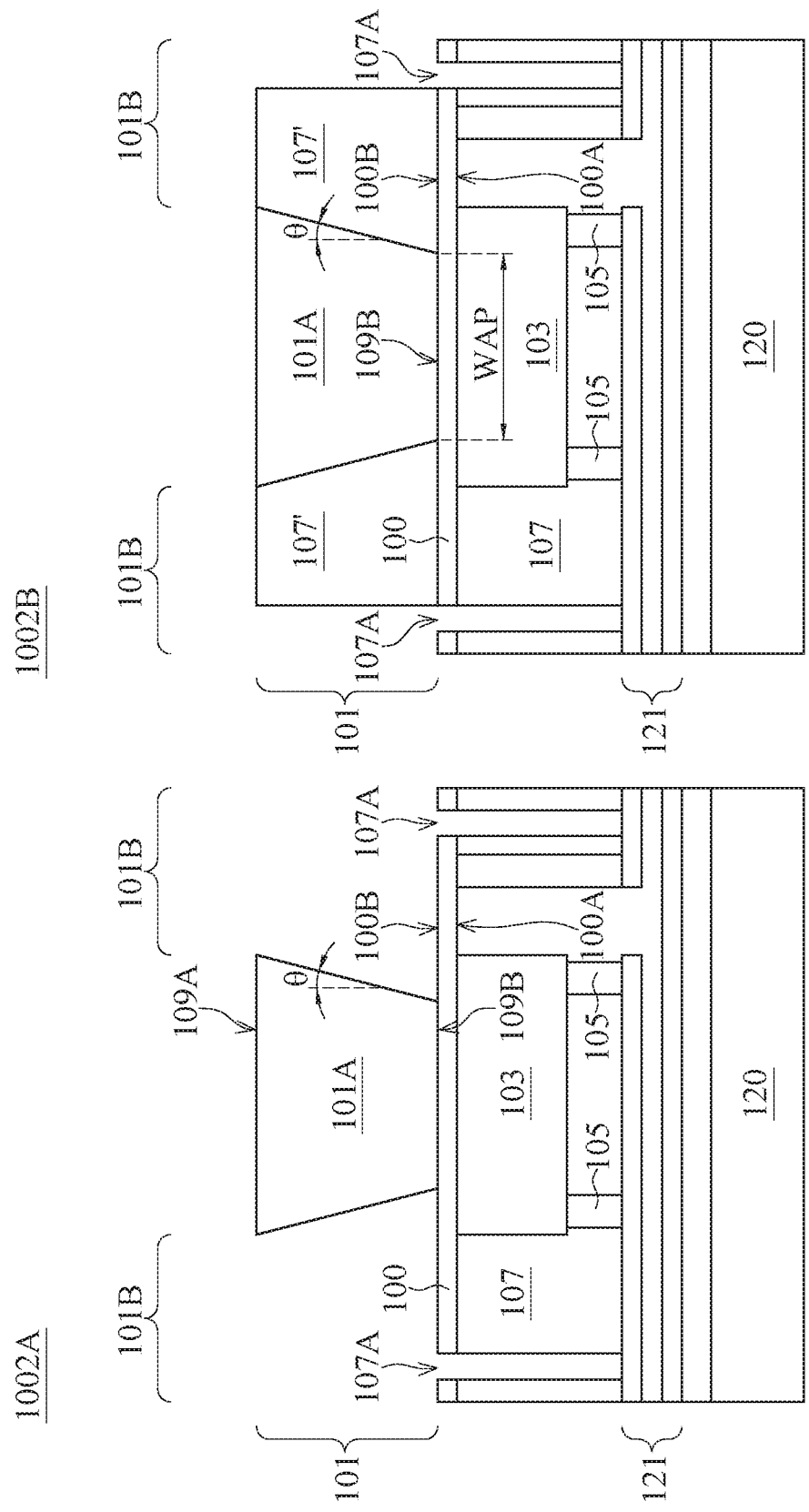

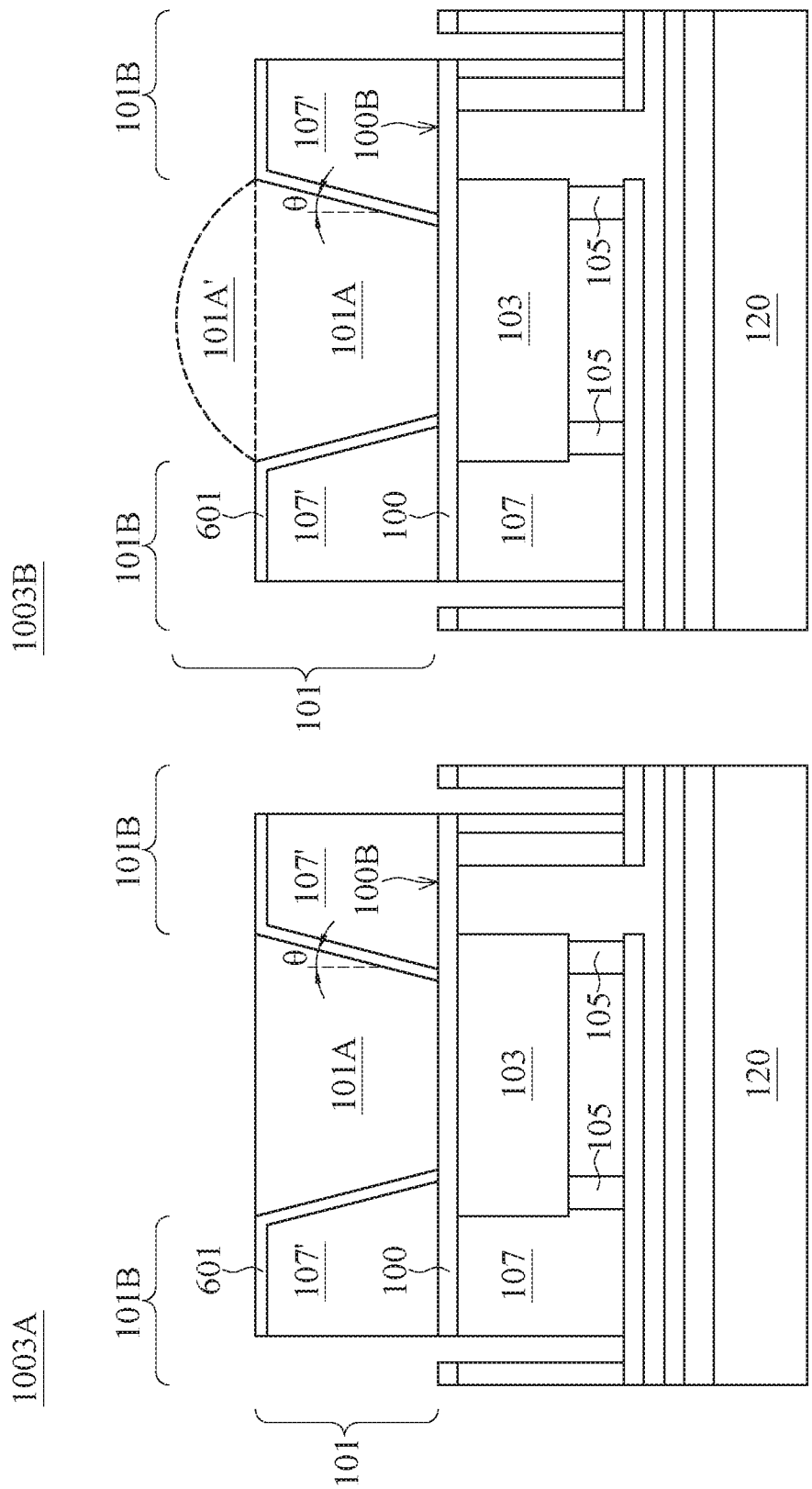

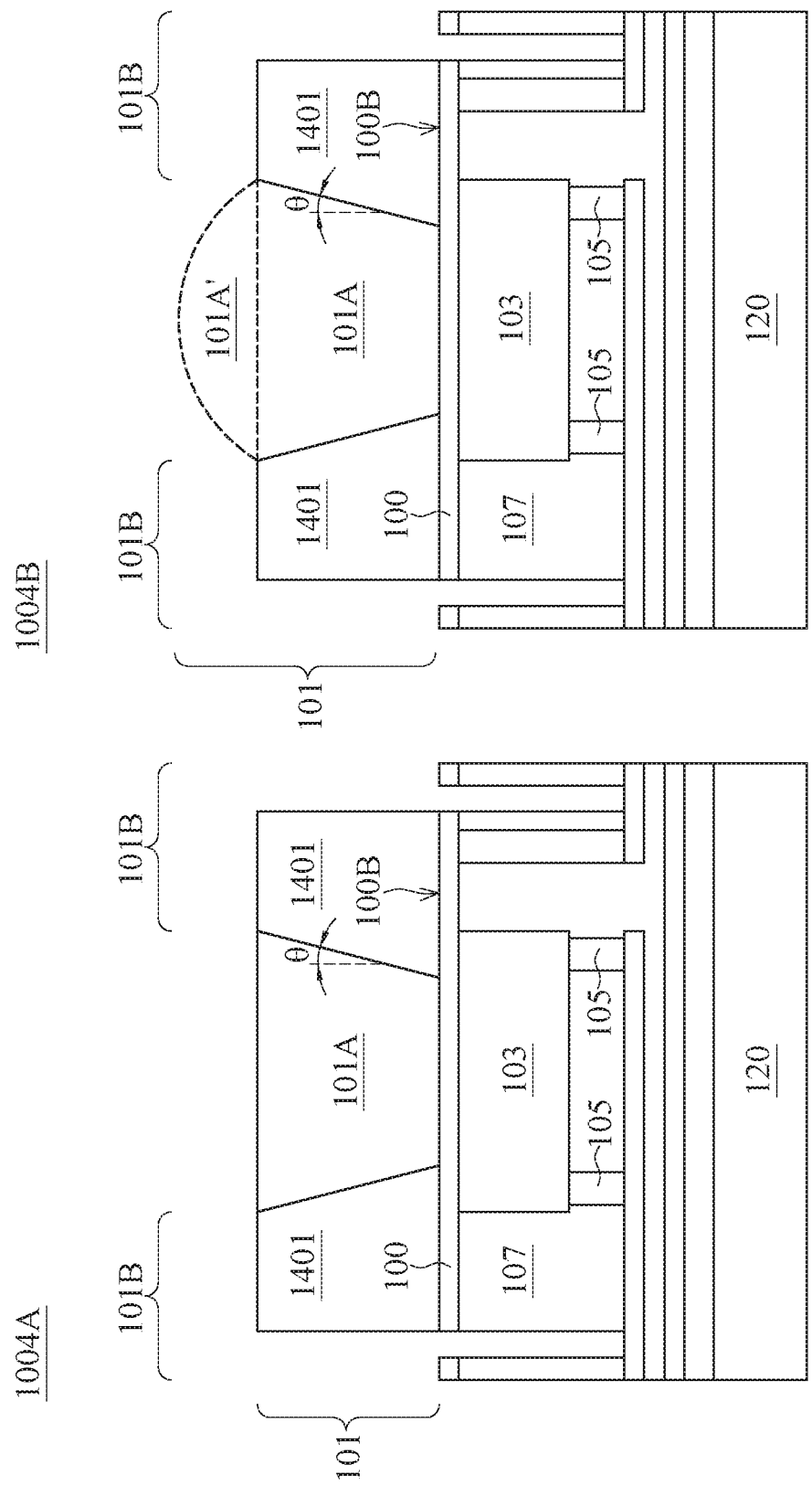

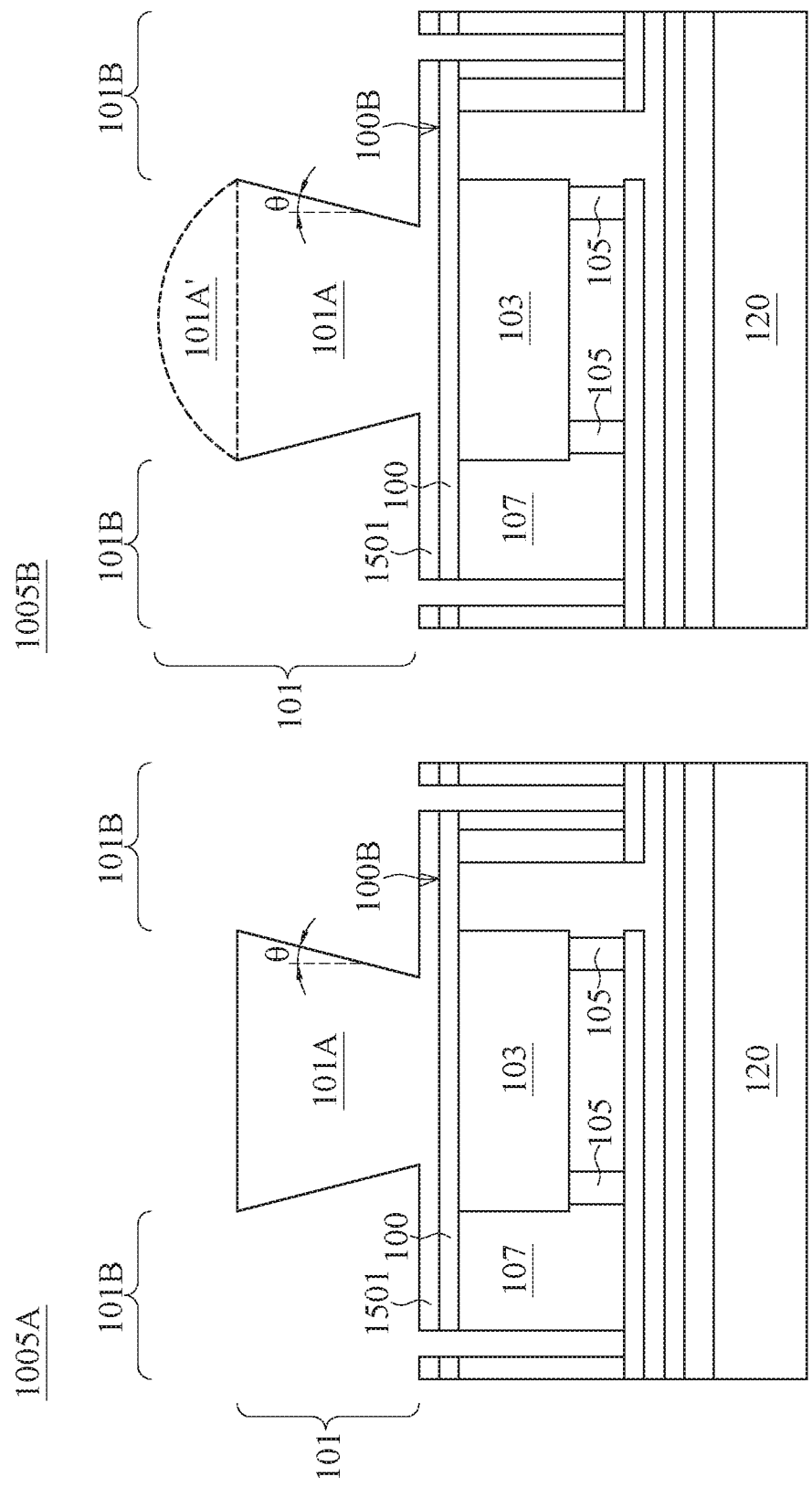

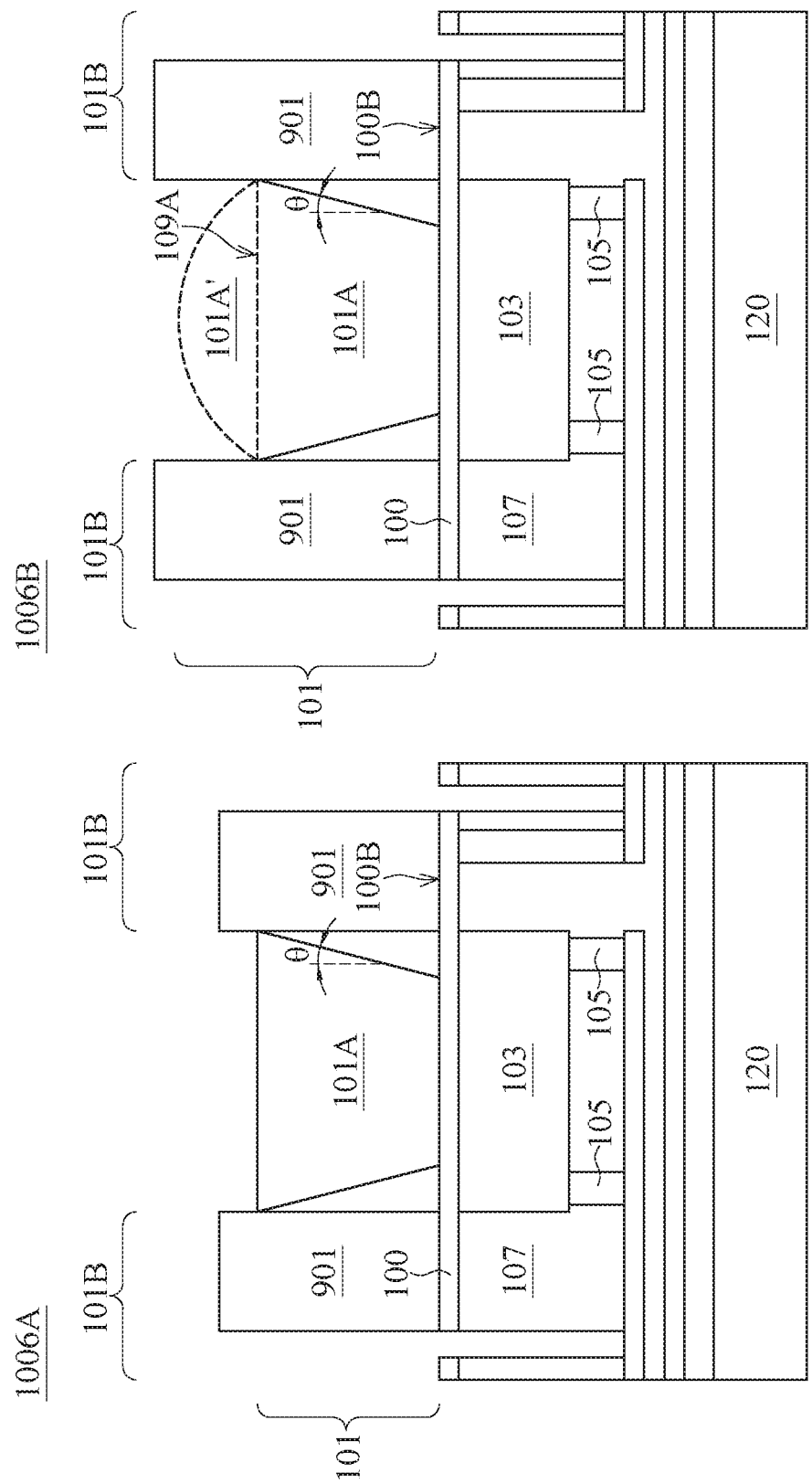

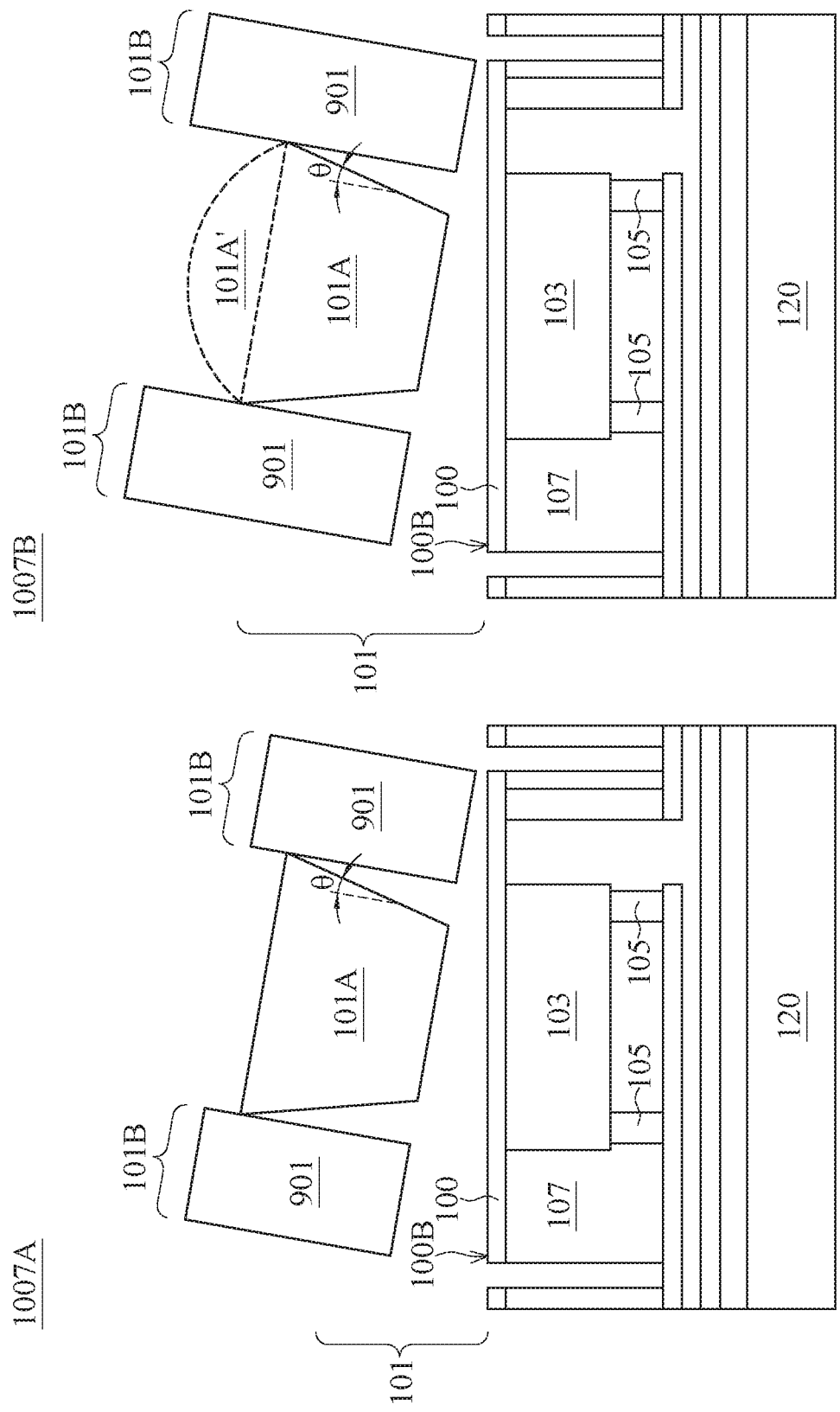

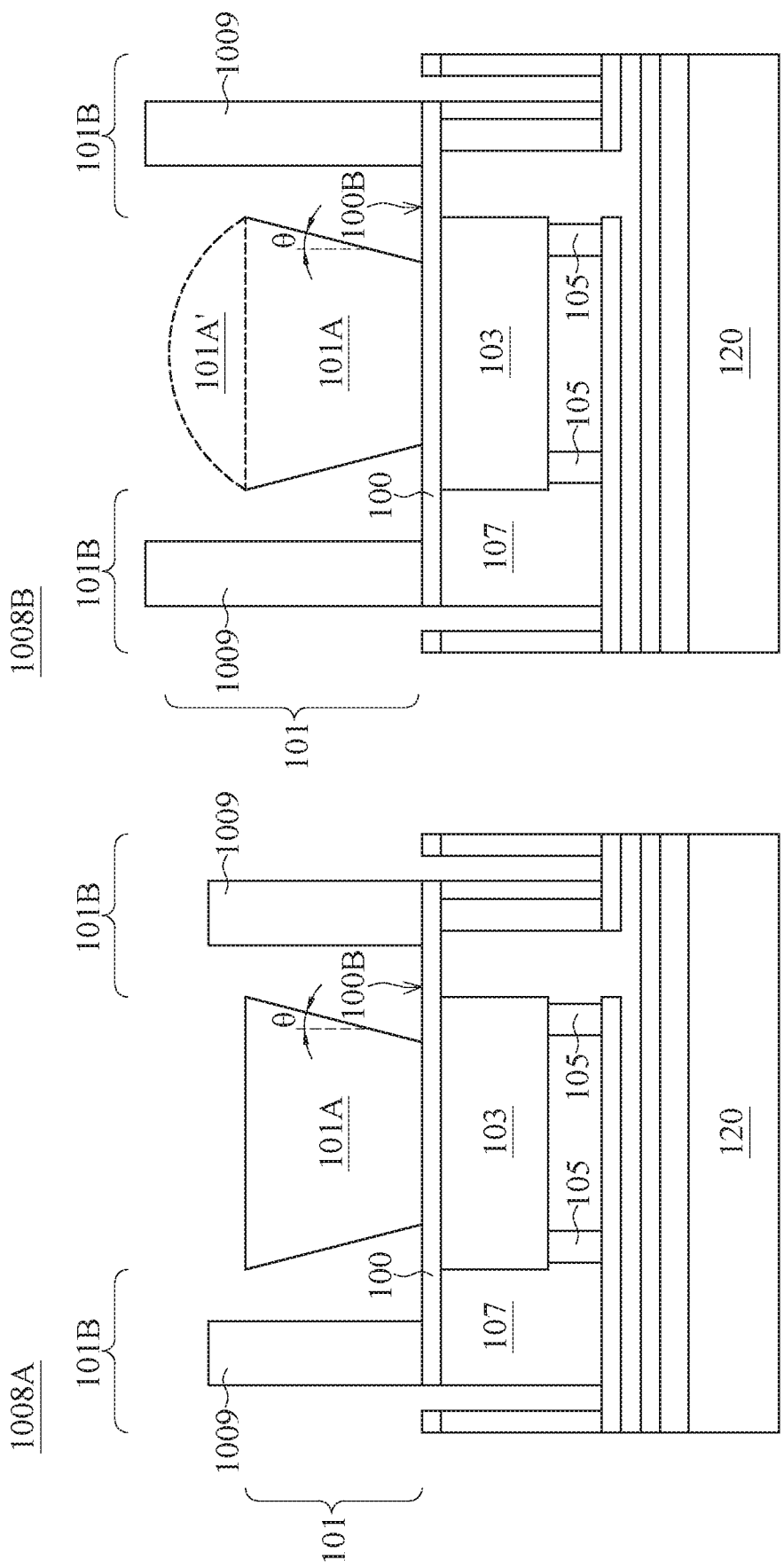

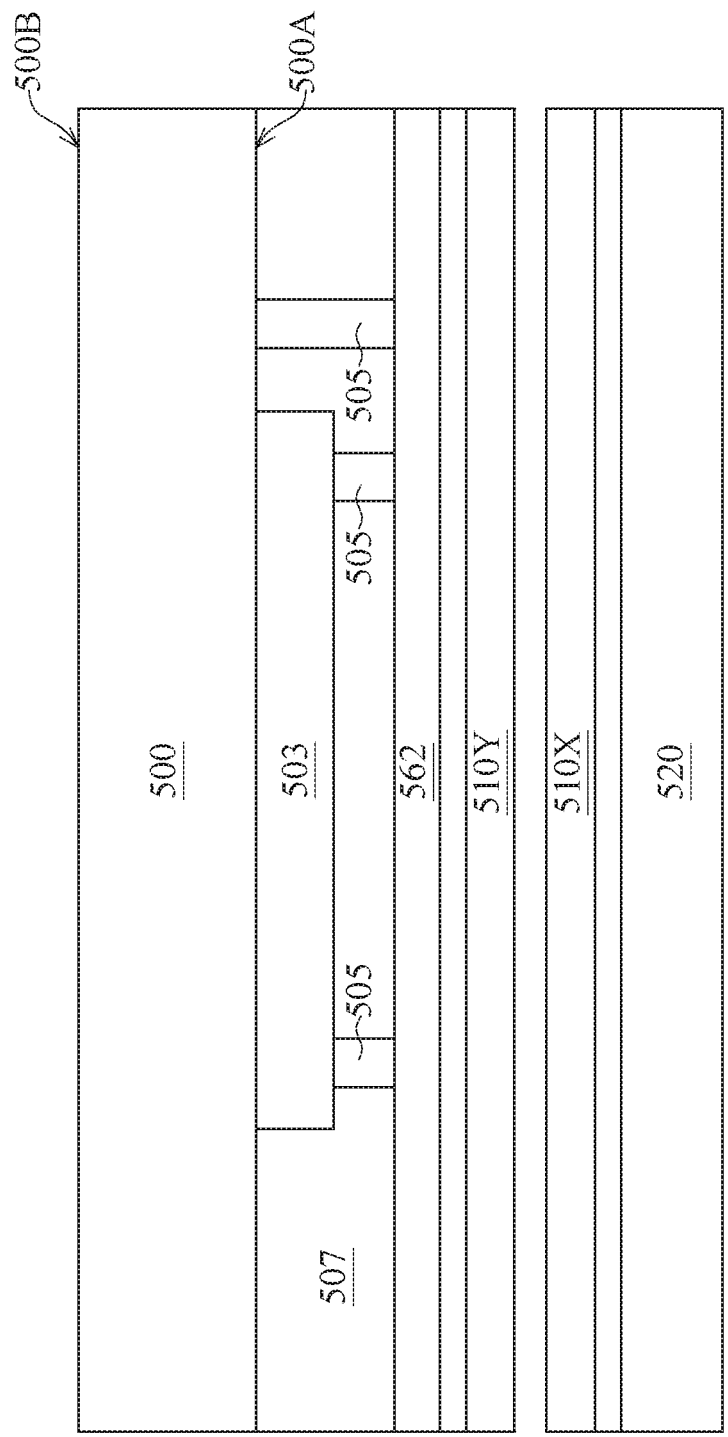

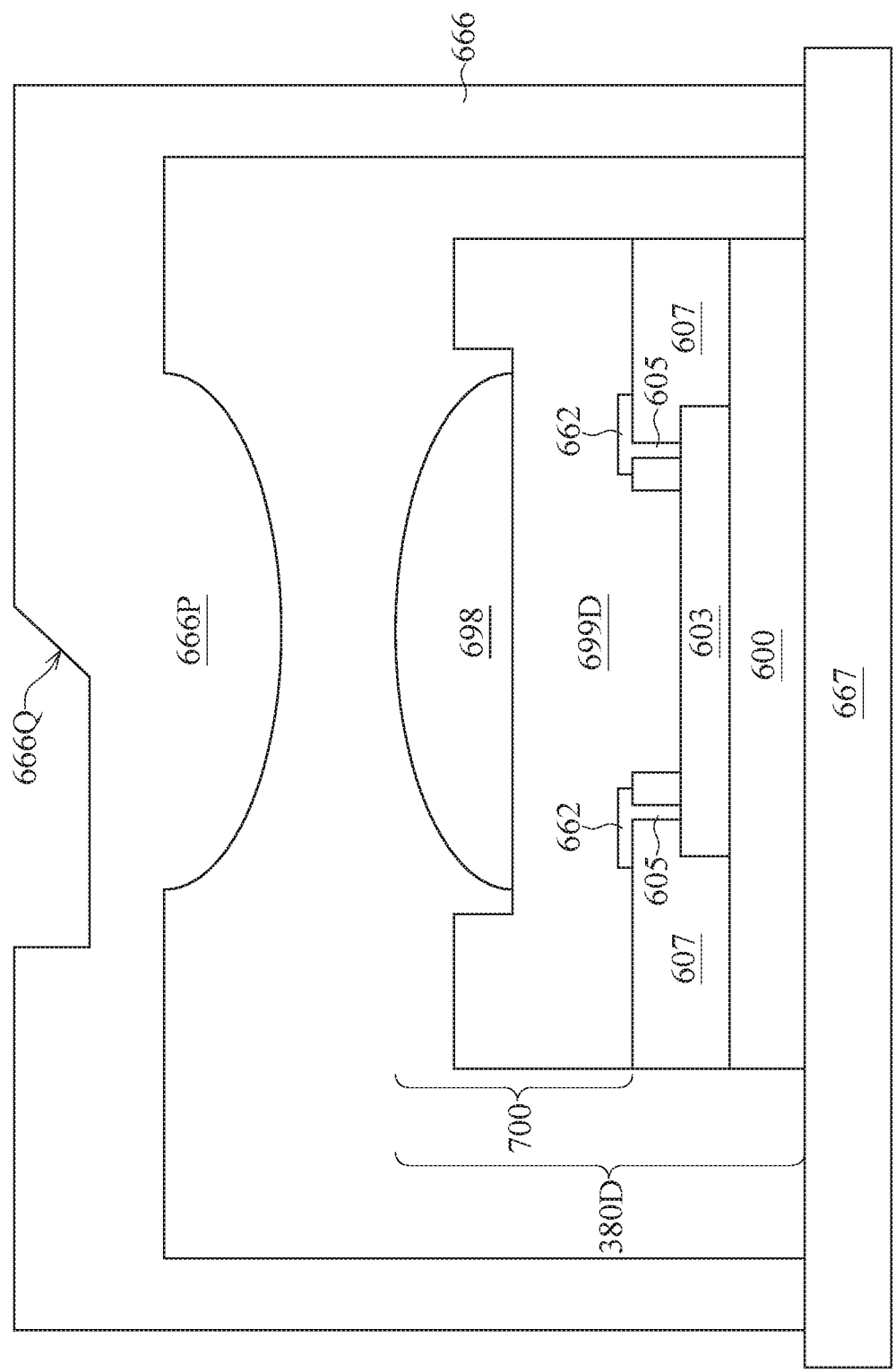

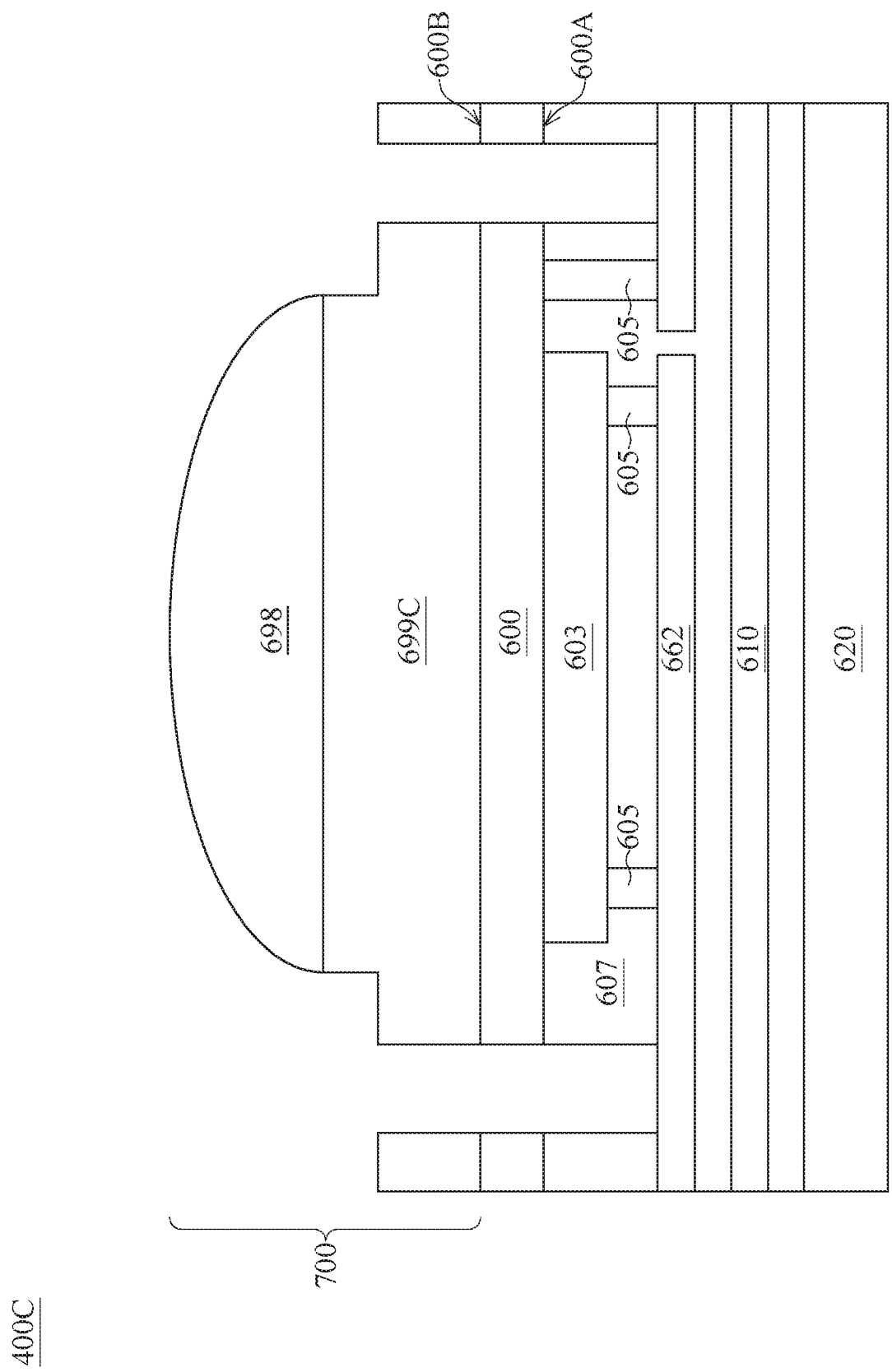

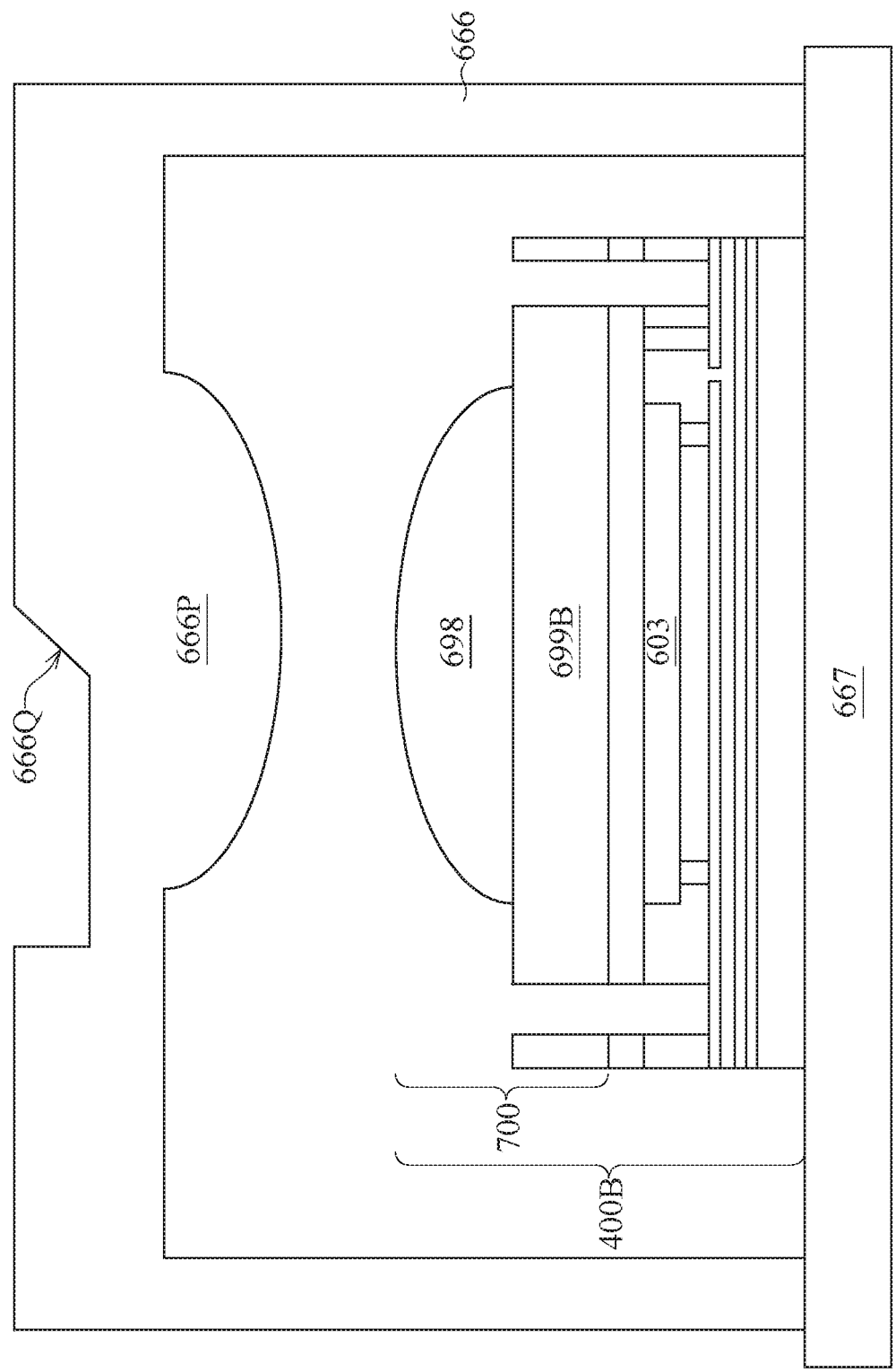

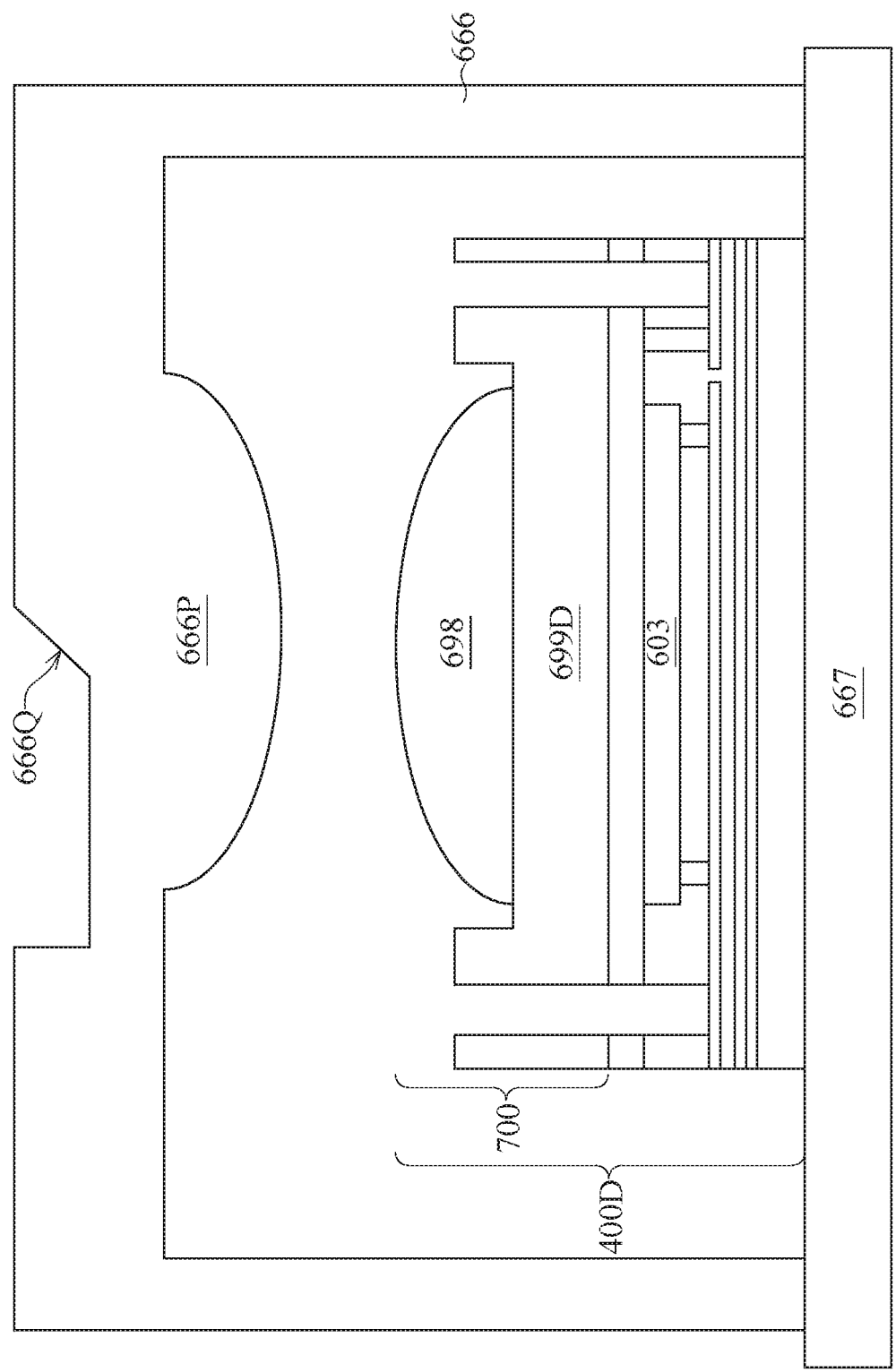

WAVEGUIDE STRUCTURE AND OPTOELECTRONIC DEVICE COMPRISING THE SAME

CROSS-REFERENCE TO RELATED APPLICATIONS

This patent application claims the benefit of U.S. Provisional Patent Application No. 62/750,798, filed Oct. 25, 2018, U.S. Provisional Patent Application No. 62/784,534, filed Dec. 23, 2018, U.S. Provisional Patent Application No. 62/838,319, filed Apr. 25, 2019, and U.S. Provisional Patent Application No. 62/854,987, filed May 31, 2019, which are incorporated by reference herein.

BACKGROUND

As the photodetector's operation speed increases, the detection aperture starts to reduce due to performance constraint and will eventually limit the total amount of light being captured. This reduced amount of input light will impact on the responsivity of photodetectors and limit the performance of the photodetectors.

SUMMARY

According to a first aspect of the present application, a waveguide structure is provided. The waveguide structure includes a first portion, having a first surface with a first width, a second surface with a second width, and a sidewall surface connecting the first surface and the second surface. The first surface is configured to receive incoming optical signal. The second surface is opposite to the first surface. The first width is greater than the second width.

In another aspect of the present application, an optoelectronic device is provided. The optoelectronic device includes a device substrate including a first surface and a second surface opposite to the first surface, a photosensitive region adjacent to the first surface of the device substrate, and a waveguide structure over the device substrate and the photosensitive region. The waveguide includes a first portion including a first surface with a first width, a second surface with a second width, and a sidewall surface connecting the first surface and the second surface. The second surface is opposite to the first surface. The first width is greater than the second width.

In a further aspect of the present application, an optoelectronic device is provided. The optoelectronic device includes a device substrate having a first surface and a second surface opposite to the first surface, a photosensitive region adjacent to the first surface of the device substrate, the photosensitive region having a sensing aperture, and a waveguide structure over the sensing aperture. The waveguide structure includes a first portion including a first surface with a first width, a second surface with a second width, and a sidewall surface connecting the first surface and the second surface. The second width is greater than a minimal distance between the first surface and the second surface times $(\tan(2\theta)-\tan(\theta))$, wherein $\theta$ being an angle between a normal vector of the device substrate and the sidewall surface.

In a further aspect of the present application, a waveguide structure is provided. The waveguide structure includes a first portion including a first surface having a first width, a second surface having a second width, and a sidewall surface connecting the first surface and the second surface. The second width is greater than T $(\tan(2\theta)-\tan(\theta))$, wherein T is a minimal distance between the first surface and the second surface, and $\theta$ is an angle between a normal vector of the second surface and the sidewall surface.

In a further aspect of the present application, a waveguide structure is provided. The waveguide structure includes a first portion including a second surface and a sidewall surface connected to the second surface. The first portion includes a maximum width and a minimum width. The waveguide structure further includes an optical element on the first portion and connected to the sidewall surface, wherein the minimum width of the first portion is greater than T $(\tan(2\theta)-\tan(\theta))$, wherein T is a thickness of the first portion, and $\theta$ is an angle between a normal vector of the second surface and the sidewall surface. In a further aspect of the present application, an optoelectronic device is provided. The optoelectronic device includes a device substrate having a first surface and a second surface opposite to the first surface. The optoelectronic device further includes a photosensitive region adjacent to the first surface of the device substrate, the photosensitive region having a sensing aperture, and a waveguide structure over the sensing aperture. The waveguide structure includes a first portion, including: a first surface having a first width (W1); a second surface having a second width, the second surface being opposite to the first surface; and a sidewall surface connecting the first surface and the second surface, wherein the second width is greater than T $(\tan(2\theta)-\tan(\theta))$, wherein T is a minimal distance between the first surface and the second surface, and $\theta$ is an angle between a normal vector of the second surface of the first portion and the sidewall surface.

In a further aspect of the present application, a waveguide structure is provided. The waveguide structure includes a base portion including a first region and a second region surrounding the first region, wherein the first region includes a first refractive index, and the second region includes a second refractive index different from the first refractive index.

In a further aspect of the present application, an optoelectronic device is provided. The optoelectronic device includes a photo sensing unit including a photosensitive region, two carrier control terminals electrically coupled to the photosensitive region, two carrier collection terminals electrically coupled to the photosensitive region, and a waveguide structure over the photo sensing unit. The waveguide structure includes a base portion including a first region and a second region surrounding the first region, wherein the first region includes a first refractive index, and the second region includes a second refractive index different from the first refractive index. The base portion includes an aperture having a first width. A second width between the two carrier control terminals is greater than the first width.

In a further aspect of the present application, an optoelectronic device is provided. The optoelectronic device includes a photosensitive region configured to absorb photons and to generate photo-carriers from the absorbed photons, wherein the photosensitive region includes a sensing aperture, and a waveguide structure over the photosensitive region. The waveguide structure includes a pedestal layer and an optical element on the pedestal layer.

In a further aspect of the present application, an optoelectronic device is provided. The optoelectronic device includes a photosensitive region configured to absorb photons and to generate photo-carriers from the absorbed photons, an optical structure over the photosensitive region, and an optical element between the photosensitive region and the optical structure.

In a further aspect of the present application, an optoelectronic device is provided. The optoelectronic device includes a photosensitive region configured to absorb photons and to generate photo-carriers from the absorbed photons, a waveguide structure over the photosensitive region. The waveguide structure includes an inclined sidewall over the photosensitive region. The waveguide structure further includes a reflective layer on the inclined sidewall.

In a further aspect of the present application, a manufacturing of an optoelectronic device is provided. The manufacturing method includes steps of forming a photosensitive region above a device substrate, forming a dielectric layer surrounding the photosensitive region, forming electrical connections in the dielectric layer, and forming a waveguide structure above the photosensitive region. The step of forming the waveguide structure includes forming an inclined sidewall. The waveguide structure includes an inclined sidewall over the photosensitive region. The waveguide structure further includes a reflective layer on the inclined sidewall.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein:

FIG. 4A and FIG. 4B illustrate cross sections of an optoelectronic device having a waveguide structure, according to some embodiments of the present disclosure.

FIG. 6A and FIG. 6B illustrate cross sections of an optoelectronic device having a waveguide structure, according to some embodiments of the present disclosure.

FIG. 7A and FIG. 7B illustrate cross sections of an optoelectronic device having a waveguide structure, according to some embodiments of the present disclosure.

FIG. 8A and FIG. 8B illustrate cross sections of an optoelectronic device having a waveguide structure, according to some embodiments of the present disclosure.

FIG. 9A and FIG. 9B illustrate cross sections of an optoelectronic device having a waveguide structure, according to some embodiments of the present disclosure.

FIG. 10A and FIG. 10B illustrate cross sections of an optoelectronic device having a waveguide structure, according to some embodiments of the present disclosure.

FIG. 12A and FIG. 12B illustrate cross sections of an optoelectronic device having a waveguide structure, according to some embodiments of the present disclosure.

FIG. 13A and FIG. 13B illustrate cross sections of an optoelectronic device having a waveguide structure, according to some embodiments of the present disclosure.

FIG. 14A and FIG. 14B illustrate cross sections of an optoelectronic device having a waveguide structure, according to some embodiments of the present disclosure.

FIG. 15A and FIG. 15B illustrate cross sections of an optoelectronic device having a waveguide structure, according to some embodiments of the present disclosure.

FIG. 16A and FIG. 16B illustrate cross sections of an optoelectronic device having a waveguide structure, according to some embodiments of the present disclosure.

FIG. 17A and FIG. 17B illustrate cross sections of an optoelectronic device having a waveguide structure, according to some embodiments of the present disclosure.

FIG. 18A and FIG. 18B illustrate cross sections of an optoelectronic device having a waveguide structure, according to some embodiments of the present disclosure.

FIG. 35A to FIG. 35D illustrate cross sections of the optoelectronic device of FIG. 35 during various manufacturing operations, according to some embodiments of the present disclosure.

FIG. 39D illustrates a cross section of the optoelectronic device, according to some embodiments of the present disclosure.

FIG. 40C illustrates a cross section of an optoelectronic device having a waveguide structure, according to some embodiments of the present disclosure.

FIG. 41B illustrates a cross section of the optoelectronic device, according to some embodiments of the present disclosure.

FIG. 41D illustrates a cross section of the optoelectronic device, according to some embodiments of the present disclosure.

DETAILED DESCRIPTION

Figure 1:
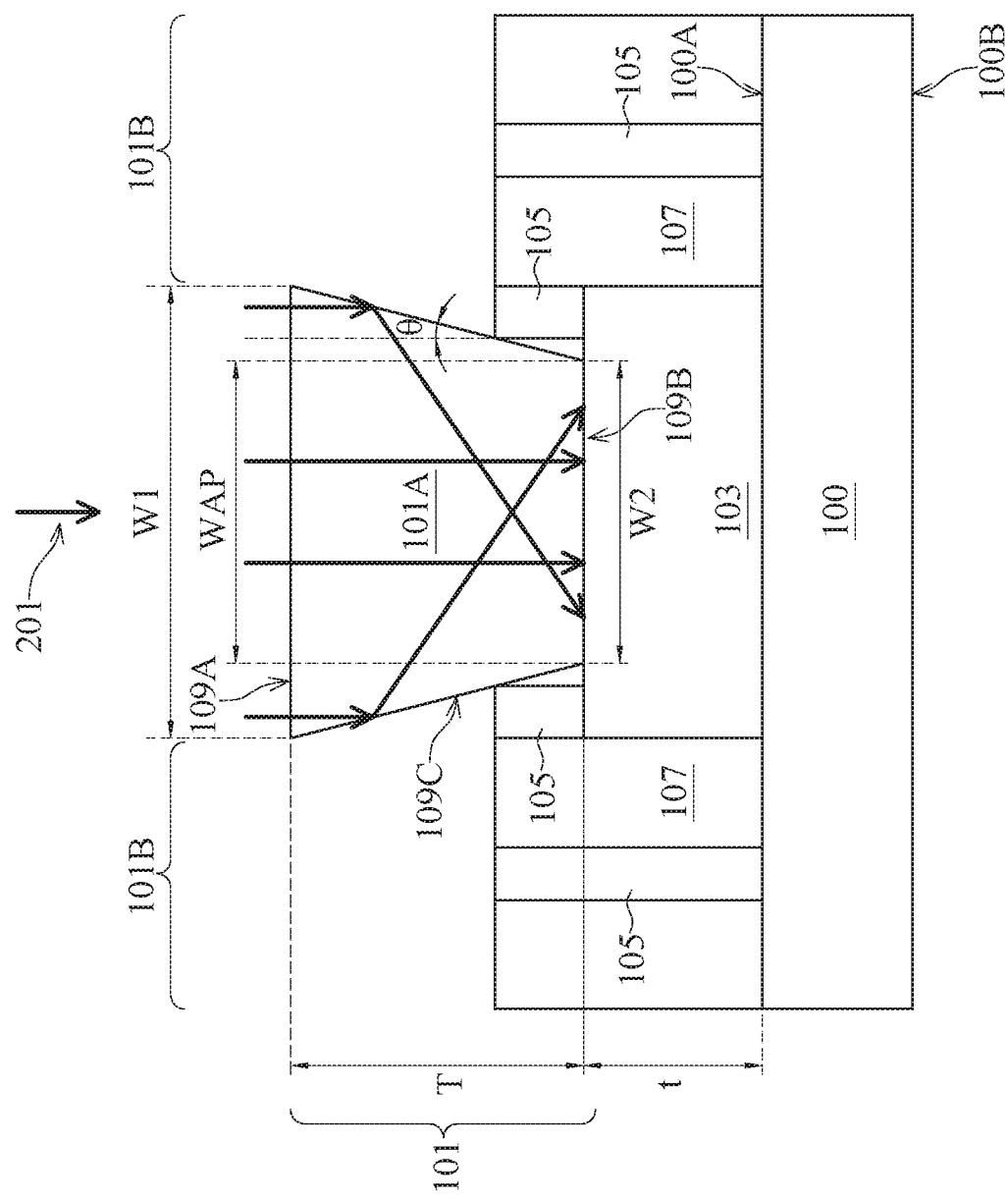
FIG. 1 and FIG. 2 illustrate cross sections of an optoelectronic device having a waveguide structure, according to some embodiments of the present disclosure.

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In the present disclosure, the term "germanium-silicon (GeSi)" refers to a GexSi1−x, wherein 0<x<1. The term "intrinsic" refers to a semiconductor material without intentionally adding dopants.

In optical communication application with operation bandwidth generally above 25 GHz, sensing aperture of a photodiode is smaller compared to a sensing aperture of a photodiode with operation bandwidth generally under 25 GHz for maintaining pixel performance such as the modulation speed. Photodiode effectively captures incoming optical signal into the sensing aperture is thus in need.

Present disclosure provides a waveguide structure which improves overall light collection efficiency in an optoelectronic device. In some embodiments, the waveguide structure is configured to confining and conveying an incoming optical signal toward a specific direction. In some embodiments, the waveguide structure is configured to collect diverging, collimated, converging, or any profile of an incoming optical signal, such as incoming light beams. The waveguide structure provides reliable three-dimensional alignment with the photosensitive region of the optoelectronic device.

The photosensitive region of a time-of-flight (TOF) sensor may include periodic doping regions. In some embodiments, for a lens array system on a TOF, two kinds of losses occur in such periodic structure. A geometry mismatch between the lens and the pixel attribute to a first loss. Since the shape of the lens can be a truncated cone, and the shape of the pixel may be quadrilateral, an edge or corner portion of the pixel may not be covered by the lens. The diffracted light induced by the periodic doping regions in the photosensitive region of the TOF sensor attribute to a second loss. Such diffractive loss can be more severe in a TOF sensor where the lens is intentionally designed to have higher focusing angle. Higher focusing angle design is used to focus incoming light in a much smaller optical window, for example, from a 10 μm by 10 μm incoming light region to a 4 μm by 4 μm optical window, in order to maintain the modulation speed of each pixel.

Present disclosure also provides a waveguide structure to enhance the optical efficiency of a pixel. In some embodiments, the waveguide structure includes at least two materials arranged alternately along the transverse direction, or a direction traversing the underlying periodic doping regions. The waveguide structure with or without an optical element is capable of collecting the incident light which propagates toward the photosensitive region. In some embodiments, the waveguide structure may include an optical element. The optical element of the present disclosure is provided to change the profile of the incoming light or/and direct incoming light.

FIG. 1 illustrates a cross section of an optoelectronic device 10 having a waveguide structure 101, according to some embodiments of the present disclosure. The optoelectronic device 10 can be a photodetector, including but not limited to a standard PIN photodetector, avalanche photodetectors (APDs), critically-coupled photodetectors (CCPDs), resonance cavity photodetectors (RCEPDs), and metal-Schottky-metal photodetector (MSMPDs). The optoelectronic device 10 includes a device substrate 100, a photosensitive region 103 adjacent to the device substrate 100, and a waveguide structure 101 over the device substrate 100 and the photosensitive region 103. In some embodiments, the device substrate 100 supports the photosensitive region 103. In some embodiments, the optoelectronic device 10 includes an operation bandwidth not less than 25 GHz, for example, 40 GHz, 100 GHz.

The device substrate 100 may be any suitable substrate where photosensitive region 103 can be fabricated. In some embodiment, the device substrate 100 provides a surface for epitaxially growing the photosensitive region 103. In some embodiments, the device substrate 100 includes a semiconductor material. In some embodiments, the device substrate 100 includes a Group III-V semiconductor material. The Group III-V semiconductor material may include, but is not limited to, GaAs, AlAs, InP, InGaAs, GaSb, InAs, or InSb. In some embodiments, the device substrate 100 includes a Group IV element. In some embodiments, the device substrate 100 is composed of a single material, for example, the device substrate 100 may be a silicon substrate. In some embodiments, the device substrate 100 includes multiple materials, for example, the device substrate 100 includes an insulating material and a semiconductor material. In some embodiment, the device substrate 100 includes $SiO_2$ and Si. In some embodiments, the device substrate 100 includes a stack of multiple layers. In some embodiments, the device substrate 100 includes a thickness not less than 100 μm.

The device substrate 100 includes a first surface 100A and a second surface 100B opposite to the first surface 100A. The photosensitive region 103 is closer to the first surface 100A than to the second surface 100B of the device substrate 100. In some embodiments, the first surface 100A is between the photosensitive region 103 and the second surface 100B.

In general, the photosensitive region 103 receives an optical signal and converts the optical signal into electrical signals. In some embodiments, the photosensitive region 103 absorbs photons in the optical signal and generates electron-hole pairs. The photosensitive region 103 is selected to have a high absorption coefficient at the desired wavelength range. In some embodiments, the photosensitive region 103 is configured to absorb photons having a peak wavelength in an invisible wavelength range not less than 800 nm, such as 850 nm, 940 nm, 1050 nm, 1064 nm, 1310 nm, 1350 nm, or 1550 nm. In some embodiments, the invisible wavelength range is not more than 2000 nm. In some embodiments, a material of the photosensitive region 103 is different from the material of the device substrate 100. In some embodiments, the photosensitive region 103 includes a semiconductor material. In some embodiments, the photosensitive region 103 includes a Group III-V semiconductor material. The Group III-V semiconductor material may include, but is not limited to, GaAs, AlAs, InP, InGaAs, GaSb, InAs, or InSb. In some embodiments, the bandgap of the material of the photosensitive region 103 is less than the bandgap of the material of the device substrate 100. For example, in some embodiments, the photosensitive region 103 includes InGaAs, and the device substrate 100 includes InP. In some embodiments, the photosensitive region 103 includes a semiconductor material including a Group IV element, for example, Ge, Si or Sn. In some embodiments, the photosensitive region 103 includes the $Si_xGe_ySn_{1-x-y}$, wherein $0 \le x \le 1$, $0 \le y \le 1$. In some embodiments, the photosensitive region 103 includes the $Ge_{1-a}Sn_a$, wherein $0 \le a \le 0.1$. In some embodiments, the photosensitive region 103 includes GeSi, wherein the composition of germanium and silicon may be selected for specific processes or applications. In some embodiments, the material of the photosensitive region 103 is intrinsic. In some embodiments, the photosensitive region 103 is composed of intrinsic germanium.

In some embodiments, the optoelectronic device 10 further includes a first contact region (not shown) and a second contact region (not shown) sandwiching the photosensitive region 103. In some embodiments, the first contact region is formed in the device substrate 100. In some embodiments, the first contact region is vertically overlapping with the photosensitive region 103. In some embodiments, the first contact region is beneath the first surface 100A of the device substrate 100. In some embodiments, the second contact region is on the photosensitive region 103. The first contact region is of a first conductivity type, and the second contact region is of a second conductivity type different from the first conductivity type. In some embodiments, the first contact region is of n-type. In some embodiments, the second contact region is of p-type. In some embodiments, the second contact region includes semiconductor material. In some embodiments, when the photosensitive region 103 includes germanium, the second contact region includes amorphous silicon for reducing dark current. In some embodiments, the second contact region includes a layer of p-type amorphous silicon and a layer of p-type germanium between the p-type amorphous silicon and the photosensitive region 103. In some embodiments, the first contact region includes a first dopant having a first peak doping concentration not less than $1\ E^{18}\ cm^{-3}$. In some embodiments, the second contact region includes a second dopant having a second peak doping concentration not less than $1\ E^{18}\ cm^{-3}$.

The optoelectronic device 10 further includes electrical connections 105 formed to electrically coupled to the photosensitive region 103 by electrically coupled to the first contact region and the second contact region. The electrical connections 105 are configured to transmit electronic signals generated in the photosensitive region 103.

In some implementations, the photosensitive region 103 is designed to have a thickness t depending on the wavelength of photons to be detected and the material of the photosensitive region 103. When the photosensitive region 103 includes germanium and is designed to absorb photons having a wavelength not less than 800 nm, the photosensitive region 103 has a thickness not less than 0.1 μm. In some embodiments, the photosensitive region 103 includes germanium and is designed to absorb photons having a wavelength between 800 nm and 2000 nm, the photosensitive region 103 has a thickness between 0.1 µm and 2.5 µm. In some embodiments, the photosensitive region 103 has a thickness between 1 µm and 2.5 µm for higher quantum efficiency. In some embodiments, the photosensitive region 103 may be grown using a blanket epitaxy, a selective epitaxy, or other applicable techniques. In some implementations, the photosensitive region 103 is a mesa. In other words, the photosensitive region 103 includes a width less than a width of the device substrate 100. In some embodiments, the photosensitive region 103 is designed to have a shape. For example, the photosensitive region 103 may be circular, square, or rectangular from a top view of the photosensitive region 103 depending on the spatial profile of the optical signal incident on a surface of the photosensitive region 103. In some embodiments, the optical signal is incident on a surface of the photosensitive region 103 without propagating through the device substrate 100. In some embodiments, the photosensitive region 103 is designed to have a sensing aperture having a lateral dimension WAP for receiving the optical signal. For example, the photosensitive region 103 may have a circular shape from a top view, where the lateral dimension WAP can range from 1 µm to 50 µm. In some embodiment, the lateral dimension WAP can range from 10 µm to 30 µm. In some embodiments, the sensing aperture is at the optical signal receiving surface of the photosensitive region 103. In some embodiments, the photosensitive region 103 may be in a form other than mesa as illustrated in FIG. 1. The photosensitive region 103 partial or fully embedded in the device substrate 100, as shown in FIG. 27A to FIG. 27F, can be implemented in the embodiments of the present disclosure.

The waveguide structure 101 includes a first portion 101A vertically aligned with the sensing aperture of the photosensitive region 103 and a second portion 101B surrounding the first portion 101A. The first portion 101A may be composed of materials allowing total internal reflection of the optical signal within the first portion 101A. In some embodiments, optical signal referred herein includes any polarization of light, such as linear polarization, circular polarization, elliptical polarization. In some embodiments, the first portion 101A includes a material having a refractive index between 1.4 and 1.9 at the peak wavelength of the optical signal. In some embodiments, the first portion 101A can include or be composed of polymeric materials or dielectric materials. Polymeric material includes, but is not limited to, epoxy, polyimide. The dielectric material includes, but is not limited to, Si, $SiO_2$, $Si_3N_4$ or the like. In some embodiments, the waveguide structure 101 and the photosensitive region 103 are at the same side of the device substrate 100. In some embodiments, the second portion 101B includes ambient air surrounding an upper part of the first portion 101A.

As shown in FIG. 1, the optoelectronic device 10 further includes a dielectric layer 107 surrounding the photosensitive region 103 and a portion of the waveguide structure 101. The dielectric layer 107 includes dielectric material including, but is not limited to, Si, $SiO_2$, $Si_3N_4$. In some embodiments, the material of the dielectric layer 107 is different from the material of the first portion 101A. In some embodiments, the first portion 101A includes a first surface 109A configured to receive the incoming optical signal, a second surface 109B substantially parallel to the first surface 109A and opposite to the first surface 109A, and a sidewall surface 109C connecting the first surface 109A and the second surface 109B. In some embodiments, the second surface 109B of the first portion 101A is closer to first surface 100A than to the second surface 100B of the device substrate 100. In some embodiments, the sidewall surface 109C can be a surface inclining from a normal vector of the second surface 109B of the first portion 101A. In some embodiments, the sidewall surface 109C can be a surface inclining from a normal vector of the first surface 100A of the device substrate 100. In some embodiments, the sidewall surface 109C can be a plane. In some embodiments, an angle θ is between the sidewall surface 109C and a normal vector of the first surface 100A of the device substrate 100. In some embodiments, an angle θ is between the sidewall surface 109C and a normal vector of the second surface 109B of the first portion 101A. In some embodiments, the sidewall surface 109C can be a curved surface. The angle θ is between the tangent plane of the greatest curvature of the sidewall surface 109C and the normal vector of to the first surface 100A of the device substrate 100 from a cross sectional view of the optoelectronic device 10. In some embodiments, the angle θ is between the tangent plane of the greatest curvature of the sidewall surface 109C and the normal vector of to the second surface 109B of the first portion 101A from a cross sectional view of the optoelectronic device 10. In some embodiments, the angle θ can be greater than 0° and not more than about 40°, depending on various design considerations such as a thickness T of the first portion 101A.

The second surface 109B of the first portion 101A is designed to have a shape. For example, the first portion 101A from the top view may be circular, square, or rectangular depending on the spatial profile of the incoming optical signal 201. The shape of the second surface 109B may or may not be the same as the shape of the surface of the photosensitive region 103 receiving the optical signal. For example, the shape of the second surface 109B from the top view may be circular or oval whereas the shape of the surface of the photosensitive region 103 from the top view may be quadrilateral.

Figure 2:
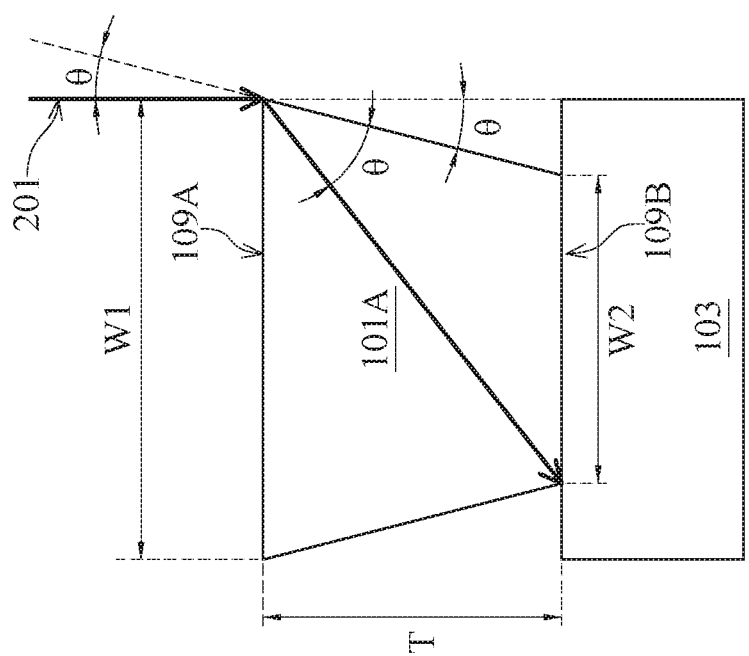

In general, a first width W1 of the first surface 109A is greater than a second width W2 of the second surface 109B. The second width W2 of the first portion 101A can be equal to or smaller than the lateral dimension WAP of the sensing aperture of the photosensitive region 103. In some embodiments, the second width W2 is determined as the minimum width of the first portion 101A. In some embodiments, the first width W1 is determined as the maximum width of the first portion 101A. The width is determined along a direction substantially parallel to the first surface 100A. In some embodiments, the thickness T of the first portion 101A is determined as the minimum distance between the part having the minimum width of the first portion 101A and the part having the maximum width of the first portion 101A. Referring to FIG. 2, a design rule of the second width W2 is to consider the thickness T of the first portion 101A, or the minimal distance between the first surface 109A and the second surface 109B, and the angle θ. In some embodiments, the second width W2 is designed to be wider than the thickness T times (tan(2θ)−tan(θ)). The second width W2 is so designed such that the optical signal 201 entering from a periphery of the first surface 109A can reach the second surface 109B of the first portion 101A of the waveguide structure 101, and hence captured by the sensing aperture of the underneath photosensitive region 103. Although not shown from a top view perspective, compared to an optoelectronic device in accordance to a comparative example without having the waveguide structure 101 described herein, an effective optical detecting area associated with the first surface 109A of the optoelectronic device in accordance to an embodiment with the application of the waveguide structure 101 described herein is greatly expanded. In some embodiments, the effective optical detecting area associated with the first surface 109A is larger than the sensing aperture of the photosensitive region 103. The greater the thickness T of the first portion 101A can lead to greater effective optical detecting area. Compared to an optoelectronic device in accordance to a comparative example without having the waveguide structure 101 described herein, the transmission rate of the optical signal entering the sensing aperture of the photosensitive region 103 of the optoelectronic device in accordance to an embodiment with the application of the waveguide structure 101 described herein increases from about 57.2% to about 97.8%.

Figure 3:
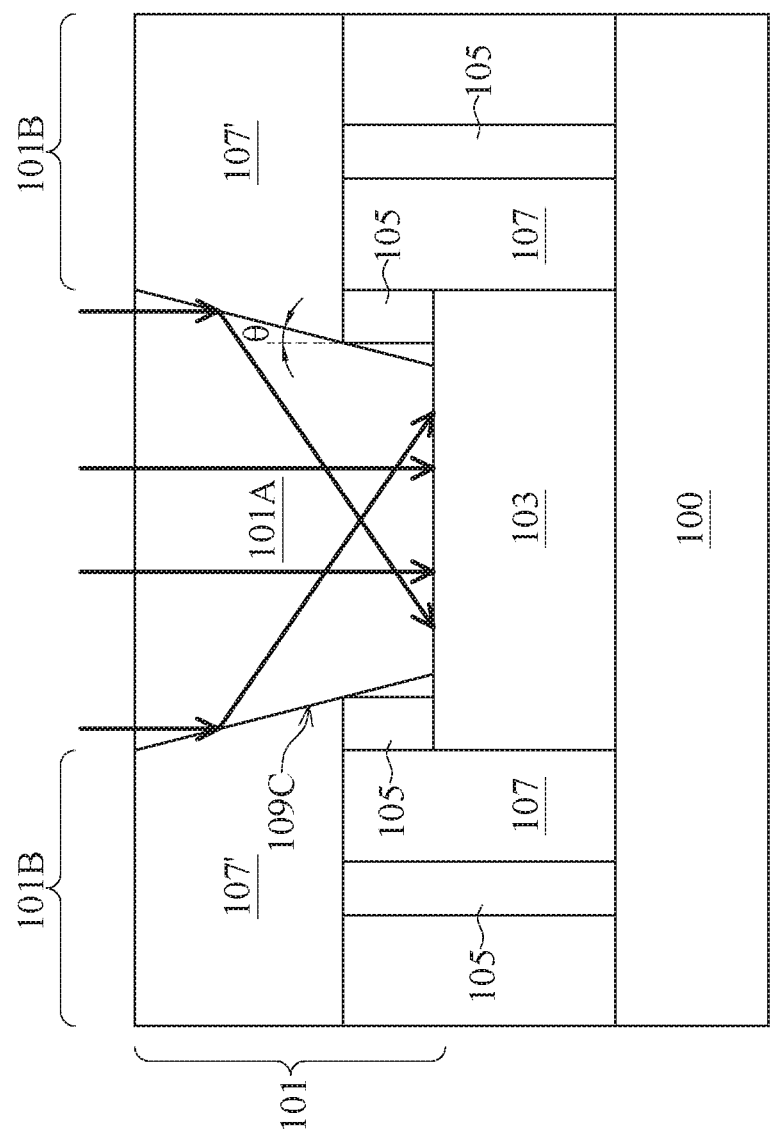
FIG. 3 illustrates a cross section of an optoelectronic device having a waveguide structure, according to some embodiments of the present disclosure.

FIG. 3 illustrates a cross section of an optoelectronic device 40, according to some embodiment of the present disclosure. The optoelectronic device 40 is different to the optoelectronic device 10 in that the first portion 101A of the waveguide structure 101 in optoelectronic device 10 is a stand-alone structure whereas the first portion 101A of the waveguide structure 101 in optoelectronic device 40 is surrounded by a second portion 101B. In some embodiments, the second portion 101B includes a dielectric layer 107' surrounds the first portion 101A of the waveguide structure 101.

In some embodiments, to allow total internal reflection of the optical signal within the first portion 101A, a refractive index of the dielectric layer 107' is smaller than a refractive index of the first portion 101A. In some embodiments, a difference between the refractive index of the first portion 101A and the refractive index of the dielectric layer 107' is not less than 0.3. In some embodiments, a difference between the refractive index of the first portion 101A and the refractive index of the dielectric layer 107' is between 0.3 and 1. In some embodiments, the second portion 101B of the waveguide structure 101 can include dielectric materials compatible with semiconductor manufacturing operations, for example, compatible with dielectric layer 107. In some embodiments, a sidewall surface 109C of the first portion 101A is in contact with the dielectric layer 107' having a refractive index smaller than that of the first portion 101A.

In some embodiments, optoelectronic device 40A in FIG. 4A is similar to optoelectronic device 10 except that an optical element 101A' is positioned over the first portion 101A of the waveguide structure 101. In some embodiments, the optical element 101A' is positioned over the first surface 109A of the first portion 101A of the waveguide structure 101. In some embodiments, the optical element 101A' can be a lens configured to focus incident optical signal from various directions toward the sensing aperture of the photosensitive region 103. In some embodiments, the lens can be formed by inkjet printing, reflow operation, gray scale lithography, or other suitable lens forming methods. In some embodiments, the optical element 101A' includes a material. The material of the optical element 101A' can be any suitable material depending on various design requirements, for example, depending on the transmittance. In some embodiments, the material of the optical element 101A' is the same as the first portion 101A of the waveguide structure 101. In some embodiments, the optical element 101A' and the first portion 101A are integrally formed. In some embodiments, there is no visible interface between the optical element 101A' and the first portion 101A. That is, the first portion 101A is devoid of the first surface 109A.

In some embodiments, optoelectronic device 40B in FIG. 4B is similar to optoelectronic device 40 except that an optical element 101A' is positioned over the first surface 109A of the first portion 101A of the waveguide structure 101. Details of the optical element 101A' can be referred to those previously described in FIG. 4A.

Figures 5A, 5B:
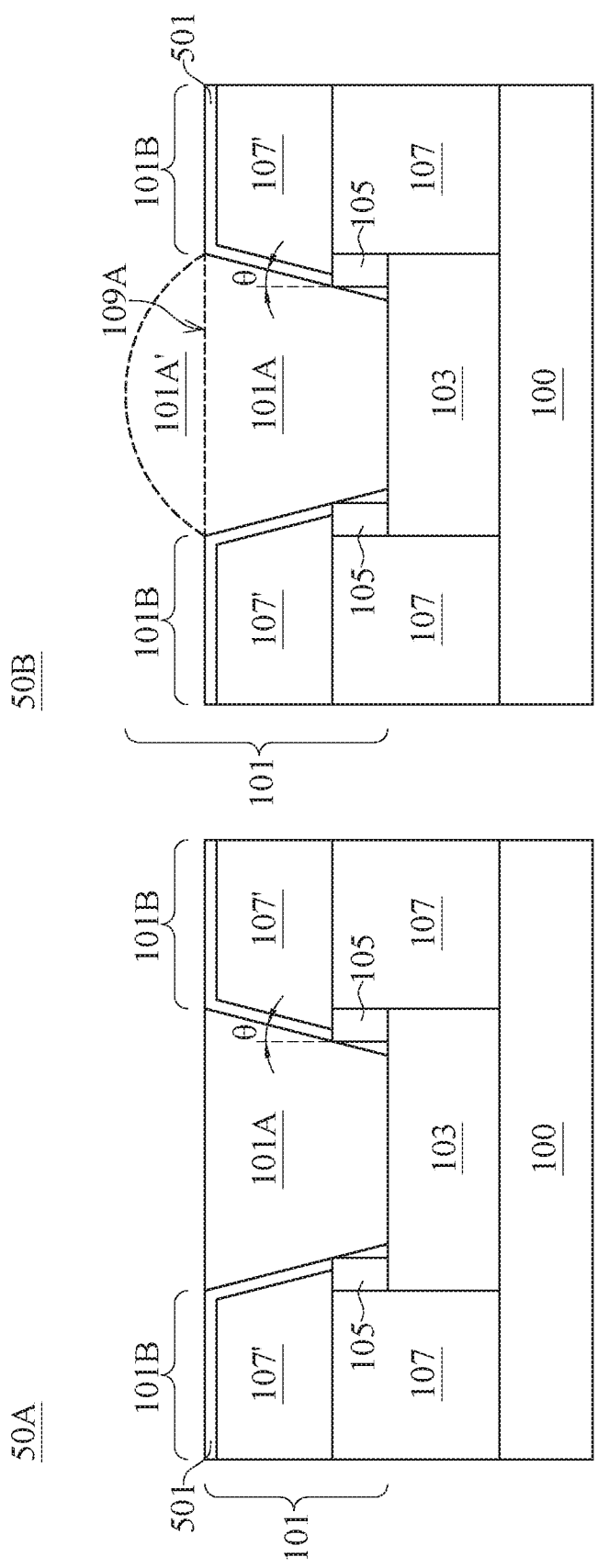
FIG. 5A and FIG. 5B illustrate cross sections of an optoelectronic device having a waveguide structure, according to some embodiments of the present disclosure.

In some embodiments, optoelectronic device 50A in FIG. 5A is similar to optoelectronic device 40 except that a reflecting layer 501 is positioned between the first portion 101A and the second portion 101B. In some embodiments, the reflecting layer 501 can be a metal layer configured to reflect optical signal impinging on its surface within the first portion 101A. In some embodiments, the metal layer includes metal including, but is not limited to, copper, aluminum, or tungsten. In some embodiments, the reflecting layer 501 can be an interfacial material improving optical reflectivity at a boundary between the first portion 101A and dielectric layer 107' of the second portion 101B of the waveguide structure 101. In some embodiments, the reflecting layer 501 is in contact with the dielectric layer 107' and the first portion 101A of the waveguide structure 101. The reflecting layer 501 may or may not be disposed over a top surface of the dielectric layer 107', depending on various design requirements. In some embodiments, optoelectronic device 50B in FIG. 5B is similar to optoelectronic device 50A except that an optical element 101A' is positioned over the first surface 109A of the first portion 101A of the waveguide structure 101. Details of the optical element 101A' can be referred to those previously described in FIG. 4A.

In some embodiments, optoelectronic device 60A in FIG. 6A is similar to optoelectronic device 50A except that a reflecting layer 601 surrounding the first portion 101A is positioned over the top surface of the dielectric layer 107 instead of interfacing with the dielectric layer 107' as shown in FIG. 5A. Details of the reflecting layer 601 can be referred to those previously described in FIG. 5A. In some embodiments, optoelectronic device 60B in FIG. 6B is similar to optoelectronic device 60A except that an optical element 101A' is positioned over the first surface 109A of the first portion 101A of the waveguide structure 101. Details of the optical element 101A' can be referred to those previously described in FIG. 4A.

In some embodiments, optoelectronic device 70A in FIG. 7A is similar to optoelectronic device 40 except that an adhesion layer 701 is connecting the first portion 101A and a top surface of the dielectric layer 107. The adhesive layer 701 can improve the adhesion between the first portion 101A and the underlying dielectric layer 107. The adhesive layer 701 also improves the mechanical strength of the waveguide structure 101 for further manufacturing process of the optoelectronic device 70A afterwards. In some embodiments, the adhesive layer 701 may or may not include or be composed of materials substantially identical to that of the first portion 101A of the waveguide structure 101, depending on manufacturing convenience and cost. In some embodiments, optoelectronic device 70B in FIG. 7B is similar to optoelectronic device 70A except that an optical element 101A' is positioned over the first surface 109A of the first portion 101A of the waveguide structure 101. Details of the optical element 101A' can be referred to those previously described in FIG. 4A.

In some embodiments, optoelectronic device 80A in FIG. 8A is similar to optoelectronic device 40 except that a supporting layer 801 is positioned on a top surface of the dielectric layer 107 and providing mechanical support to the first portion 101A. The second portion 101B of the waveguide structure 101 includes the supporting layer 801. The supporting layer 801 can laterally abut a side of the first portion, improving the structural integrity of the first portion 101A especially when an aspect ratio of the first portion 101A is high. A top surface 801A of the supporting layer 801 may be higher than the first surface 109A of the first portion 101A. In some embodiments, the supporting layer 801 may or may not include or be composed of materials substantially identical to that of the first portion 101A of the waveguide structure 101, depending on manufacturing convenience and cost. In some embodiment, an air gap 802 is between the supporting layer 801 and the first portion 101A. In some embodiments, the air gap 802 is between the sidewall surface 109C and the supporting layer 801. In some embodiments, a refractive index of the supporting layer 801 of the second portion 101B may be substantially identical to a refractive index of the first portion 101A. In some embodiments, the first portion 101A is firstly formed on the photosensitive region 103, and then the supporting layer 801 is formed on the dielectric layer 107 and physically connected to the first portion 101A. In some embodiments, the supporting layer 801 is formed on the dielectric layer 107, and then the first portion 101A is formed on the photosensitive region 103 and physically connected to the supporting layer 801. In some embodiments, optoelectronic device 80B in FIG. 8B is similar to optoelectronic device 80A except that an optical element 101A' is positioned over the first surface 109A of the first portion 101A of the waveguide structure 101. Details of the optical element 101A' can be referred to those previously described in FIG. 4A.

In some embodiments, optoelectronic device 90A in FIG. 9A is similar to optoelectronic device 80A except that the waveguide structure 101 is prepared as a separate unit and then attached to the dielectric layer 107 and photosensitive region 103. In some embodiments, the supporting layer 901 and the first portion 101A of the waveguide structure 101 are a single unit. As shown in FIG. 9A, one first portion 101A is connected to the supporting layer 901. In another embodiment, more than one first portions 101A can be prepared to connect to the supporting layer 901. For example, the sensing aperture of a photosensitive region 103 may accommodate a plurality of first portions 101A. In another embodiment, a plurality of supporting layers 901 can be connected to one first portion 101A. For example, one first portion 101A may cover a plurality of sensing apertures of the photosensitive regions 103. In some embodiments, optoelectronic device 90B in FIG. 9B is similar to optoelectronic device 90A except that an optical element 101A' is positioned over the first surface 109A of the first portion 101A of the waveguide structure 101. Details of the optical element 101A' can be referred to those previously described in FIG. 4A.

In some embodiments, optoelectronic device 1000A in FIG. 10A is similar to optoelectronic device 80A except that the supporting layer 1009 is spaced apart from the first portion 101A of the waveguide structure 101. Although not providing direct mechanical support to the first portion 101A, the supporting layer 1009 can lower the pressure exerted on the first portion 101A in subsequent manufacturing such as grinding process. In some embodiments, the supporting layer 1009 has a top surface 1009A higher than the first surface 109A of the first portion 101A, thereby facilitating attachment of a blue tape in the manufacturing process afterwards. The blue tape attached to the top surface 1009A of the supporting layer 1009 prevents the first surface 109A of the first portion 101A in subsequent manufacturing or handling operations from contamination or scratches. In some embodiments, optoelectronic device 1000B in FIG. 10B is similar to optoelectronic device 1000A except that an optical element 101A' is positioned over the first surface 109A of the first portion 101A of the waveguide structure 101. Details of the optical element 101A' can be referred to those previously described in FIG. 4A.

Figure 11C:
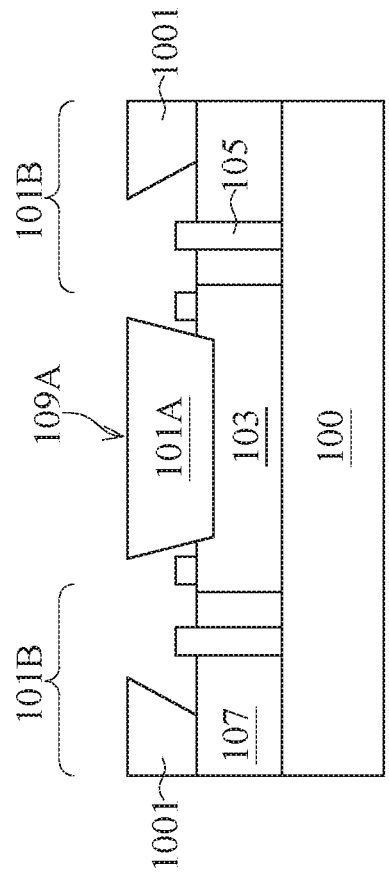
FIG. 11B, FIG. 11C, FIG. 11D, and FIG. 11E illustrate cross sections of the optoelectronic device dissecting from AA' of FIG. 11A during various manufacturing operations, according to some embodiments of the present disclosure.
Figure 11B:
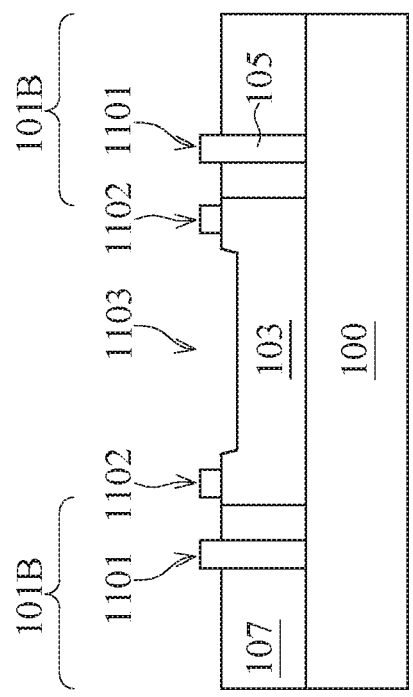
Figure 11A:
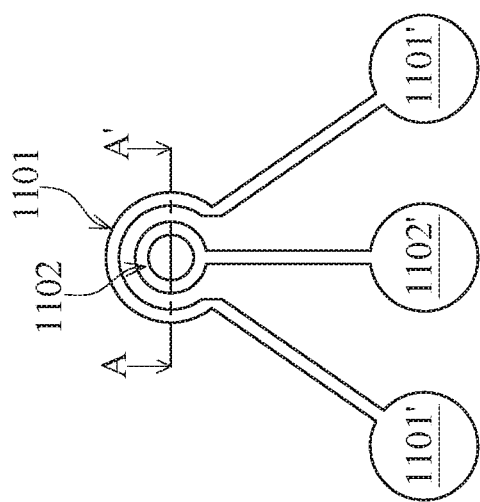
FIG. 11A illustrates a top view of conductive patterns over a photosensitive region of an optoelectronic device, according to some embodiments of the present disclosure.

FIG. 11A is a top view of conductive patterns over a substrate of an optoelectronic device. FIG. 11B to FIG. 11E illustrate cross sections of the optoelectronic device dissecting along line AA' of FIG. 11A during various manufacturing operations in a manufacturing method. From a top view perspective, first conductive trace 1101 is connected to two discrete first conductive pads 1101', and second conductive trace 1102 is connected to a second conductive pad 1102' physically separated from the first conductive pad 1101'. The shape of the first conductive pads 1101' and the shape of the second conductive pad 1102' can any suitable shape from a top view of the conductive patterns, for example, circular, square, or rectangular.

As shown in FIG. 11B, the first conductive trace 1101 and second conductive trace 1102 are electrically coupled to the electrical connections 105. A recess 1103 may be formed over the surface of the photosensitive region 103 and located within a region surrounded by second conductive trace 1102.

In FIG. 11C, a first portion 101A and a second portion 101B of the waveguide structure 101 is formed over the surface of the photosensitive region 103. Specifically, the first portion 101A of the waveguide structure 101 is positioned in the recess 1103 previously formed, and the second portion 101B of the waveguide structure 101 surrounds the first portion 101A, the first conductive trace 1101, and the second conductive trace 1102. In some embodiments, the second portion 101B is physically separated from the first portion 101A. In some embodiments, the second surface 109B of the first portion 101A is landed in the recess 1103 while the first surface 109A is partially hanging over the second conductive trace 1102, or in some embodiments, hanging over both the second conductive trace 1102 and first conductive trace 1101. The photosensitive region 103 is at least under a direct projection of the first portion 101A of the waveguide structure 101.

Figure 11D:
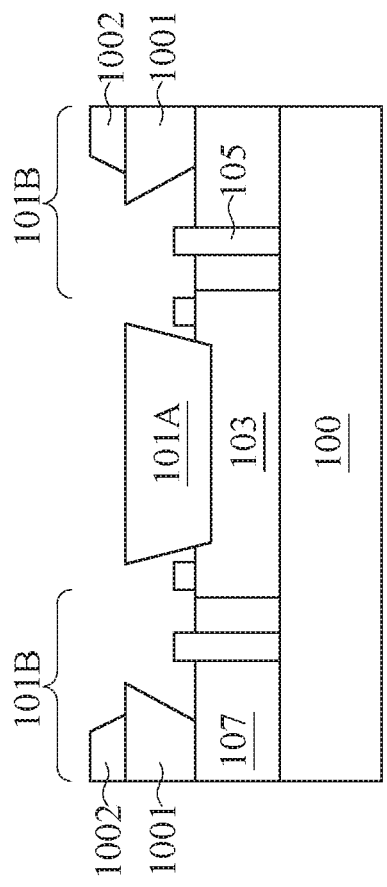
Figure 11E:
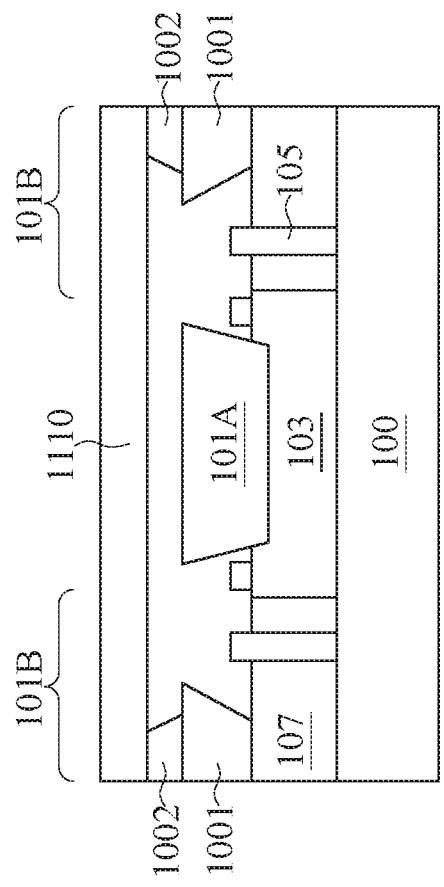

In some embodiments, the second portion 101B in FIG. 11C includes a first protection layer 1001. The second portion 101B of the waveguide structure 101 may be composed of material substantially identical to that of the first portion 101A. In some embodiments, the first portion 101A and the second portion 101B each have a top surface at a comparable level as shown in FIG. 11C. The second portion 101B may serve as a protection structure with respect to the first portion 101A. In FIG. 11D, a second protection layer 1002 is formed over the first protection layer 1001 and transforming the second portion 101B of the waveguide structure 101 to be substantially higher than the first portion 101A. In FIG. 11E, an adhesive layer 1110, for example, a blue tape layer, is attached to the waveguide at the second protection layer 1002. Since the second portion 101B is substantially higher than the first portion 101A of the waveguide structure 101, the second protection layer 1002 prevents the blue tape 1110 from contacting with a top surface of the first portion 101A, thereby protecting the first portion 101A in the subsequent manufacturing and handling operations.

Figure 11F:
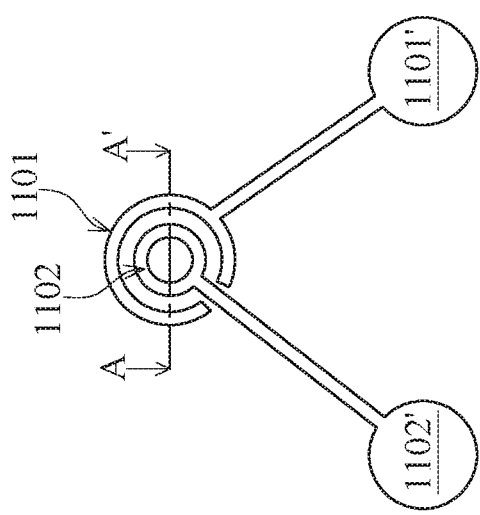
FIG. 11F illustrates a top view of conductive patterns over a photosensitive region of an optoelectronic device, according to some embodiments of the present disclosure.

FIG. 11F is a top view of conductive patterns similar to the conductive patterns in FIG. 11A except that the number of the first conductive pad 1101' is one for reducing the parasitic resistance of the optoelectronic device.

FIG. 12A and FIG. 12B illustrates a cross section of an optoelectronic device 1002A and 1002B having a waveguide structure 101, according to some embodiments of the present disclosure. The optoelectronic device 1002A includes a device substrate 100, a handling substrate 120 which may be removed in subsequent operations, a photosensitive region 103 supported by and adjacent to the device substrate 100, and a waveguide structure 101 over the device substrate 100 and the photosensitive region 103. The device substrate 100 may be any suitable substrate as described in paragraph FIG. 1. For example, the device substrate 100 may be any suitable substrate where semiconductor devices can be fabricated on. For another example, the device substrate 100 may be a silicon substrate. In some embodiments, the device substrate 100 is between the photosensitive region 103 and the waveguide structure 101. The device substrate 100 includes a first surface 100A and a second surface 100B opposite to the first surface 100A. The photosensitive region 103 is closer to the first surface 100A than to the second surface 100B of the device substrate 100. In some embodiments, the waveguide structure 101 and the photosensitive region 103 are at the two opposite sides of the device substrate 100. In some embodiments, an optical signal is incident on a surface of the photosensitive region 103 after propagating through the device substrate 100. In some embodiments, the material of the device substrate 100 has an absorption coefficient less than, for example, 10 times less than, 100 times less than or 1000 times less than the absorption coefficient of the material of the photosensitive region 403 at the peak wavelength of the optical signal. The waveguide structure 101, for example, the second surface 109B of the first region 101A illustrated in FIG. 12B, in the optoelectronic device described herein is closer to second surface 100B than to the first surface 100A of the device substrate 100. Electrical connections 105 formed adjacent to, or embedded and exposed from a surface of the photosensitive region 103, configured to transmit electronic signals generated in the photosensitive region 103. In some embodiments, the optoelectronic device 10 further includes a first contact region (not shown) and a second contact region (not shown) as described in FIG. 1. The electrical connections 105 are electrically coupled to the photosensitive region 103 by electrically coupled to the first contact region and the second contact region. Electrical connections 105 may further connected to conductive routings 121 in the dielectric layer 107. Openings 107A may be formed in the dielectric layer 107, allowing electrical signal generated by the photosensitive region 103 to be accessed from the second surface 100B of the device substrate 100.

Referring to FIG. 12A, the waveguide structure 101 includes a first portion 101A vertically aligned with the sensing aperture of the photosensitive region 103. The first portion 101A may include or be composed of materials allowing total internal reflection of the optical signal within the first portion 101A. Optical signal referred herein includes any polarization of light, such as linear polarization, circular polarization, elliptical polarization. In some embodiments, the first portion 101A includes a material having a refractive index between 1.4 and 1.9 at the peak wavelength of the optical signal. In some embodiments, the first portion 101A can include or be composed of polymeric materials or dielectric materials. Polymeric material includes, but is not limited to, epoxy, polyimide. The dielectric material includes, but is not limited to, Si, $SiO_2$, $Si_3N_4$, or the like. To allow total internal reflection of the optical signal within the first portion 101A, the ambient air surrounds an upper part of the first portion 101A.

As shown in FIG. 12A, the optoelectronic device 1002A further includes a dielectric layer 107 or an insulating layer surrounds the photosensitive region 103. The dielectric layer 107 includes dielectric material including, but is not limited to, Si, $SiO_2$, $Si_3N_4$. In some embodiments, the material of the dielectric layer 107 is different from the material of the first portion 101A.

The first portion 101A includes a first surface 109A configured to receive the incoming optical signal, a second surface 109B substantially parallel to the first surface 109A and opposite to the first surface 109A, and a sidewall surface 109C connecting the first surface 109A and the second surface 109B. In some embodiments, the sidewall surface 109C can be a surface inclining from a normal vector of the second surface 109B of the first portion 101A. In some embodiments, the sidewall surface 109C can be a surface inclining from a normal vector of the first surface 100A of the device substrate 100. In some embodiments, the sidewall surface 109C can be a plane. An angle θ is between the sidewall surface 109C and a normal vector of the first surface 100A of the device substrate 100. In some embodiments, an angle θ is between the sidewall surface 109C and a normal vector of the second surface 109B of the first portion 101A. In some embodiments, the angle θ can be in a range of from greater than 0° to about 40°, depending on various design considerations such as a thickness T of the first portion 101A. As shown in FIG. 12A, the second surface 109B of the waveguide structure 101 is closer to the second surface 100B of the device substrate 100 than to the first surface 100A of the device substrate 100.

Second surface 109B of the first portion 101A is designed to have a shape. For example, the first portion 101A from the top view may be circular, square, or rectangular depending on the spatial profile of the incoming optical signal. The shape of the second surface 109B may or may not be the same as the shape of the surface of the photosensitive region 103 receiving the optical signal. For example, the shape of the second surface 109B from the top view may be circular or oval whereas the shape of the surface of the photosensitive region 103 from the top view may be quadrilateral.

In general, a first width W1 of the first surface 109A is greater than a second width W2 of the second surface 109B. The second width W2 of the first portion 101A can be equal to or smaller than the lateral dimension WAP of the sensing aperture of the photosensitive region 103. The design rule of the second width W2 can be referred to FIG. 2 and descriptions associated thereto.

In some embodiments, optoelectronic device 1002B in FIG. 12B is similar to optoelectronic device 1002A except that the optoelectronic device 1002B further includes a second portion 101B surrounding the first portion 101A. Details of the second portion 101B can be referred to those previously described in FIG. 3.

In some embodiments, optoelectronic device 1003A in FIG. 13A is similar to optoelectronic device 1002B except that a reflecting layer 601 is positioned between the first portion 101A and the dielectric layer 107' of the second portion 101B. Details of the reflecting layer 601 can be referred to those previously described in FIG. 5A. In some embodiments, optoelectronic device 1003B in FIG. 13B is similar to optoelectronic device 1003A except that an optical element 101A' is positioned over the first surface 109A of the first portion 101A of the waveguide structure 101. Details of the optical element 101A' can be referred to those previously described in FIG. 4A.

In some embodiments, optoelectronic device 1004A in FIG. 14A is similar to optoelectronic device 1003A except that a reflecting layer 1401 surrounding the first portion 101A is positioned over the second surface 100B of the device substrate 100 instead of interfacing with the dielectric layer 107' as shown in FIG. 13A. The second portion 101B of the waveguide structure 101 includes the reflecting layer 1401. Details of the reflecting layer 1401 can be referred to those previously described in FIG. 6A. In some embodiments, optoelectronic device 1004B in FIG. 14B is similar to optoelectronic device 1004A except that an optical element 101A' is positioned over the first surface 109A of the first portion 101A of the waveguide structure 101. Details of the optical element 101A' can be referred to those previously described in FIG. 4A.

In some embodiments, optoelectronic device 1005A in FIG. 15A is similar to optoelectronic device 1002A except that an adhesion layer 1501 is connecting the first portion 101A and the second surface 100B of the device substrate 100. Details of the adhesion layer 1501 can be referred to those previously described in FIG. 7A. In some embodiments, optoelectronic device 1005B in FIG. 15B is similar to optoelectronic device 1005A except that an optical element 101A' is positioned over the first surface 109A of the first portion 101A of the waveguide structure 101. Details of the optical element 101A' can be referred to those previously described in FIG. 4A.

In some embodiments, optoelectronic device 1006A in FIG. 16A is similar to optoelectronic device 1002A except that the supporting layer 901 is positioned on the second surface 100B of the device substrate 100 and providing mechanical support to the first portion 101A. The second portion 101B of the waveguide structure 101 includes the supporting layer 901. Details of the supporting layer 901 can be referred to those previously described in FIG. 8A. In some embodiments, optoelectronic device 1006B in FIG. 16B is similar to optoelectronic device 1006A except that an optical element 101A' is positioned over the first surface 109A of the first portion 101A of the waveguide structure 101. Details of the optical element 101A' can be referred to those previously described in FIG. 4A.

In some embodiments, optoelectronic device 1007A in FIG. 17A is similar to optoelectronic device 1006A except that the waveguide structure 101 is prepared as a separate unit and then attached to the second surface 100B of the device substrate 100. Details of the waveguide structure 101 being a separate unit can be referred to those previously described in FIG. 9A. In some embodiments, optoelectronic device 1007B in FIG. 17B is similar to optoelectronic device 1007A except that an optical element 101A' is positioned over the first surface 109A of the first portion 101A of the waveguide structure 101. Details of the optical element 101A' can be referred to those previously described in FIG. 4A.

In some embodiments, optoelectronic device 1008A in FIG. 18A is similar to optoelectronic device 1006A except that the supporting layer 1009 is spaced apart from the first portion 101A of the waveguide structure 101. The second portion 101B of the waveguide structure 101 includes the supporting layer 1009. Details of the supporting layer 1009 spacing apart from the first portion 101A can be referred to those previously described in FIG. 10A. In some embodiments, optoelectronic device 1008B in FIG. 18B is similar to optoelectronic device 1008A except that an optical element 101A' is positioned over the first surface 109A of the first portion 101A of the waveguide structure 101. Details of the optical element 101A' can be referred to those previously described in FIG. 4A.

Figure 19:
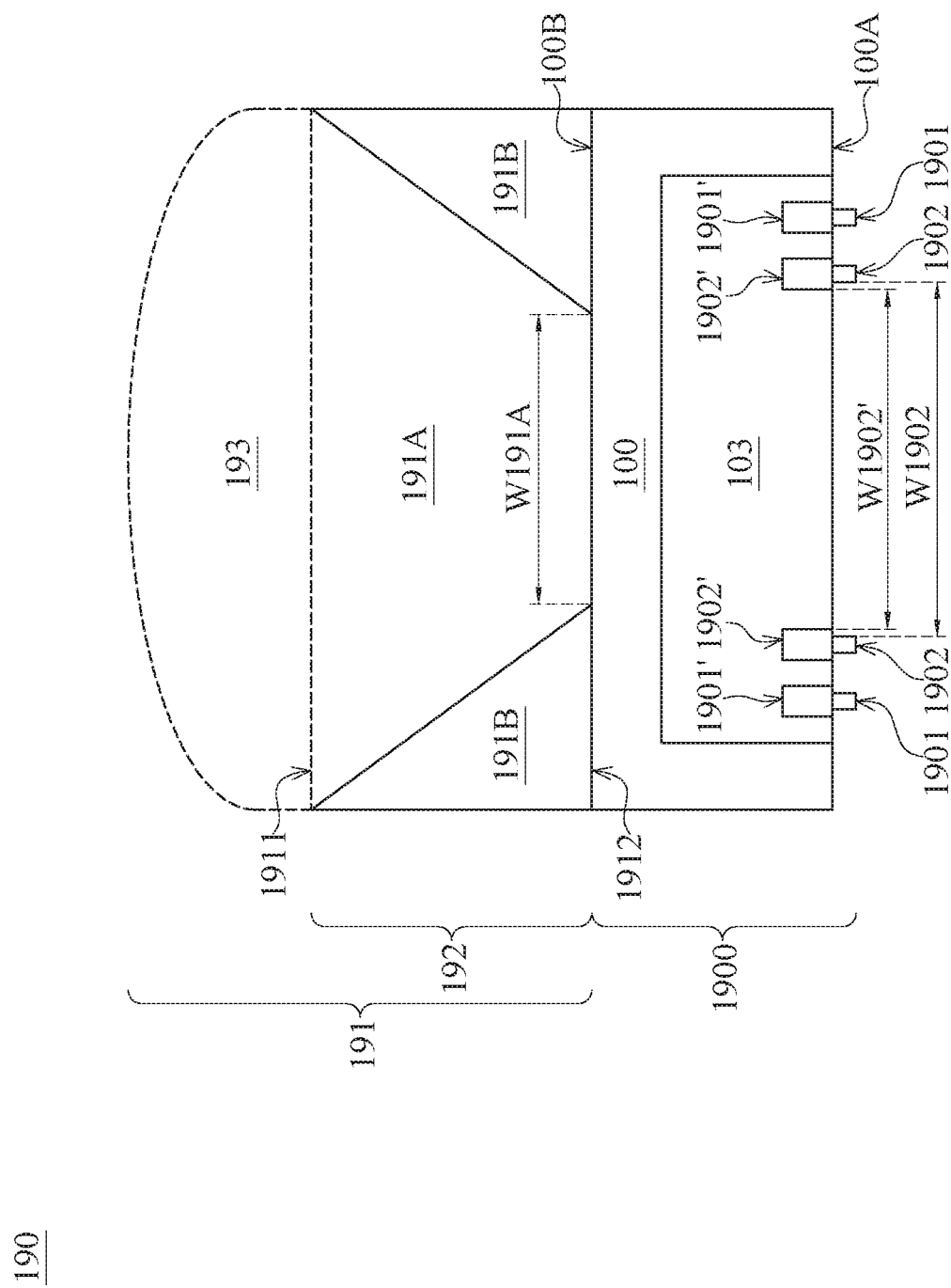
FIG. 19 illustrates a cross section of an optoelectronic device having a waveguide structure, according to some embodiments of the present disclosure.

FIG. 19 illustrates a cross section of an optoelectronic device 190 having a waveguide structure 191, according to some embodiments of the present disclosure. The optoelectronic device 190 includes a photo sensing unit 1900 and a waveguide structure 191 over the photo sensing unit 1900. The photo sensing unit 1900 includes a photosensitive region 103 and a device substrate 100 supporting the photosensitive region 103. The device substrate 100 may include any suitable substrate where the photosensitive region 103 can be fabricated on. In some embodiments, the substrate 100 includes a semiconductor material. In some embodiments, the device substrate 100 is composed of a single material. For example, the device substrate 100 may be a silicon substrate. In some embodiments, the device substrate 100 includes multiple materials, for example, the device substrate 100 includes an insulating material and a semiconductor material. In some embodiment, the device substrate 100 includes $SiO_2$ and Si. In some embodiments, the device substrate 100 includes a stack of multiple layers. In some embodiments, a material of the photosensitive region 103 is different from the material of the device substrate 100.

The device substrate 100 includes a first surface 100A and a second surface 100B opposite to the first surface 100A. In some embodiments, the second surface 100B of the device substrate 100 is closer to the waveguide structure 191 than the first surface 100A of the device substrate 100. In other words, the second surface 100B of the device substrate 100 is between the waveguide structure 191 and the photosensitive region 103.

The waveguide structure 191 includes a base portion 192 including a first region 191A and a second region 191B surrounding the first region 191A. The first region 191A possesses a first refractive index, and the second region 191B possesses a second refractive index. In some embodiments, the first refractive index is different from the second refractive index. In some embodiments, the first refractive index is greater than the second refractive index so that when an incoming optical signal, such as an incoming light enters the waveguide structure 191, the light is propagating from a wider end of the first region 191A to a narrower end of the first region 191A via, for example, total internal reflection. In some embodiments, a difference between the first refractive index and the second refractive index is not less than 0.3. The second region 191B can be composed of or include air or oxide-based materials such as aluminum oxide ($AlO_x$) and silicon oxide ($SiO_x$). In some embodiments, the second region 191B can be composed of or include oxynitride material such as silicon oxynitride ($SiO_xN_y$), and aluminum oxynitride ($Al_xON_y$). In some embodiments, the second region 191B can be composed of or include dielectric material such as $MgF_2$. The narrower end of the first region 191A has a width W191A engaging with the second surface 100B of the device substrate 100. The base portion 192 includes an upper surface 1911 and a bottom surface 1912. A width of the first region 191A is gradually decreasing from the upper surface 1911 to the bottom surface 1912. In contrast, a width of the second region 191B is gradually increasing from the upper surface 1911 to the bottom surface 1912. As exemplified in FIG. 19, an interface between the first region 191A and the second region 191B is inclined with respect to the bottom surface 1912. In some embodiments, the first region 191A is in contact with the second region 191B at the interface. In some embodiments, the incoming optical signal enters in to the photosensitive region 103 after propagating through the device substrate 100.

In some embodiments, the photo sensing unit 1900 includes electrical connections such as two pairs of carrier control terminals 1902 and carrier collection terminals 1901, which may be formed adjacent to, or on an exposed surface of the photosensitive region 103. The carrier control terminals configured to transmit electronic signals generated in the photosensitive region 103. In some embodiments, the photo sensing unit 1900 further includes two first doped regions 1901' electrically coupled to the carrier collection terminals 1901 in a one-to-one correspondence. In some embodiments, the photo sensing unit 1900 further includes two second doped region 1902' between the first doped regions 1901' and electrically coupled to the carrier control terminal 1902 in a one-to-one correspondence. In a single photo sensing unit 1900, a separation between a pair of the carrier control terminals 1902 is denoted with a width W1902, and a separation between a pair of the second doped regions 1902' associated with the carrier control terminal 1902 is denoted with a width W1902'. In some embodiments, the width W191A at the narrower end of the first region 191A is narrower than the width W1902. In some embodiments, the width W191A at the narrower end of the first region 191A is even narrower than the width W1902', so that the incoming light collected by the waveguide structure 191 can be fully absorbed by the photosensitive region 103 without interference of the carrier collection terminals 1901, the carrier control terminals 1902 and the periodic doped regions 1901', 1902'. In some embodiments, the width W191A at the narrower end of the first region 191A is substantially the same as the width of the sensing aperture of the optoelectronic device 190.

In some embodiments, the shape of the photo sensing unit 1900 from a top view may be any suitable shape. The shape of the aperture of the waveguide structure 191 from a top view may be any suitable shape. In some embodiments, the shape of the photo sensing unit 1900 from a top view may be substantially the same as the shape of the aperture of the waveguide structure 191 from a top view so as to reduce the loss of the optical signal entering the photo sensing unit 1900. For example, when the shape of the photo sensing unit 1900 is quadrilateral, the shape of the aperture of the waveguide structure 191 is also quadrilateral.

In some embodiments, an optical element 193, for example, a micro-lens, a Fresnel plate, or a patterned structure (shown in FIG. 25) can be disposed over the upper surface 1911 of the base portion 192. The optical element 193, for example, a micro-lens, is configured to capture greater amount of incoming light to enter the base portion 192 through a focusing mechanism.

In some embodiments, since the waveguide structure 191 includes the base portion 192 including at least two materials arranged alternately along the transverse direction, the base portion 192 is capable of collecting the incident light incident on the photosensitive region 103. The requirement of manufacturing a high-quality optical element capable of achieving the effect described above is lessened compared to a comparative example in accordance to an optoelectronic device without including the base portion 192. In other words, the manufacturing tolerance of the optical element 193 of the optoelectronic device 190 can increase. In some embodiments, the manufacturing tolerance of the optical element 193 is beneficial for the manufacturing of the optoelectronic device 190 where the photosensitive region 103 is in a shape of quadrilateral and is in a size larger than 5 μm times 5 μm and the optical element is formed through a reflow operation.

Figure 20:
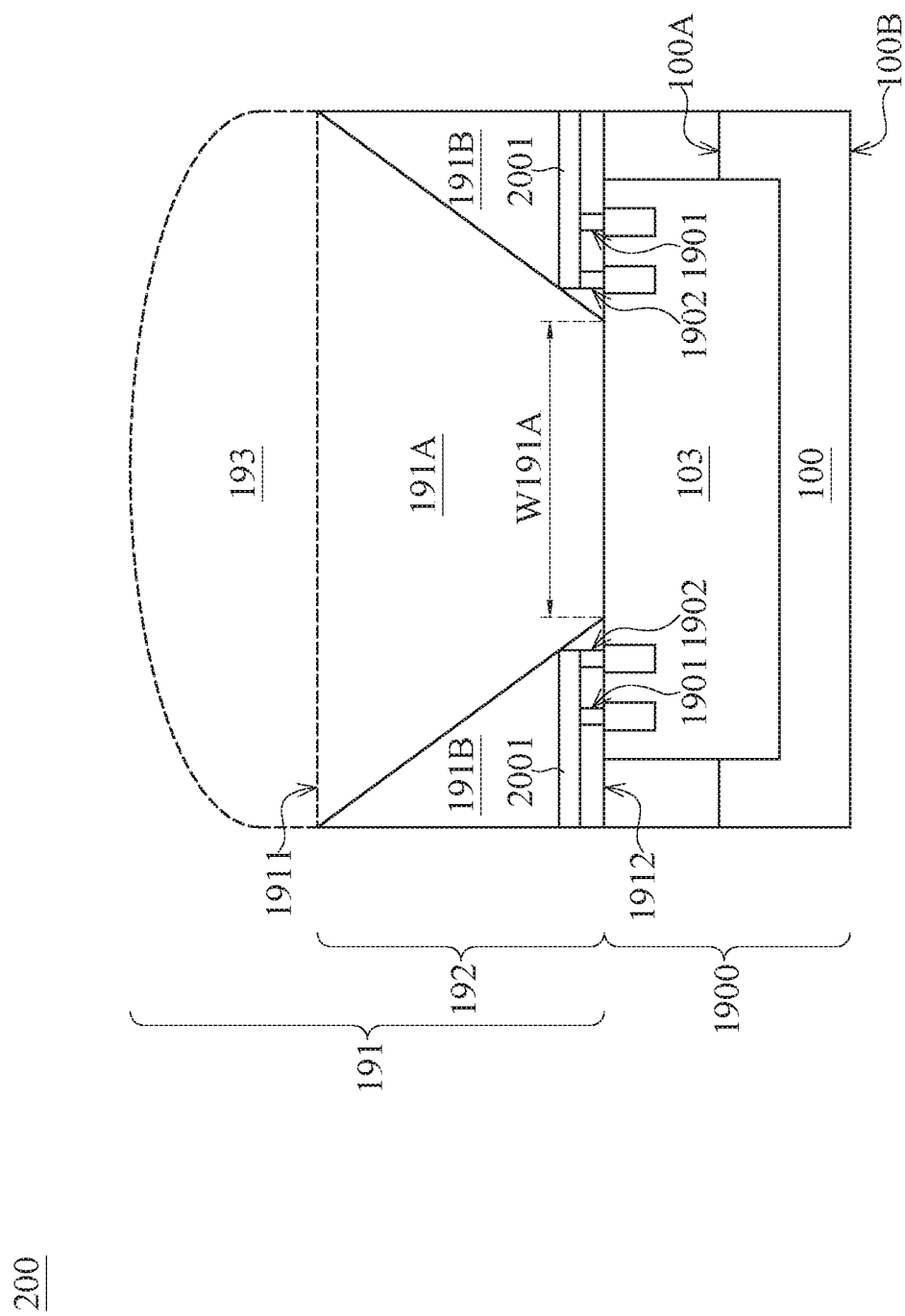
FIG. 20 illustrates a cross section of an optoelectronic device having a waveguide structure, according to some embodiments of the present disclosure.

FIG. 20 illustrates a cross section of an optoelectronic device 200 having a waveguide structure 191, according to some embodiments of the present disclosure. The optoelectronic device 200 is different to the optoelectronic device 190 in that the waveguide structure 191 is closer to the first surface 100A in the optoelectronic device described herein than to the second surface 100B of the device substrate 100, and that electrical wiring layers 2001 in proximal to the narrower end of the first region 191A of the waveguide structure 191 may be formed to connected to the carrier control terminal 1902 and the carrier collection terminal 1901 of the photo sensing unit 1900. Moreover, the photosensitive region 103 is partially embedded in the device substrate 100 and partially protruding from the first surface 100A of the device substrate 100. In some embodiments, the bottom surface 1912 of the base portion 192 is between the device substrate 100 and the upper surface 1911 of the base portion 192. In some embodiments, the optical signal enters the photosensitive region 103 without propagating through the device substrate 100.

Figure 21:
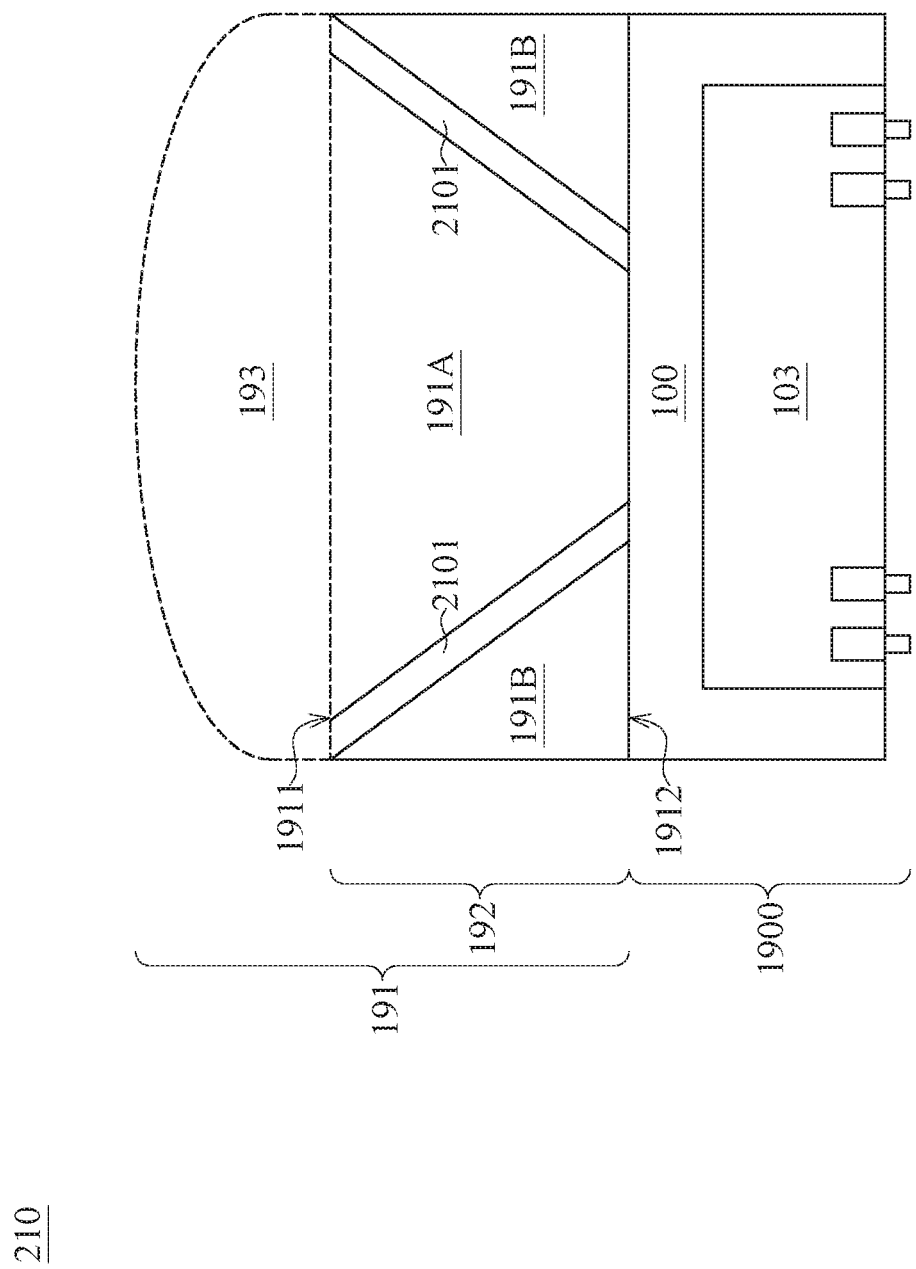
FIG. 21 illustrates a cross section of an optoelectronic device having a waveguide structure, according to some embodiments of the present disclosure.

FIG. 21 illustrates a cross section of an optoelectronic device 210 having a waveguide structure 191, according to some embodiments of the present disclosure. The optoelectronic device 210 is different to the optoelectronic device 190 in that a reflective layer 2101 is lining between the first region 191A and the second region 191B. Moreover, the refractive index of the first region 191A may be greater than or lower than the refractive index of the second region 191B in the optoelectronic device 210. The reflective layer 2101 can be composed of or include metal such as W, Au, Ag, Cu, or the like. The second region 191B of the waveguide structure 191 may be composed of or include silicon or silicon nitrides (e.g., $Si_3N_4$). In FIG. 21, when incoming light enters the waveguide structure 191, the light is propagated from a wider end of the first region 191A to a narrower end of the first region 191A via, for example, reflection from the reflective layer 2101. The second region 191B is composed of or include material that is suitable for reflective material deposition thereon, therefore, the refractive index of the second region 191B is not limited to be smaller than that of the first region 191A, as previously discussed in FIG. 19, because it is the reflective layer 2101 interfacing with the first region 191A and serving the light guiding purpose.

Figure 22:
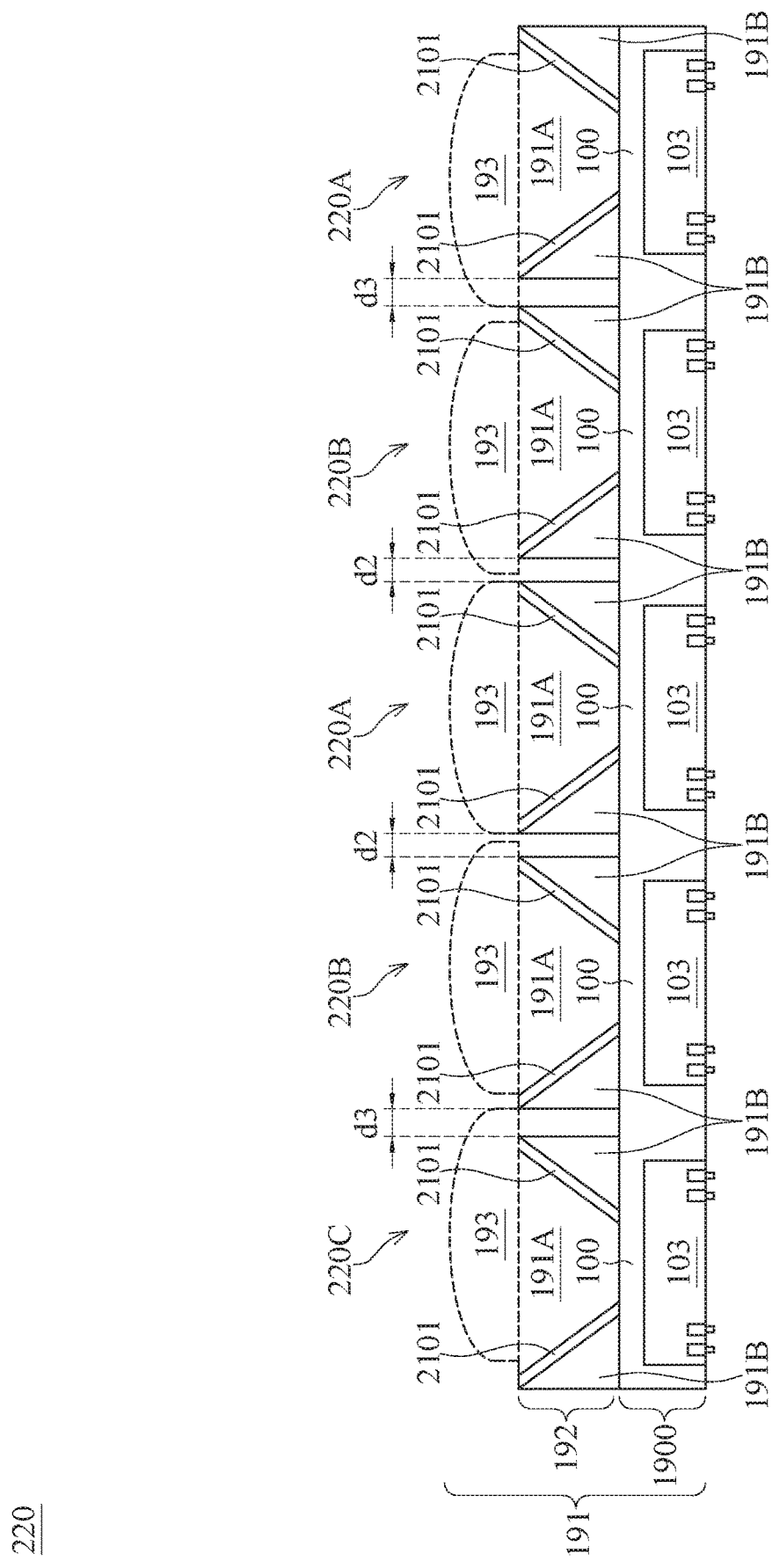
FIG. 22 illustrates a cross section of an optoelectronic device array in which each optoelectronic device having a waveguide structure, according to some embodiments of the present disclosure.

FIG. 22 illustrates a cross section of an optoelectronic device array 220 each having a waveguide structure 191, according to some embodiments of the present disclosure. The optoelectronic device array 220 includes a first optoelectronic device 220A, a third optoelectronic device 220C positioned at a periphery of the first optoelectronic device 220A, and a second optoelectronic device 220B positioned between the first optoelectronic device 220A and the third optoelectronic device 220C. In some embodiments, the first optoelectronic device 220A is the center of the optoelectronic device array 220. In some embodiments, the photo sensing unit 1900 of the first optoelectronic device 220A, the photo sensing unit 1900 of the second optoelectronic device 220AB and the photo sensing unit 1900 of the third optoelectronic device 220C share the same device substrate 100. The optical elements 193 over the photosensitive region 103 of the second optoelectronic device 220B and the third optoelectronic device 220C, respectively, may be shifted toward first optoelectronic device 220A being the center of the array, for example, to different extents. In some embodiments, the optical element 193 of the first optoelectronic device 220A is aligning with a center of the first region 191A of the first optoelectronic device 220A. The optical element 193 of the second optoelectronic device 220B is shifted by a distance d2 from a center of the first region 191A of the second optoelectronic device 220B and toward the first optoelectronic device 220A. The optical element 193 of the third optoelectronic device 220C is shifted by a distance d3 from a center of the first region 191A of the third optoelectronic device 220C and toward the first optoelectronic device 220A. In some embodiments, the distance d3 is greater than the distance d2. In some embodiments, the optical elements 193 of the optoelectronic device array 220 can be individually arranged to adapt for incoming light patterns.

Figure 23:
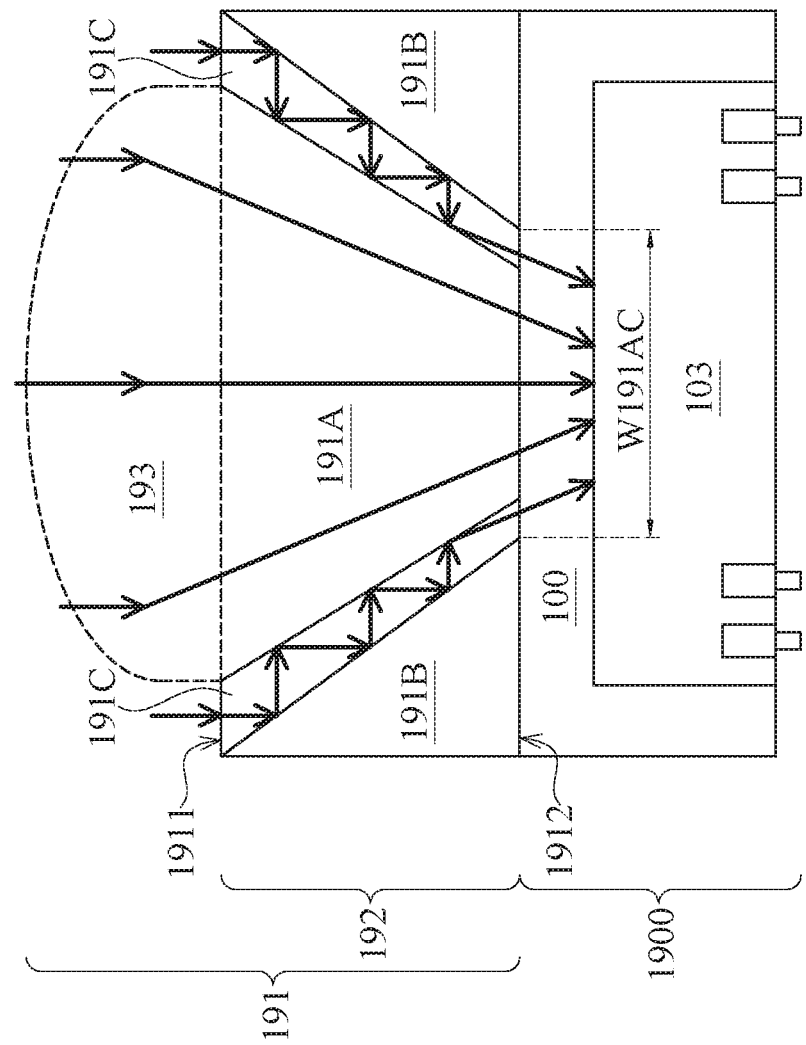
FIG. 23 illustrates a cross section of an optoelectronic device having a waveguide structure, according to some embodiments of the present disclosure.

FIG. 23 illustrates a cross section of an optoelectronic device 230 having a waveguide structure 191, according to some embodiments of the present disclosure. The optoelectronic device 230 is different to the optoelectronic device 190 in that a third region 191C is positioned between the first region 191A and the second region 191B. Moreover, the refractive index of the first region 191A and the refractive index of the second region 191B may be lower than the refractive index of the third region 191C in the optoelectronic device 230. The first region 191A and the second region 191B may or may not be composed of or include substantially identical material, for example, the second region 191B can be composed of or include air or oxide-based materials or the like, and the third region 191C may be composed of or include, but not limited to, silicon, silicon nitride (e.g., $Si_3N_4$), or germanium. The material of the photosensitive region 103 is different from the material of the third region 191C. For example, when the photosensitive region 103 is composed of germanium, the third region 191C is not composed of germanium. In some embodiments, a width of the third region 191C is gradually decreasing from the upper surface 1911 to the bottom surface 1912. The third region 191C is cladded by the lower refractive index first region 191A and second region 191B, therefore, the light not captured by the optical element 193 may further enter the third region 191C and being guided to the bottom surface 1912 of the base portion 192. As illustrated in FIG. 23, the top surface of the third region 191C may not be covered by the optical element 193. That is, at least a portion of the upper surface 1911 is exposed to the incoming light without the obstruction of the optical element 193. In some embodiments, the base portion 192 includes a channel for guiding the optical signal into the photo sensing unit 1900 below. The channel is surrounded by the second region 191B. The channel includes a width W191AC substantially the same as the sum of the width of the narrower end of the first region 191A and the width of the bottom surface of the third region 191C.

Figure 24:
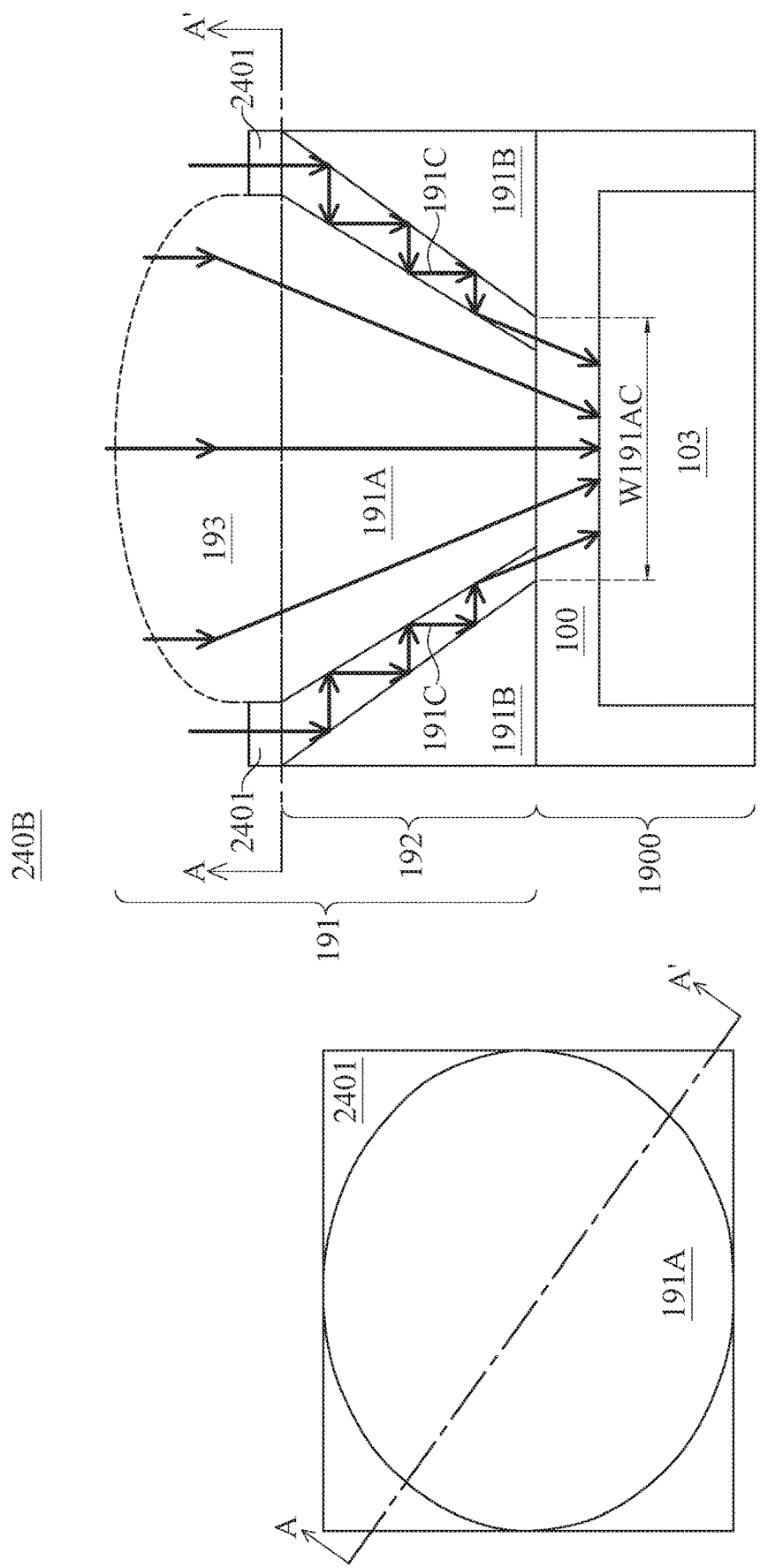
FIG. 24A illustrates a top view of an optoelectronic device having a waveguide structure, according to some embodiments of the present disclosure.
FIG. 24B illustrates a cross section of the optoelectronic device of FIG. 24A, according to some embodiments of the present disclosure.

FIG. 24A illustrates a top view of an optoelectronic device 240B having a waveguide structure 191 of FIG. 24B, and FIG. 24B illustrates a cross section of the optoelectronic device 240B along an A-A' line in FIG. 24A, according to some embodiments of the present disclosure. The wider end of the first region 191A may possess a circular profile, as shown in FIG. 24A, and the area surrounding the first region 191A, which may be the third region 191C, can be coated with an anti-reflective layer 2401 on the top surface of the third region 191C, so as to facilitate incoming light entering the third region 191C. The optoelectronic device 240B is different to the optoelectronic device 230 in that the anti-reflective layer 2401 is formed over the top surface of the third region 191C. The anti-reflective layer 2401 can be any suitable material such as possessing a refractive index less than the refractive index of the third region 191C.

Figure 25:
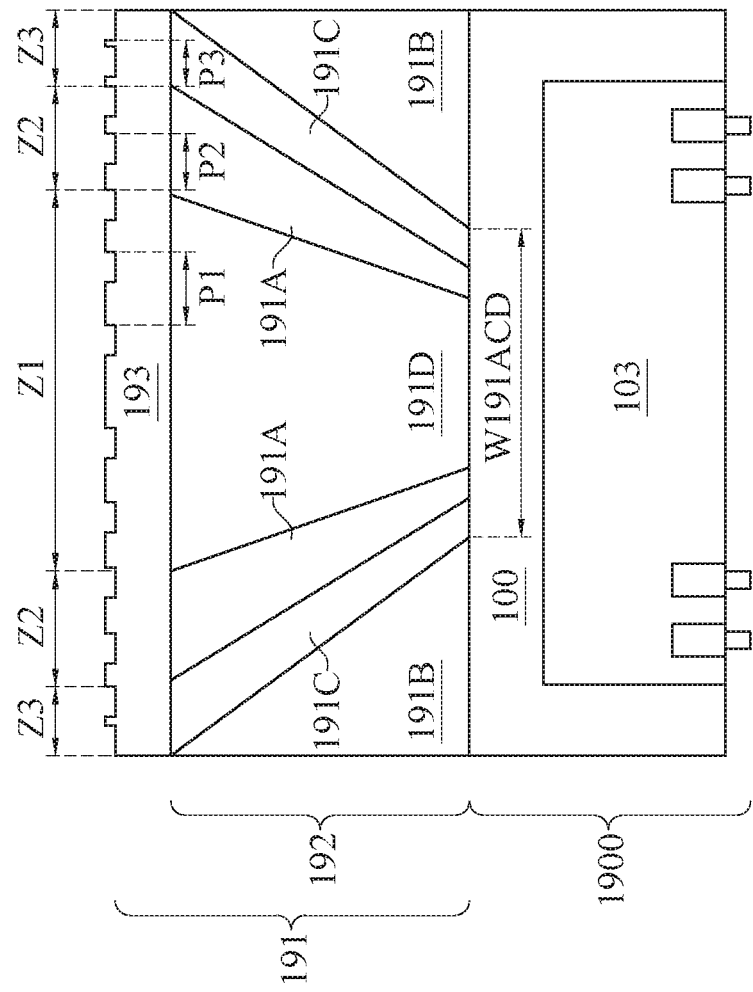
FIG. 25 illustrates a cross section of an optoelectronic device having a waveguide structure, according to some embodiments of the present disclosure.

FIG. 25 illustrates a cross section of an optoelectronic device 250 having a waveguide structure 191, according to some embodiments of the present disclosure. The optoelectronic device 250 is different to the optoelectronic device 230 in that an additional fourth region 191D is formed as substantially the center of the waveguide structure 191. Moreover, the optical element 193 over the base portion 192 is in a form of a Fresnel plate, a meta surface, or a guided-mode resonance structure. In some embodiments, the refractive index of the fourth region 191D is greater than the refractive index of the first region 191A, and the refractive index of the third region 191C is greater than the refractive index of the first region 191A and greater than the refractive index of the second region 191B. In some embodiments, a difference between the refractive index of the first region 191A and the refractive index of the fourth region 191D is not less than 0.3. In some embodiments, a difference between the refractive index of the first region 191A and the refractive index of the third region 191C is not less than 0.3. When travelling along a transverse direction in the waveguide structure 191, the refractive indices appears to be alternatingly high and low. In some embodiments, the materials of the fourth region 191D and the third region 191C may or may not be identical. In some embodiments, the materials of the first region 191A and the second region 191B may or may not be identical. The optical element 193 of the optoelectronic device 250 includes various zones with different patterns. In some embodiments, the optical element 193 includes 3 different patterns. For example, a first zone Z1 is projecting over the center of the base portion 192, the third zone Z3 is projecting over a periphery of the base portion 192, and the second zone Z2 is between the first zone Z1 and the third zone Z3. For example, the optical element 193 includes protrusions and recesses, and a transversal dimension including one protrusion and one recess immediately adjacent thereto is referred to a pattern P. A width of the pattern P1 in the first zone Z1 may be greater than a width of the pattern P2 in the second zone Z2. Similarly, a width of the pattern P2 in the second zone Z2 may be greater than a width of the pattern P3 in the third zone Z3. Various zones with different patterns of the optical element 193 are to improve light focusing into the base portion 192 below. In some embodiments, the width W191ACD of the aperture of the base portion 192 is substantially the same as the sum of the width of the narrower end of the fourth region 191D, the width of the narrower end of the first region 191A, and the width of the narrower end of the third region 119C.

Figure 26:
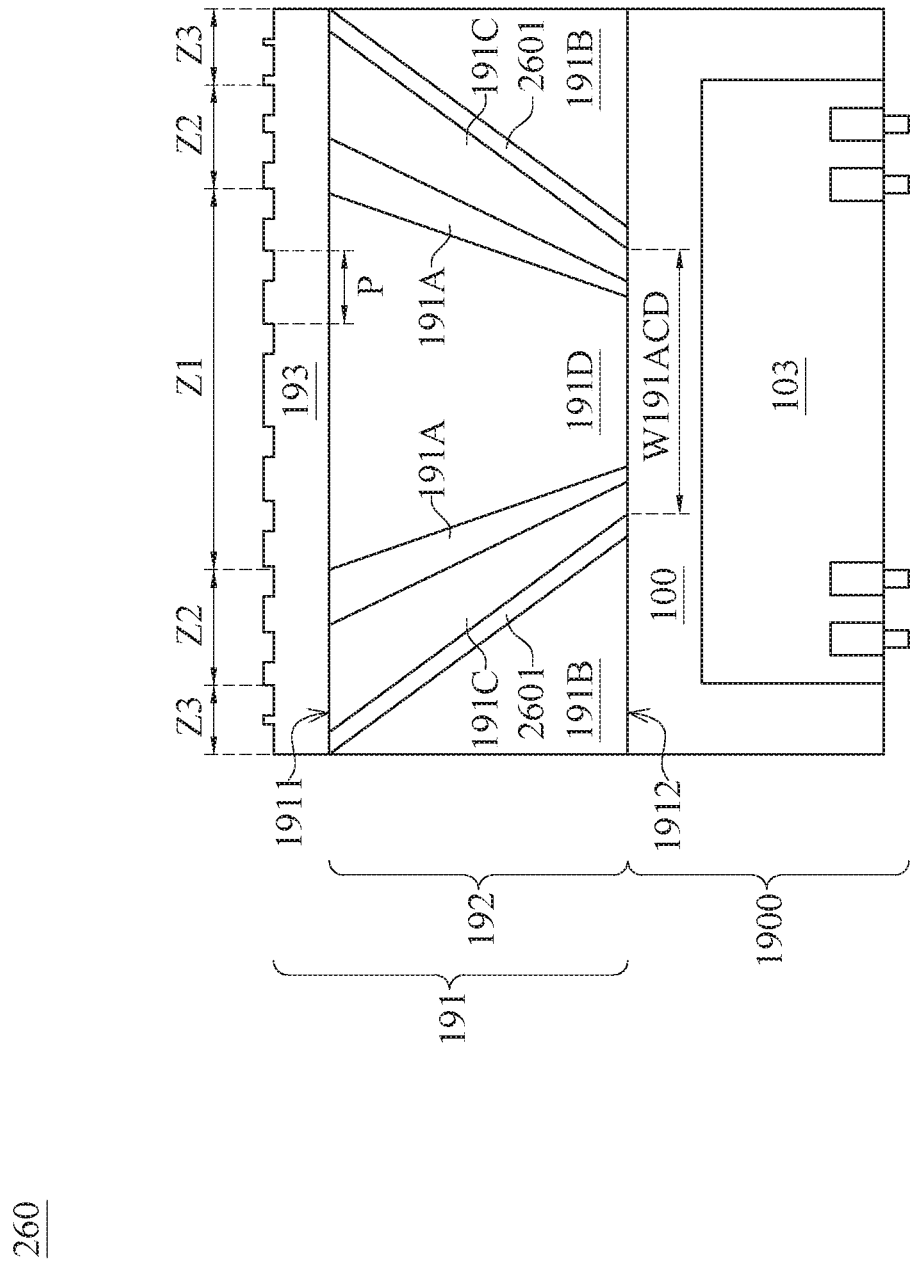
FIG. 26 illustrates a cross section of an optoelectronic device having a waveguide structure, according to some embodiments of the present disclosure.

FIG. 26 illustrates a cross section of an optoelectronic device 260 having a waveguide structure 191, according to some embodiments of the present disclosure. The optoelectronic device 260 is different to the optoelectronic device 250 in that a reflective layer 2601 is lining between the fourth region 191D and the second region 191B. In some embodiments, the reflective layer 2601 is lining between the third region 191C and the second region 191B. Moreover, the refractive index of the first region 191A may be greater than the refractive index of the fourth region 191D and the refractive index of the third region 191C in the optoelectronic device 260, and refractive index of the second region 191B may be greater than the refractive index of the third region 191C and the fourth region 191D in the optoelectronic device 260. The reflective layer 2601 can be composed of or include metal such as W, Au, Ag, Cu, or the like. The first region 191A and the second region 191B of the waveguide structure 191 may be composed of or include silicon or silicon nitrides (e.g., $Si_xN_y$). In FIG. 26, when incoming light enters the waveguide structure 191, the light is propagated from the upper surface 1911 to the bottom surface 1912 via, for example, total internal reflection and also the reflection from the reflective layer 2601 to further enhance the amount of the light guiding into the photo sensing unit 1900 below. The second region 191B is composed of or includes material that is suitable for the reflective layer 2601 to be formed thereon, for example, suitable for the reflective layer 2601 to be deposited thereon.

FIG. 27A to FIG. 27F illustrate cross sections of a photo sensing unit 1900 of an optoelectronic device, according to some embodiments of the present disclosure. Various photo sensing unit 1900 exemplified in FIG. 27A to FIG. 27F can be integrated with the waveguide structure disclosed herein. The photo sensing unit 1900 is configured to absorb photons and to generate photo-carriers from the absorbed photons. In some embodiments, the photosensitive region 103 is configured to absorb photons having a peak wavelength in an invisible wavelength range not less than 800 nm, such as 850 nm, 940 nm, 1050 nm, 1064 nm, 1310 nm, 1350 nm, or 1550 nm. In some embodiments, the invisible wavelength range is not more than 2000 nm. In some embodiments, the photo sensing unit 1900 receives an optical signal and converts the optical signal into electrical signals. In some embodiments, the photosensitive region 103 is intrinsic, doped with a p-type dopant, or doped with an n-type dopant. In some embodiments, p-type dopant is boron. In some embodiments, the n-type dopant includes a group-V element. In some embodiments, the n-type dopant is phosphorous. In some embodiments, the photosensitive region 103 includes polycrystalline material. In some embodiments, the photosensitive region 103 includes GeSi, Si, or Ge. In some embodiments, the photosensitive region 103 includes amorphous GeSi. In some embodiments, the photosensitive region 103 composed of intrinsic germanium is p-type due to material defects formed during formation of the photosensitive region 103, wherein the defect density is from $1E^{14}/cm^3$ to $1E^{16}/cm^3$. In some embodiments, materials of the photosensitive region 103 may or may not be identical to the materials of the device substrate 100.

Figure 27A:
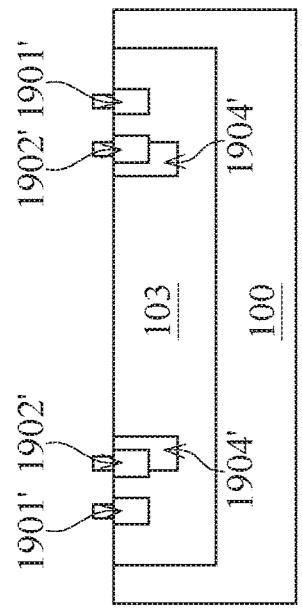
FIG. 27A to FIG. 27F illustrate cross sections of a photosensitive region of an optoelectronic device, according to some embodiments of the present disclosure.

In FIG. 27A, the photosensitive region 103 is embedded in the device substrate 100 and having a surface flush with the first surface 100A of the device substrate 100. In some embodiments, the second doped regions 1902' may possess an opposite doping polarity to the first doped regions 1901'. A width W103 of the photosensitive region 103 can be narrower than the width W1902' between the second doped regions 1902' surrounding the photosensitive region 103. Similarly, the width W103 shown in FIG. 27A is also narrower than the width W1902 between the carrier control terminals 1902 surrounding the photosensitive region 103. Referring back to the optoelectronic device 190 of FIG. 19, in some embodiments, the width W103 may be wider than the width W191A of the first region 191A.

Figure 27B:
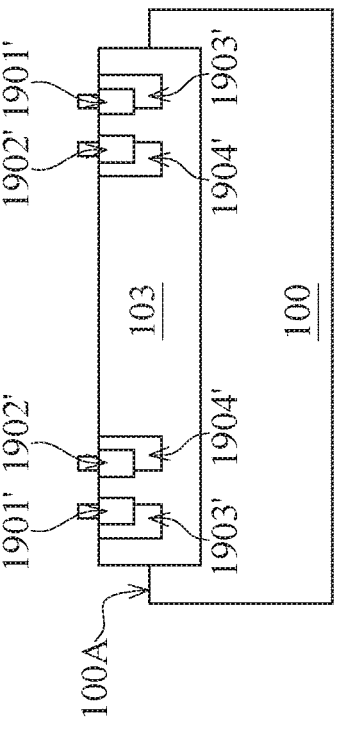

In FIG. 27B, the second doped regions 1902' is in the photosensitive region 103, or a sidewall boundary of the photosensitive region 103 is between the second doped regions 1902' and the first doped regions 1901'.

Figure 27C:
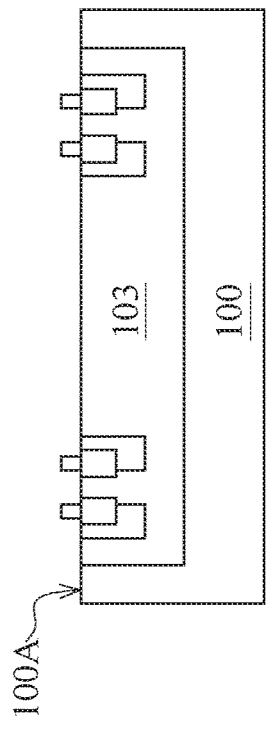

In FIG. 27C, the first doped regions 1901' and the second doped regions 1902' are in the photosensitive region 103. In addition, the photo sensing unit 1900 further includes third doped regions 1903' having an opposite doping polarity to the first doped region 1901'. The third doped regions 1903' partially surround the first doped regions 1901' in a one-to-one correspondence. In some embodiments, the third doped regions 1903' may entirely surround the first doped regions 1901' in a one-to-one correspondence. A peak dopant concentration in the third doped regions 1903' may be lower than a peak dopant concentration in the first doped regions 1901'. For example, the peak dopant concentration in the third doped regions 1903' may be no less than $1E^{16}/cm^3$. The third doped regions 1903' are configured to reduce dark current in the photosensitive region 103.

Figure 27D:
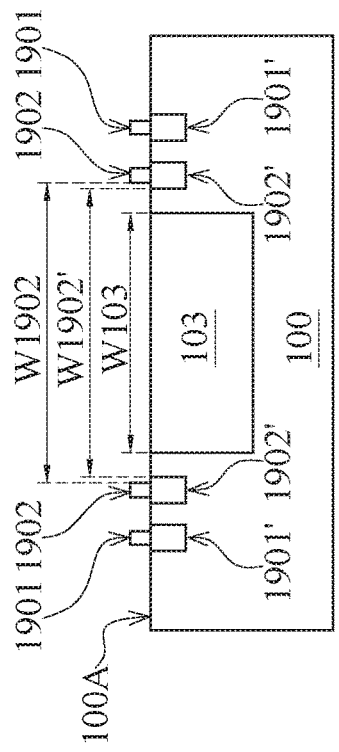

In FIG. 27D, the first doped regions 1901' and the second doped regions 1902' are in the photosensitive region 103. In addition, the photo sensing unit 1900 further includes fourth doped regions 1904' having an opposite doping polarity to the second doped regions 1902'. The fourth doped regions 1904' partially surround the second doped regions 1902' in a one-to-one correspondence. In some embodiments, the fourth doped region 1904' may entirely surround the second doped regions 1902' in a one-to-one correspondence. A peak dopant concentration in the fourth doped regions 1904' may be lower than a peak dopant concentration in the second doped regions 1902'. For example, the peak dopant concentration in the fourth doped regions 1904' may be in a range of from about $1E^{15}/cm^3$ to about $1E^{17}/cm^3$. The fourth doped regions 1904' are configured to reduce leakage current between the two second doped regions 1902'.

Figure 27E:
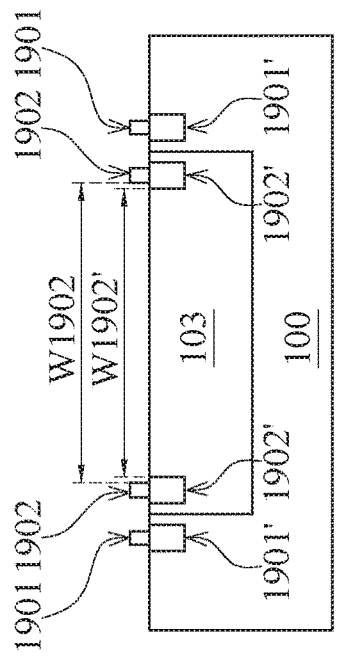

In FIG. 27E, the photosensitive region 103 is a mesa protruding from the first surface 100A of the device substrate 100. A portion of the photosensitive region 103 is embedded in the device substrate 100 whereas another portion of the photosensitive region 103 is protruded from the first surface 100A of the substrate. In FIG. 27E, the first doped regions 1901' and the second doped regions and 1902' are in the photosensitive region 103. In addition, third doped regions 1903' having an opposite doping polarity to the first doped region 1901' and fourth doped region 1904' having an opposite doping polarity to the second doped region 1902' partially surround the first doped region 1901' and the second doped region 1902' in a one-to-one correspondence. In some embodiments, the third doped regions 1903' and the fourth doped regions 1904' may entirely surround the first doped regions 1901' and the second doped regions 1902' in a one-to-one correspondence.

Figure 27F:
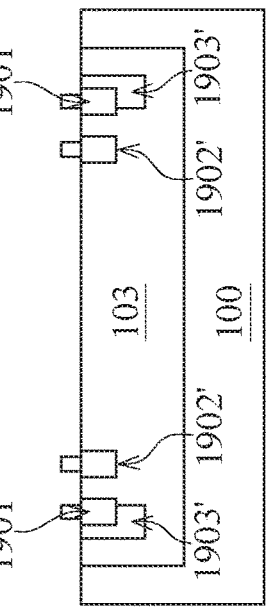

FIG. 27F is similar to the structure described in FIG. 27E with a difference including a surface of the photosensitive region 103 is flush with the first surface 100A of the substrate.

In some embodiments, the photo sensing unit 1900 is an indirect time-of-flight based depth image sensor capable of detecting a distance information with the targeted object.

In some applications, the photo sensing unit, the optoelectronic device, or the optoelectronic device array is applicable to robotics, navigation system or virtual reality.

Other structures associated with the photo sensing unit 1900 are described in previously filed U.S. patent application Ser. No. 15/908,447, and are encompassed within the scope of present disclosure. The disclosure of which is incorporated herein in its entirety by reference.

The following structures provided in FIG. 28 to FIG. 37E may increase the effective optical detecting area by incorporating a waveguide structure configured to direct a greater portion of optical signal to a photosensitive region.

Figure 28:
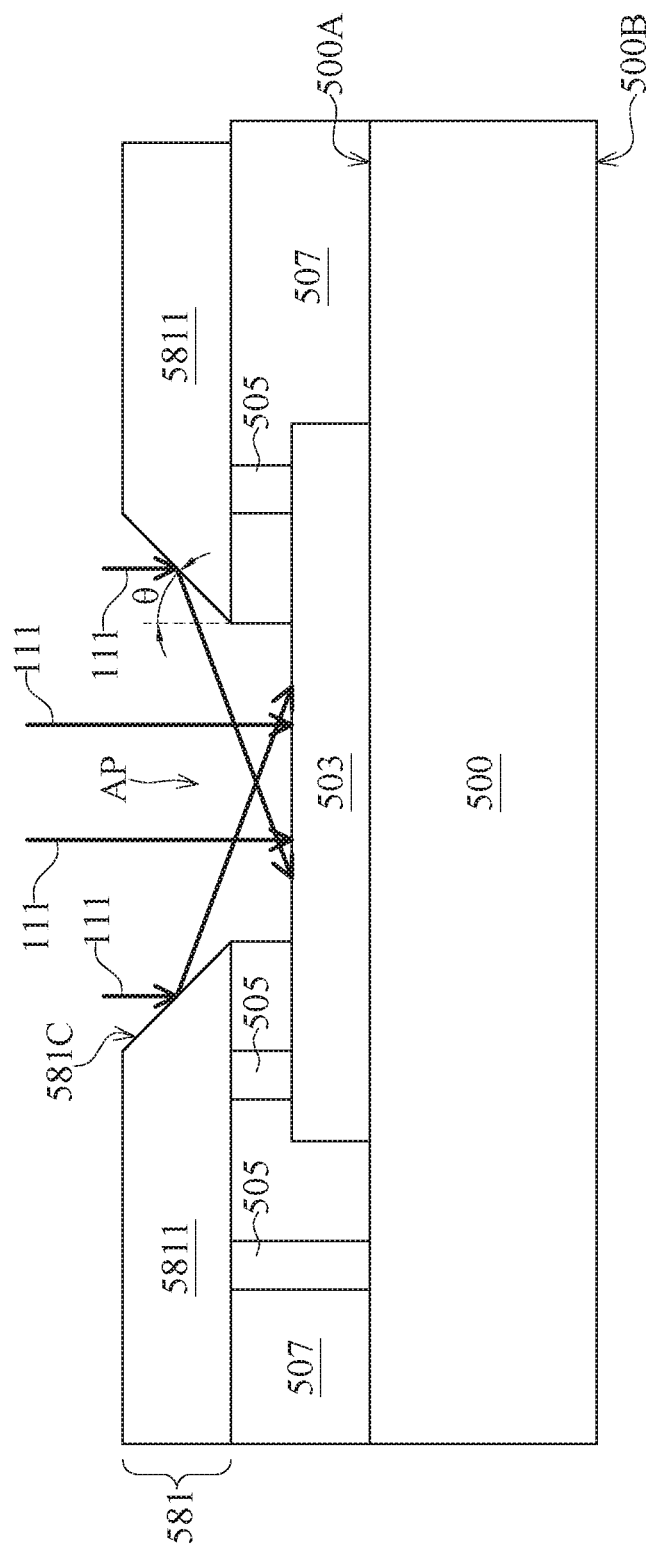
FIG. 28 illustrates a cross section of an optoelectronic device having a waveguide structure, according to some embodiments of the present disclosure.

FIG. 28 illustrates a cross section of an optoelectronic device 280 having a waveguide structure 581, according to some embodiments of the present disclosure. The optoelectronic device 280 includes a device substrate 500, a photosensitive region 503 adjacent to the device substrate 500, and a waveguide structure 581 over the device substrate 500 and the photosensitive region 503. The device substrate 500 may be similar to the device substrate 100 as discussed in FIG. 1, wherein the device substrate 500 includes a front surface 500A and a back surface 500B opposite to the front surface 500A. The photosensitive region 503 is closer to the front surface 500A than to the back surface 500B of the device substrate 500. In some embodiments, the front surface 500A is between the photosensitive region 503 and the back surface 500B. In some embodiments, the waveguide structure 581 and the photosensitive region 503 is at the same side of the device substrate 500.

In some embodiments, the optoelectronic device 280 further includes a first contact region (not shown) and a second contact region (not shown) as described in FIG. 1. In some embodiments, the optoelectronic device 280 further includes electrical connections 505 electrically coupled to the photosensitive region 103 by electrically coupled to the first contact region and the second contact region. The electrical connections 505 are configured to transmit electronic signals generated in the photosensitive region 503. Generally speaking, the photosensitive region 503 may be similar to the photosensitive region 103 as discussed in FIG. 1 and is not repeated here for brevity. The photosensitive region 503 receives an optical signal 111 and converts the optical signal 111 into electrical signals. The photosensitive region 503 is selected to have a high absorption coefficient at the desired wavelength range. In some implementations, photosensitive region 503 may be composed of or include materials other than GeSi, for example, Si, Ge, GeSn, and combinations thereof. In some other implementations, for near infrared (NIR) wavelengths, the photosensitive region 503 may be a GeSi mesa, where the GeSi absorbs photons in the optical signal and generates electron-hole pairs. The photosensitive region 503 and the electrical connections 505 may be laterally surrounded by a dielectric layer 507. In some embodiments, the optical signal 111 is incident on a top surface of the photosensitive region 503 without propagating through the device substrate 500.

A waveguide structure 581 is disposed above a top surface of the dielectric layer 507 and/or above a top surface of the electrical connections 505. In some embodiments, the waveguide structure 581 includes a reflective layer 5811 configured to reflect the optical signal 111 to a top surface of the photosensitive region 503. In some embodiments, the reflective layer 5811 includes a material having a reflectivity higher than 85%, or higher than 90%, or higher than 95%, at the wavelength of the optical signal 11. In some embodiments, the reflective layer 5811 includes metal, such as aluminum, copper, or the like. In some embodiments, the reflective layer 5811 may be a portion of a conductive layer for electrically coupled to the electrical connections 505. In some embodiments, the reflective layer 5811 has a thickness not less than 0.5 μm. In some embodiments, the thickness of the waveguide structure 581 is more than 5 μm.

The waveguide structure 581 includes a channel AP penetrating through the reflective layer 5811 for allowing at least a portion of the optical signal 111 to transmit to the photosensitive region 503 below. In some embodiments, a hole penetrates through the dielectric layer 507 and communicates with the channel AP so as to expose a top surface of the photosensitive region 503. In some embodiments, the waveguide structure 581 includes an inclined sidewall 581C surrounding the channel AP. In some embodiments, the inclined sidewall 581C can be a surface inclining from a normal vector of the front surface 500A of the device substrate 500. In some embodiments, the inclined sidewall 581C can be a substantially planar surface, forming an angle θ between itself and a normal vector of the front surface 500A of the device substrate 500. In some embodiments, the angle θ can be in a range of from greater than 0° to about 60°. In some embodiment, $10° \leq \theta \leq 50°$. In some embodiment, $30° \leq \theta \leq 45°$. When the angle θ is in the range of from greater than 0° to about 60°, an absorbing efficiency can be increased and a window of an effective optical detection can be expanded. When the angle θ is in the range of from about 10° to about 50°, an absorbing efficiency can be further increased. The optoelectronic device 280 may be operated at a higher speed and higher bandwidth (not less than 25 GHz, such as 40 GHz) while avoiding substantially losing high responsibility. In some embodiments, the inclined sidewall 581C of the waveguide structure 581 can be formed by etching a conductive layer electrically coupled to the electrical connections 505, and thus the waveguide structure 581 can be capable of directing a greater portion of optical signal to the photosensitive region 503 below and electrically coupled to the electrical connections 505 at the same time.

Figure 29:
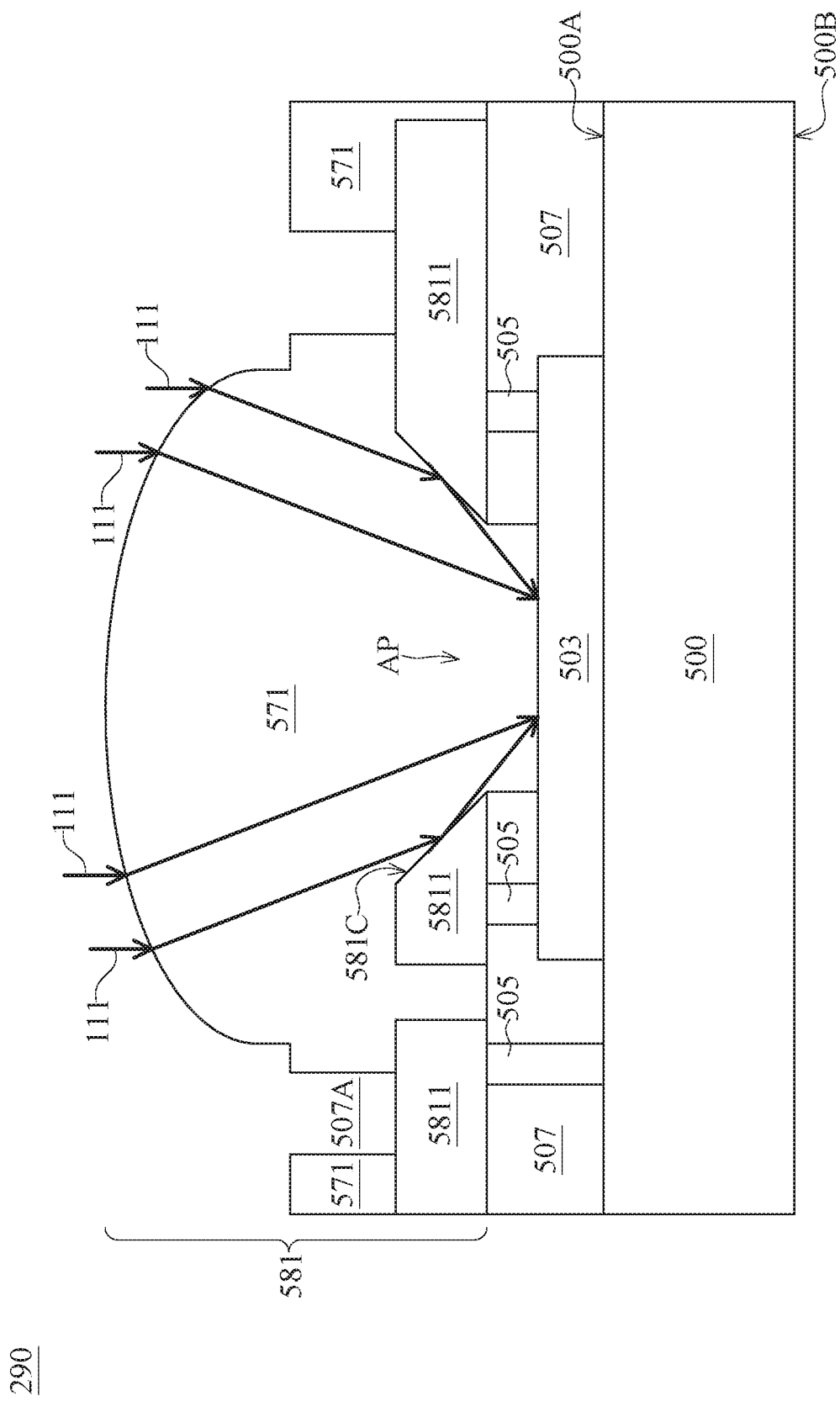
FIG. 29 illustrates a cross section of an optoelectronic device having a waveguide structure, according to some embodiments of the present disclosure.

FIG. 29 illustrates a cross section of an optoelectronic device 290 having a waveguide structure, according to some embodiments of the present disclosure. The optoelectronic device 290 is similar to the optoelectronic device 280, except the waveguide structure 581 further includes an optical element 571 disposed above the reflective layer 5811, the dielectric layer 507, and the top surface of the photosensitive region 503 exposed from the dielectric layer 507. In some embodiments, a part of the optical element 571 is in the channel AP. The optical element 571 can be used as a lens configured to focus incident optical signal 111 from various directions toward the sensing aperture of the photosensitive region 503. In some embodiments, the optical element 571 may include a convex surface, or other suitable shape that enables to focus incident optical signal 110 from various directions toward the channel AP of the photosensitive region 503. The optical element 571 may include any suitable material such as polymer. Openings 507A may be formed in the optical element 571, allowing electrical signal generated by the photosensitive region 503 to be accessed.

Figure 30:
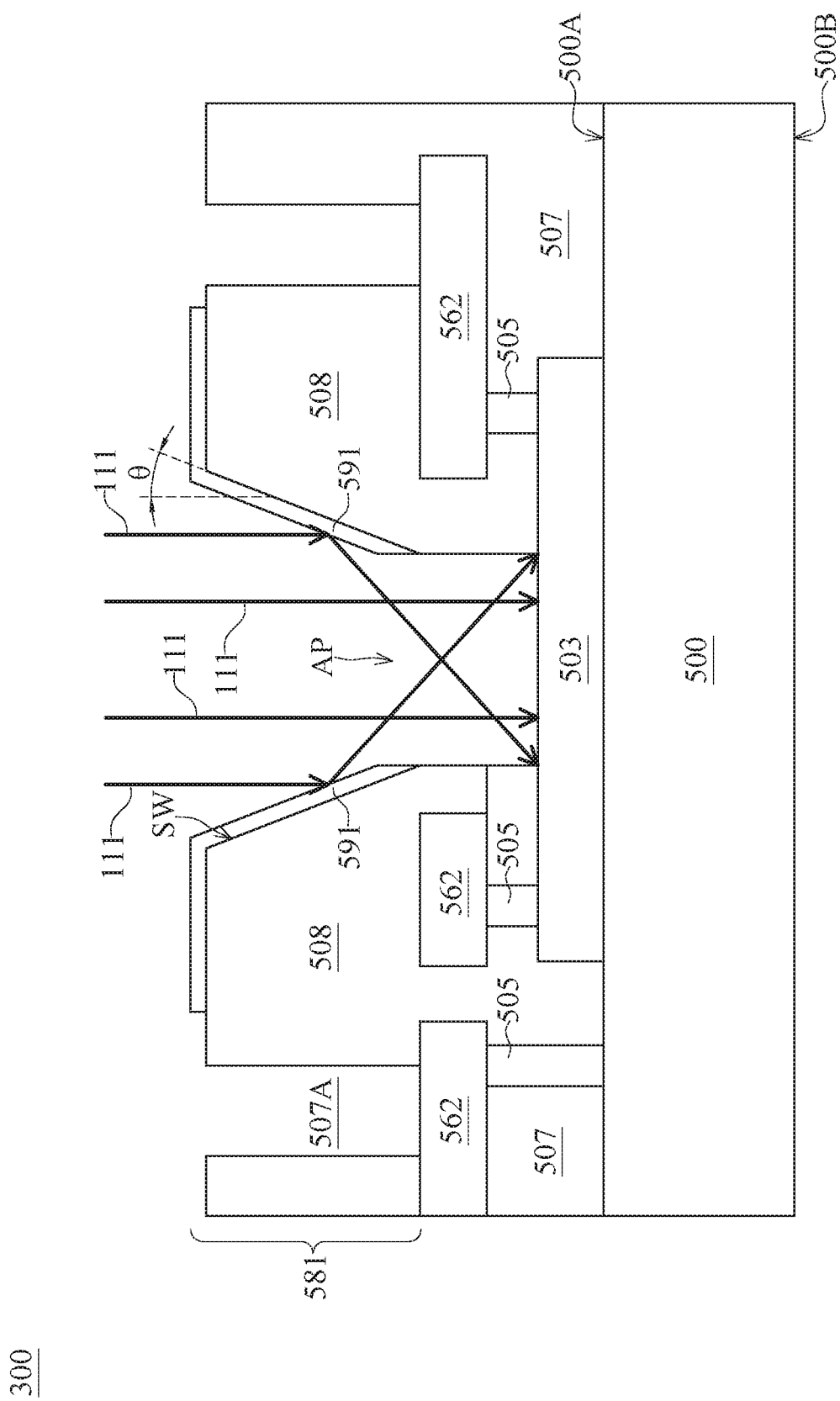
FIG. 30 illustrates a cross section of an optoelectronic device having a waveguide structure, according to some embodiments of the present disclosure.

FIG. 30 illustrates a cross section of an optoelectronic device 300 having a waveguide structure, according to some embodiments of the present disclosure. The device substrate 500, the photosensitive region 503 and the electrical connections 505 of the optoelectronic device 300 are similar to the counterparts in FIG. 28. The optoelectronic device 300 includes a conductive layer 562 disposed above the electrical connections 505. The conductive layer 562 may be a conductive layer for electrically coupled to the electrical connections 505, and the conductive layer 562 may be composed of or include any suitable material, for example, metal, such as aluminum, copper, or the like. The waveguide structure 581 includes a base portion 508 above the electrical connections 505 and the dielectric layer 507. In some embodiments, the base portion 508 includes a dielectric material such as Si, $SiO_2$, $Si_3N_4$, or any combination thereof. In some embodiments, the base portion 508 includes a material the same as the material of the dielectric layer 507. A top surface of base portion 508 is above a top surface of the conductive layer 562, and the base portion 508 laterally surrounds the conductive layer 562. The base portion 508 includes a channel AP for allowing at least a portion of the optical signal 111 to transmit to the photosensitive region 503 below. In some embodiments, a hole penetrates through the dielectric layer 507 and communicates with the channel AP so as to expose a top surface of the photosensitive region 503. The base portion 508 includes an inclined sidewall SW inclining with respect to a normal vector of the front surface 500A of the device substrate 500. In some embodiments, the base portion 508 includes a thickness not less than 5 μm. In some embodiments, the thickness of the base portion 508 is not more than 100 μm. In some embodiments, the thickness of the base portion 508 is not more than 50 μm. In some embodiments, the inclined sidewall SW surrounds the channel AP. In some embodiments, the inclined sidewall SW can be a substantially planar surface having an angle θ between itself and a normal vector of the front surface 500A of the device substrate 500. Similar to the discussion in FIG. 28, in some embodiments, the angle θ can be in a range of from greater than 0° to about 60°. =In some embodiment, 10°≤θ≤50°. In some embodiment, 30°≤θ≤45°. The waveguide structure 581 further includes a reflective layer 591 conformably disposed on the inclined sidewall SW of the base portion 508. In some embodiments, the reflective layer 591 may optionally include an extension portion above the top surface of the base portion 508. In some embodiments, a portion of the reflective layer 591 disposed on the inclined sidewall SW can include a substantially planar surface having an angle θ between itself and a normal vector of the front surface 500A of the device substrate 500. Similar to the discussion in FIG. 28, in some embodiments, the angle θ can be in a range of from greater than 0° to about 60°. In some embodiment, 10°≤θ≤50°. In some embodiment, 30°≤θ≤45°. In some embodiments, a material of the reflective layer 591 may include aluminum, copper, or the like. In some embodiments, the reflective layer 591 has a thickness not less than 0.5 µm. In some embodiments, the thickness of the waveguide structure 581 is more than 5 µm. In some embodiments, openings 507A may be formed in the base portion 508, allowing electrical signal generated by the photosensitive region 503 to be accessed.

Figure 30A:
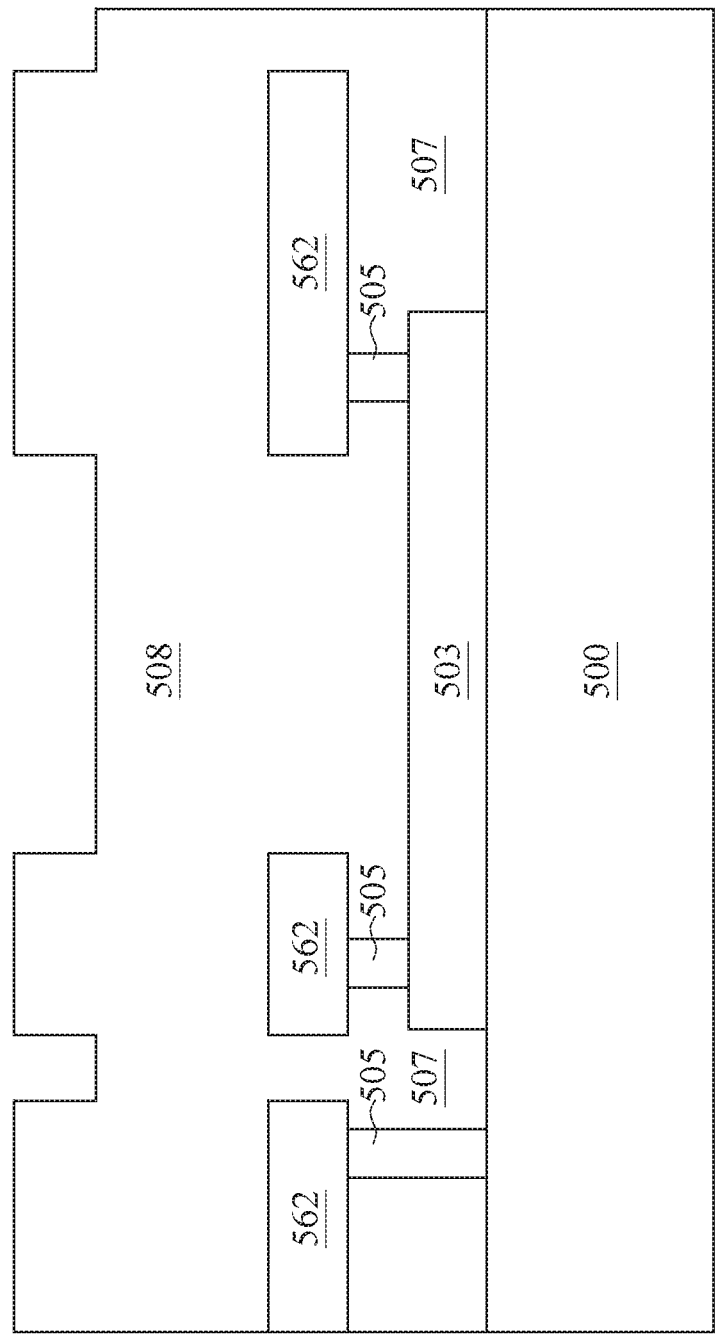
FIG. 30A to FIG. 30E illustrate cross sections of the optoelectronic device of FIG. 30 during various manufacturing operations, according to some embodiments of the present disclosure.

FIG. 30A to FIG. 30E illustrate cross sections of the optoelectronic device 300 of FIG. 30 during various manufacturing operations in a manufacturing method, according to some embodiments of the present disclosure. Referring to FIG. 30A, the method includes forming the photosensitive region 503 above the device substrate 500, forming the dielectric layer 507 surrounding the photosensitive region 503, forming the electrical connections 505 in the dielectric layer 507, forming the conductive layer 562 on the electrical connections 505 and forming the waveguide structure 581 above the photosensitive region 503. The step of forming the waveguide structure 581 further includes forming the base portion 508 above the electrical connections 505 and the dielectric layer 507. In some embodiments, the base portion 508 includes a material the same as the material of the dielectric layer 507. The electrical connections 505 are configured to transmit electronic signals generated in the photosensitive region 503 and electrically coupled the photosensitive region 503. The conductive layer 562, for example, aluminum, is patterned and electrically connected to one or more of the electrical connections 505. The dielectric layer 507 is formed above the device substrate 500 to surround the photosensitive region 503 and the electrical connections 505. In some embodiments, the base portion 508 surrounds the conductive layer 562 and is in direct contact with the dielectric layer 507. A top surface of the base portion 508 is above each of the top surface of the photosensitive region 503, the electrical connections 505 and the conductive layer 562. In some embodiments, a top surface of the base portion 508 may have a surface profile similar to the pattern of the conductive layer 562.

Figure 30B:
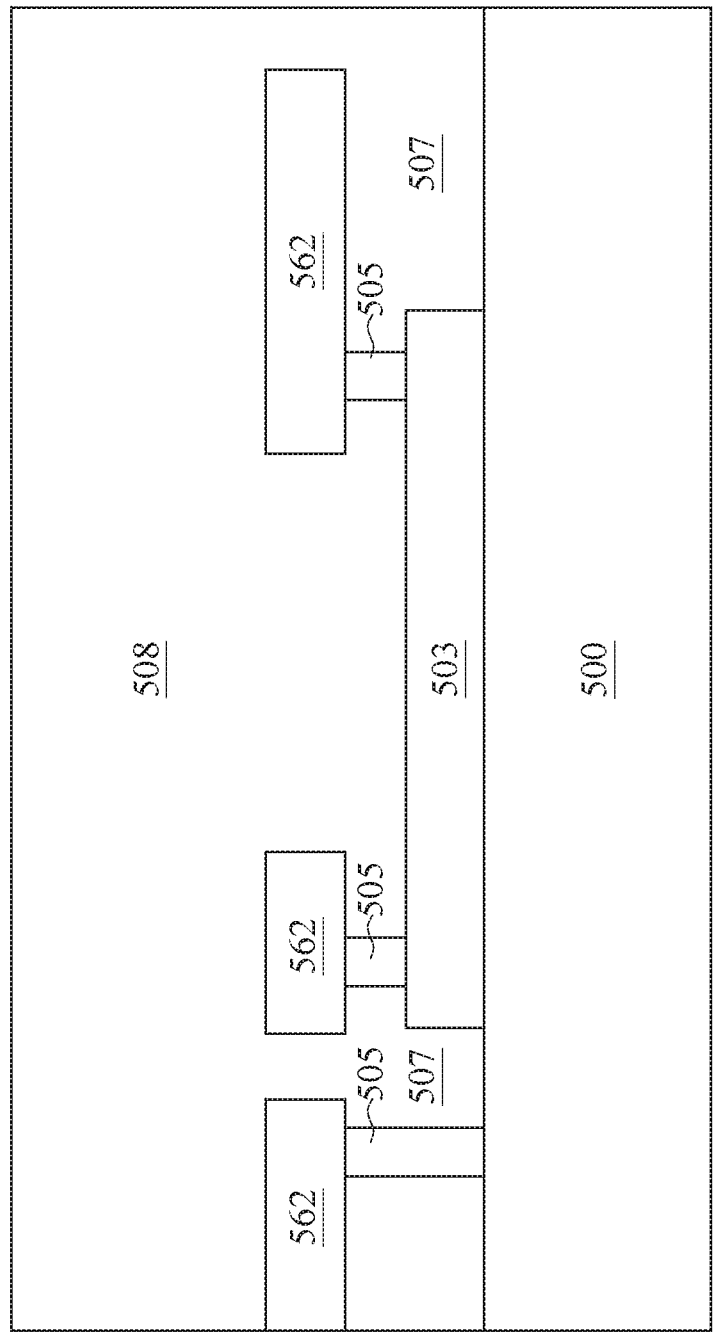

Referring to FIG. 30B, the step of forming the waveguide structure 581 further includes a planarization operation, for example, a chemical mechanical planarization operation, can be performed on the top surface of the base portion 508.

Figure 30C:
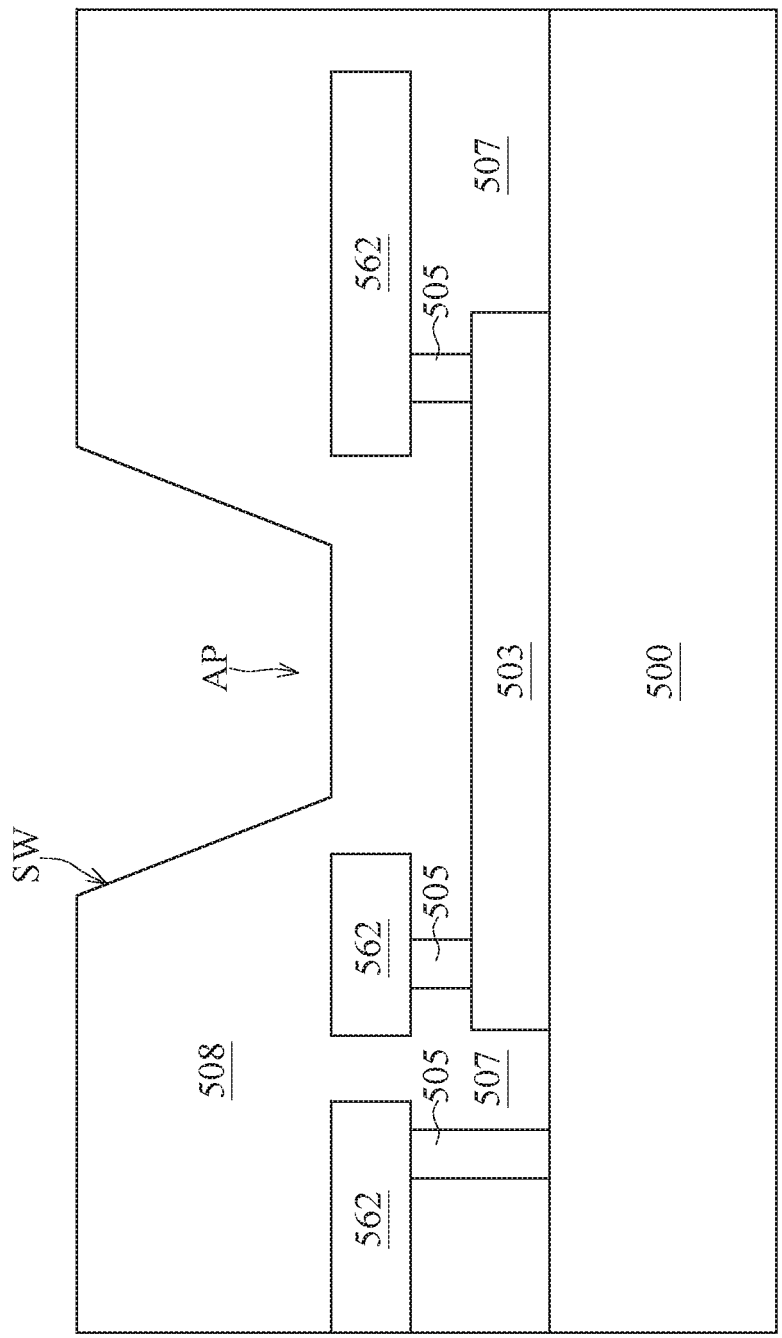

Referring to FIG. 30C, the step of forming the waveguide structure 581 further includes removing a portion of the base portion 508 to form a channel tapering toward the device substrate 500. The removal operation may include dry etching, wet etching, or other suitable operations for removing material of the base portion 508 and forming an inclined sidewall SW.

Figure 30D:
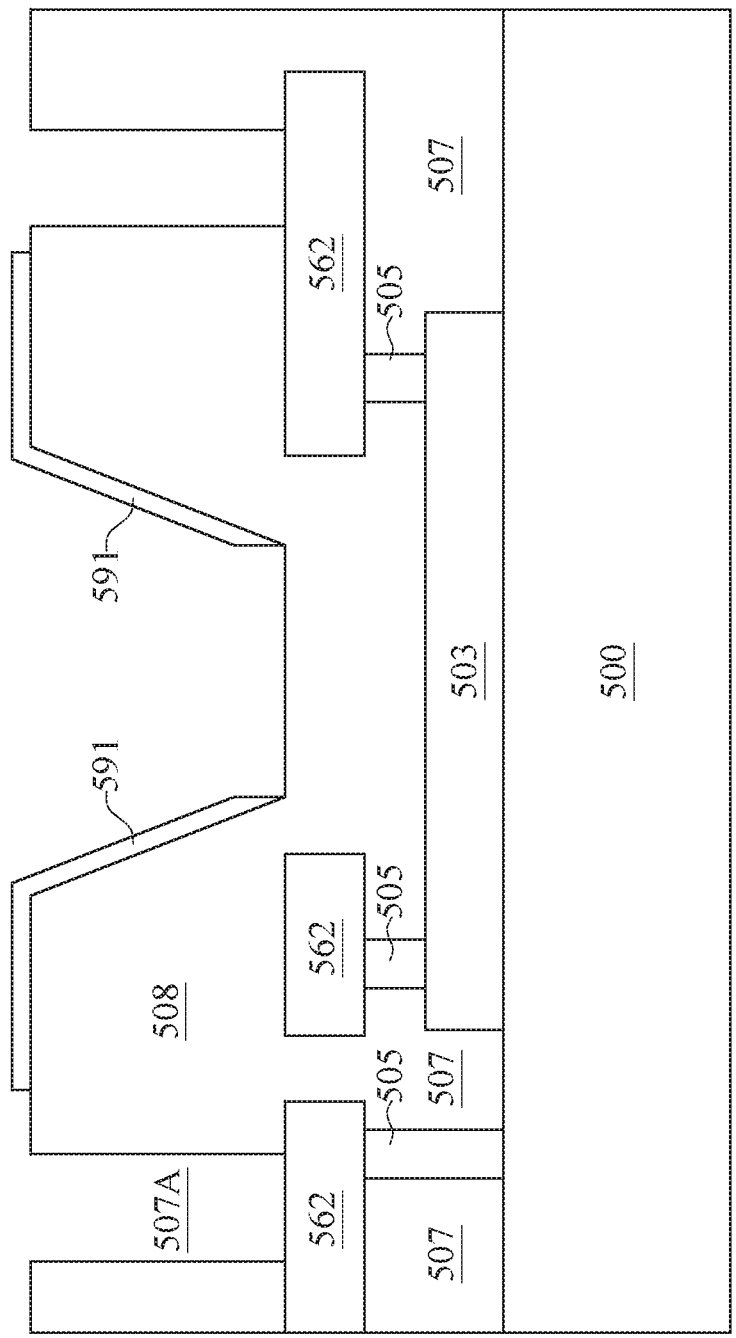

Referring to FIG. 30D, the step of forming the waveguide structure 581 further includes forming the reflective layer 591 on the inclined sidewall SW surrounding the channel of the base portion 508. Optionally, the reflective layer 591 may further be formed above a top surface of the base portion 508.

Figure 30E:
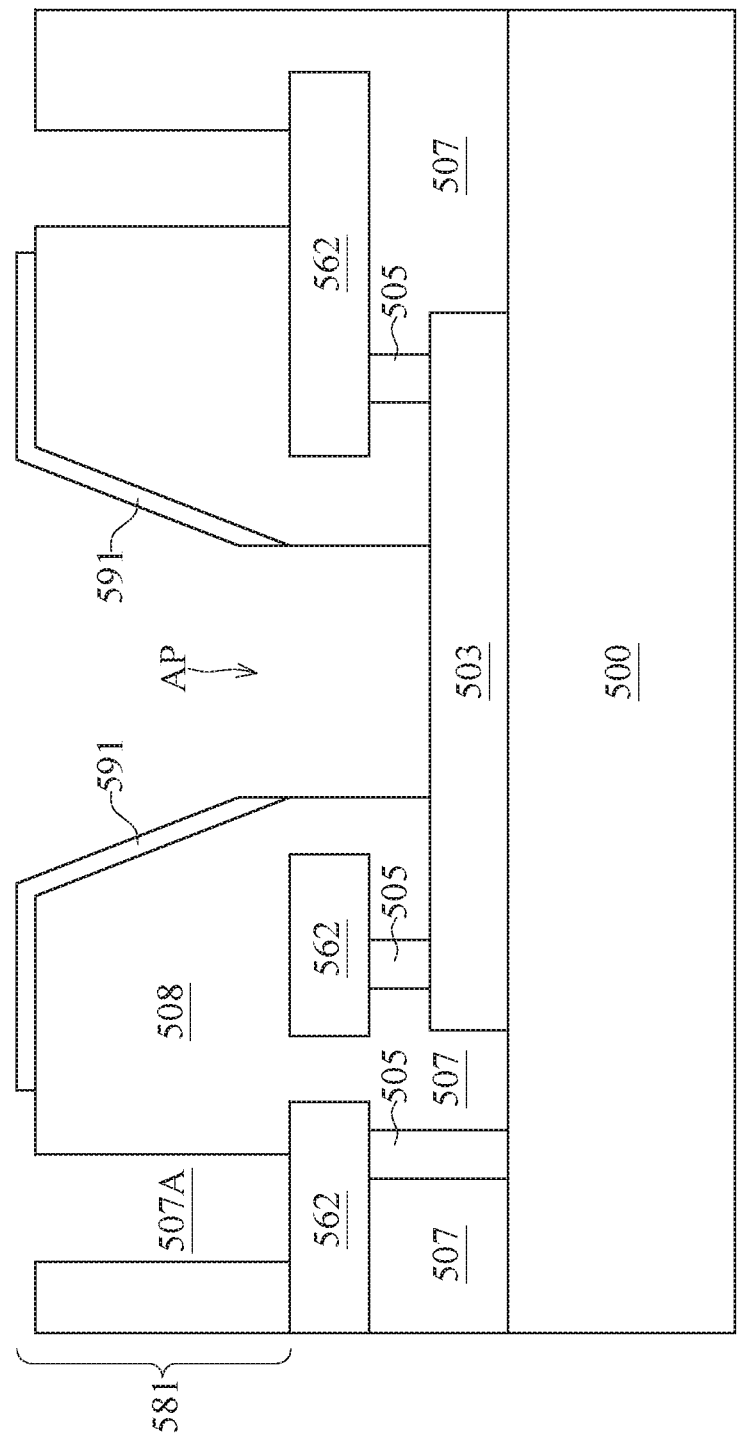

Referring to FIG. 30E, the manufacturing method further including a step of exposing a top surface of the photosensitive region 503 from the dielectric layer 507 by removing a portion of the dielectric layer 507 to form the hole penetrating the dielectric layer 507. The hole communicates with the channel AP.

Figure 31:
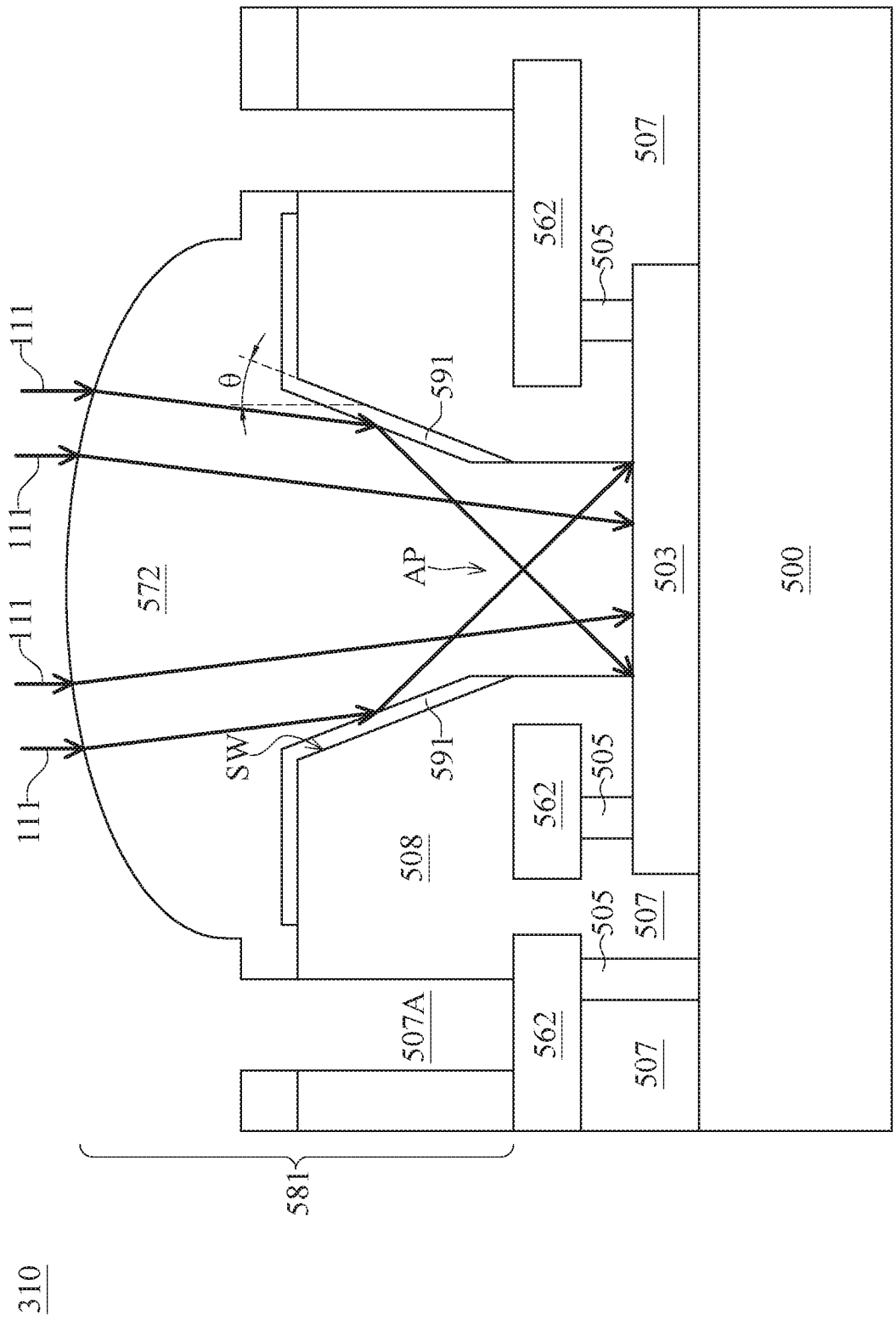
FIG. 31 illustrates a cross section of an optoelectronic device having a waveguide structure, according to some embodiments of the present disclosure.

FIG. 31 illustrates a cross section of an optoelectronic device 310 having a waveguide structure, according to some embodiments of the present disclosure. The optoelectronic device 310 is similar to the optoelectronic device 300, except that the waveguide structure 581 further includes an optical element 572 disposed above the reflective layer 591, the base portion 508, and the top surface of the photosensitive region 503 exposed from the dielectric layer 507. The optical element 572 can be used as a lens configured to focus incident optical signal from various directions toward the channel AP of the waveguide 581 where the sensing aperture of the photosensitive region 503 lies below. Openings 507A may be formed in the base portion 508 and the optical element 572, allowing electrical signal generated by the photosensitive region 503 to be accessed.

Figure 32:
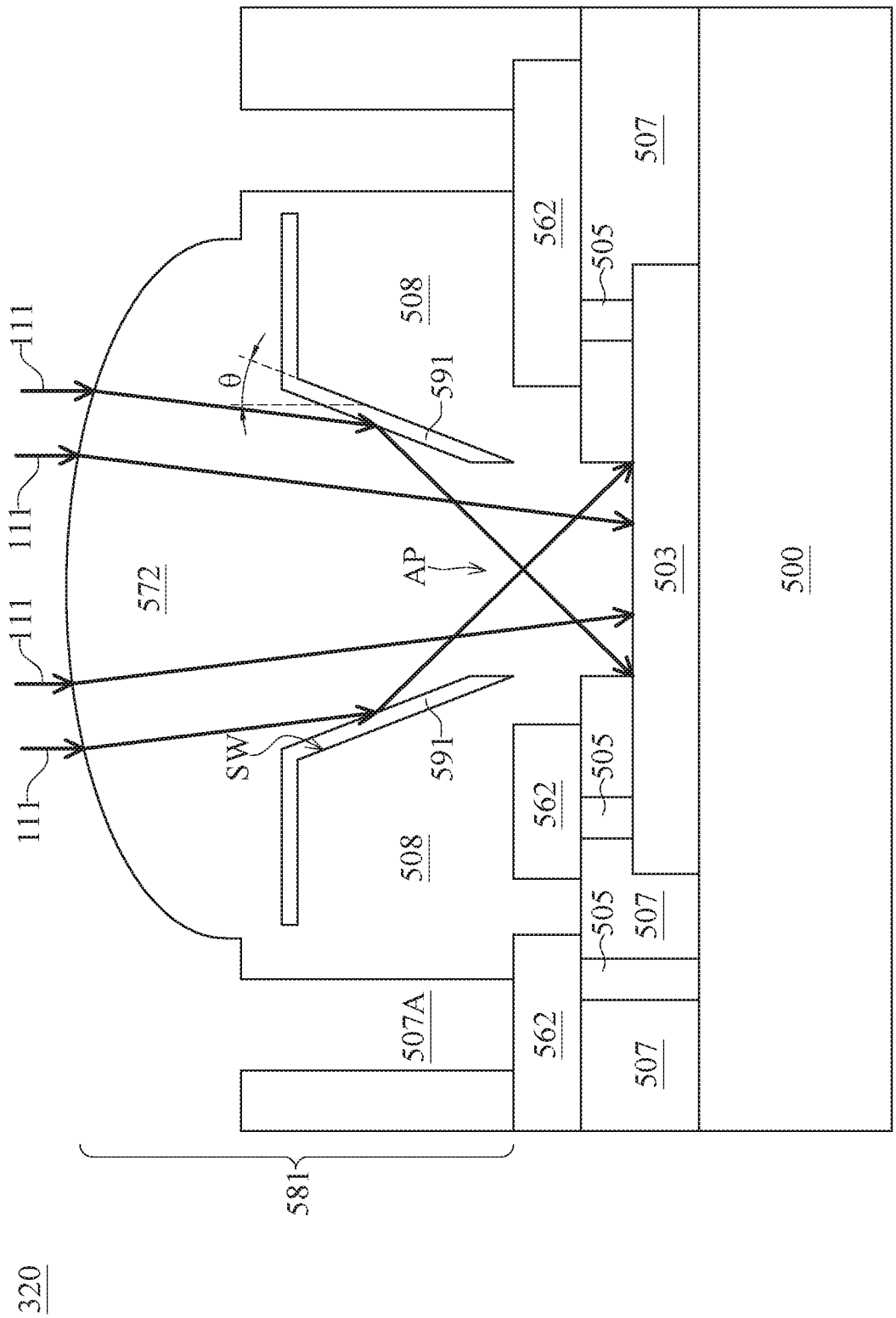
FIG. 32 illustrates a cross section of an optoelectronic device having a waveguide structure, according to some embodiments of the present disclosure.

FIG. 32 illustrates a cross section of an optoelectronic device 320 having a waveguide structure 581, according to some embodiments of the present disclosure. The optoelectronic device 320 is similar to the optoelectronic device 310 except that the base portion 508 includes a material the same as the material of the optical element 572. Openings 507A may be formed in the base portion 508, allowing electrical signal generated by the photosensitive region 503 to be accessed.

Figure 32A:
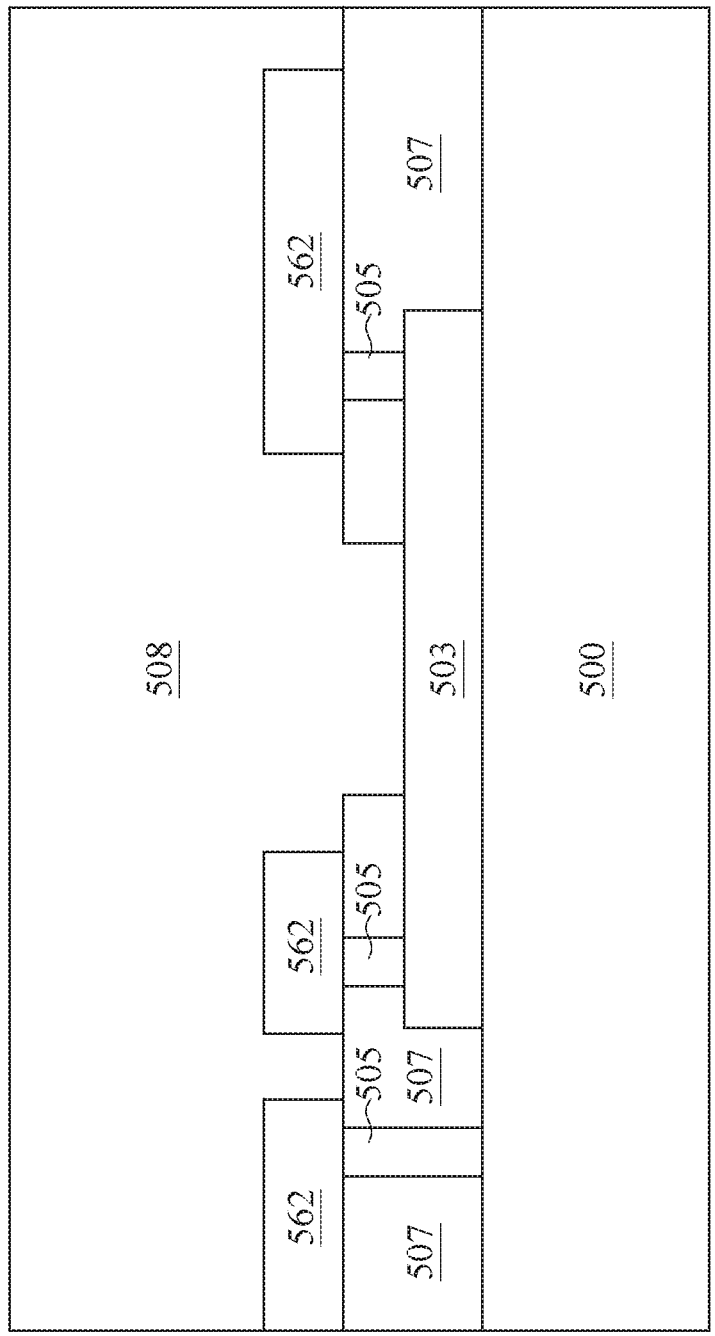
FIG. 32A to FIG. 32D illustrate cross sections of the optoelectronic device of FIG. 32 during various manufacturing operations, according to some embodiments of the present disclosure.

FIG. 32A to FIG. 32D illustrate cross sections of the optoelectronic device 320 of FIG. 32 during various manufacturing operations in a manufacturing method, according to some embodiments of the present disclosure. Referring to FIG. 32A, the method includes forming the photosensitive region 503 above the device substrate 500, forming the dielectric layer 507 surrounding the photosensitive region 503, forming the electrical connections 505 in the dielectric layer 507, forming the conductive layer 562 on the electrical connections 505 and forming the waveguide structure 581 above the photosensitive region 503. The step of forming the waveguide structure 581 further includes forming the base portion 508 above the electrical connections 505 and the dielectric layer 507. The electrical connections 505 are configured to transmit electronic signals generated in the photosensitive region 503 and electrically coupled to the photosensitive region 503. The dielectric layer 507 is formed above the device substrate 500 to surround the photosensitive region 503 and the electrical connections 505. The conductive layer 562 is formed above the dielectric layer 507 and electrically connected to one or more of the electrical connections 505. A portion of the top surface of the photosensitive region 503 is exposed from the dielectric layer 507. The base portion 508 is formed, for example, by a spin-on coating operation, above the dielectric layer 507, the photosensitive region 503 and the conductive layer 562. In some embodiments, the material of the base portion 508 is different from the material of the dielectric layer 507.

Figure 32B:
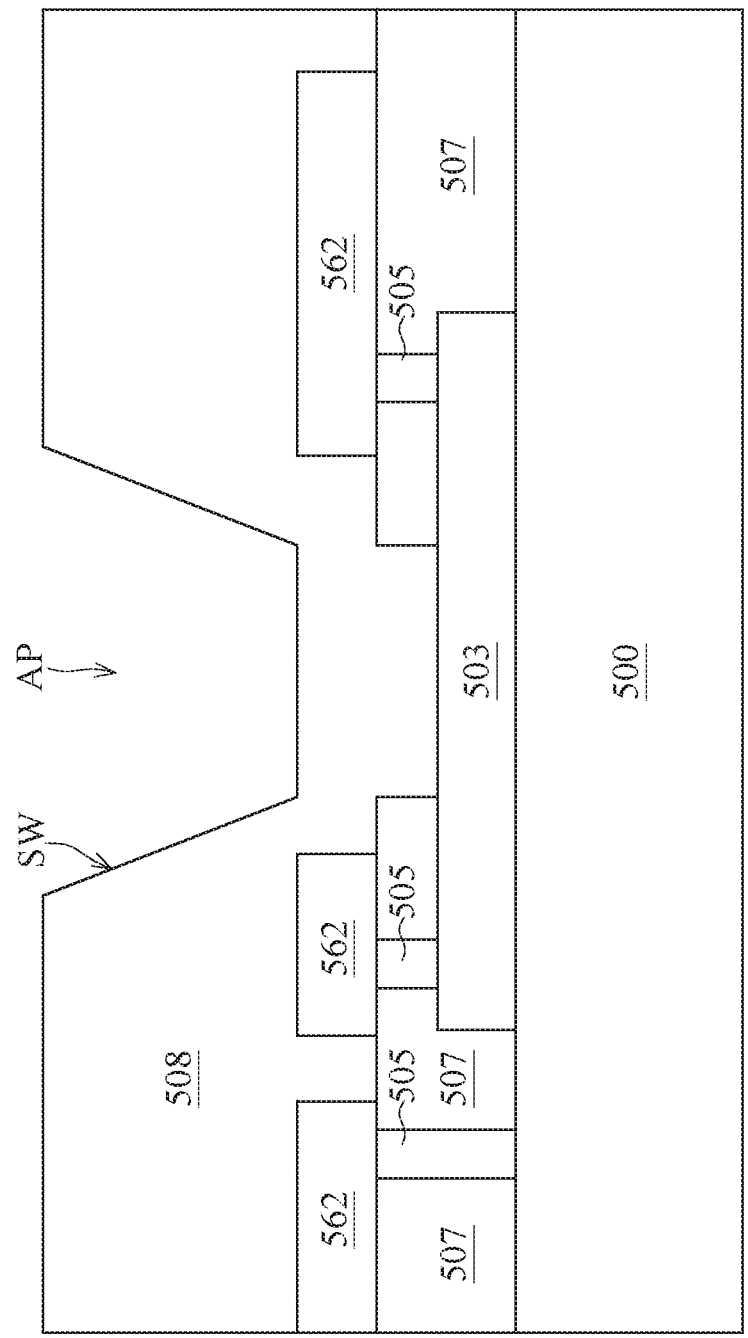

Referring to FIG. 32B, the method further includes removing a portion of the base portion 508 to form a channel AP tapering toward the device substrate 500. The removal operation may include dry etching, wet etching, or other suitable operations for removing a portion of the base portion 508 and forming an inclined sidewall SW.

Figure 32C:
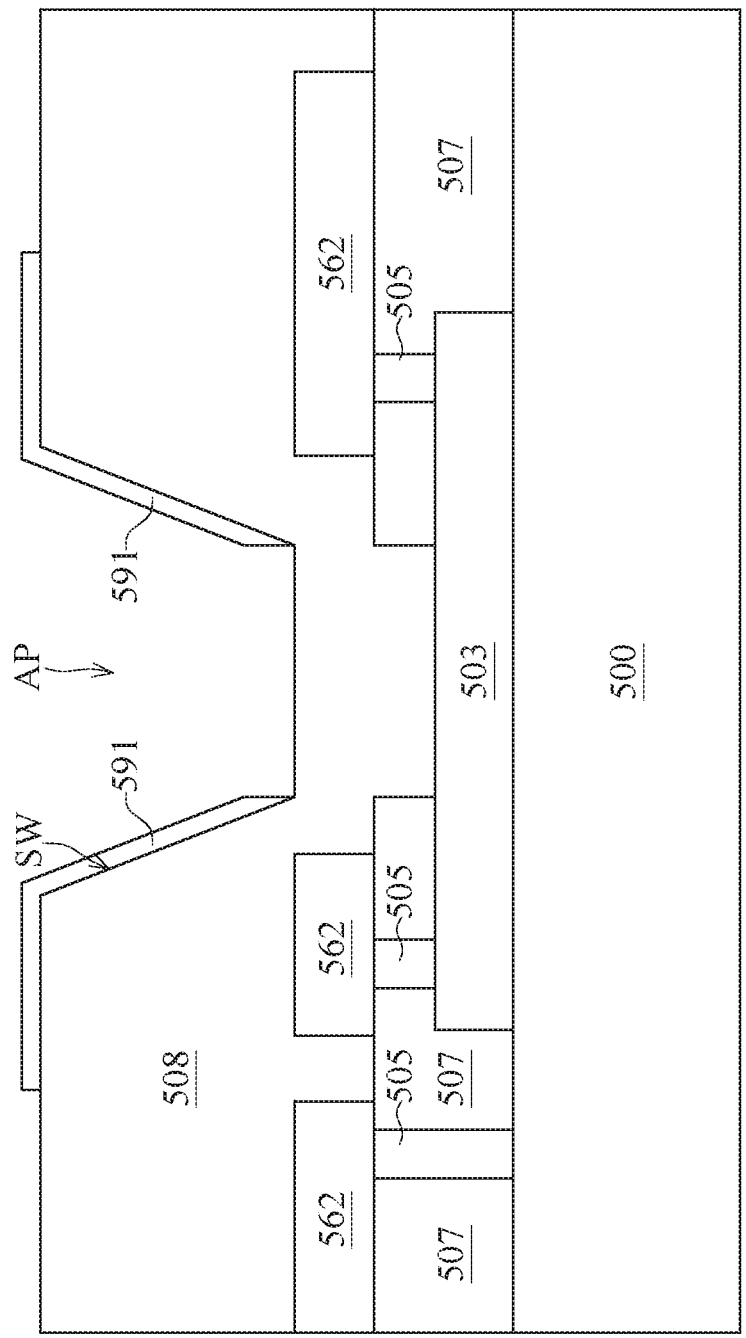

Referring to FIG. 32C, the method further includes forming the reflective layer 591 on the inclined sidewall SW of the base portion 508. Optionally, a part of the reflective layer 591 may further be formed above a top surface of the base portion 508.

Figure 32D:
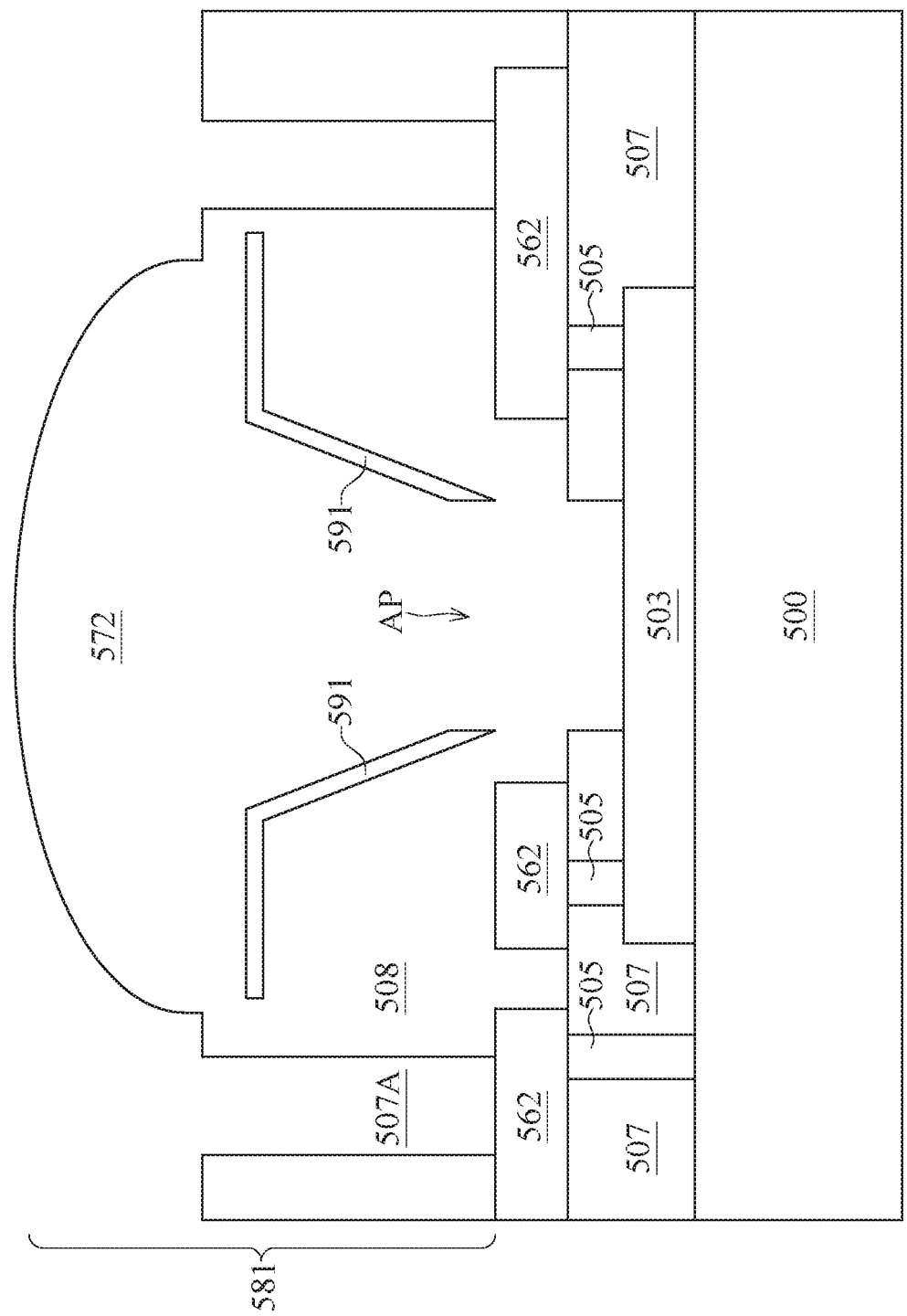

Referring to FIG. 32D, the method further includes forming an optical element 572 covering the reflective layer 591. Generally speaking, the optical element 572 formed above the reflective layer 591 can include an optical lens. In some embodiments, the optical element 572 formed above the reflective layer 591 may include a convex surface, or other suitable shape that enables to focus incident optical signal from various directions toward the sensing aperture of the photosensitive region 503. In some embodiments, the material of the optical element 572 is the same as the material of the base portion 508.

Figure 33:
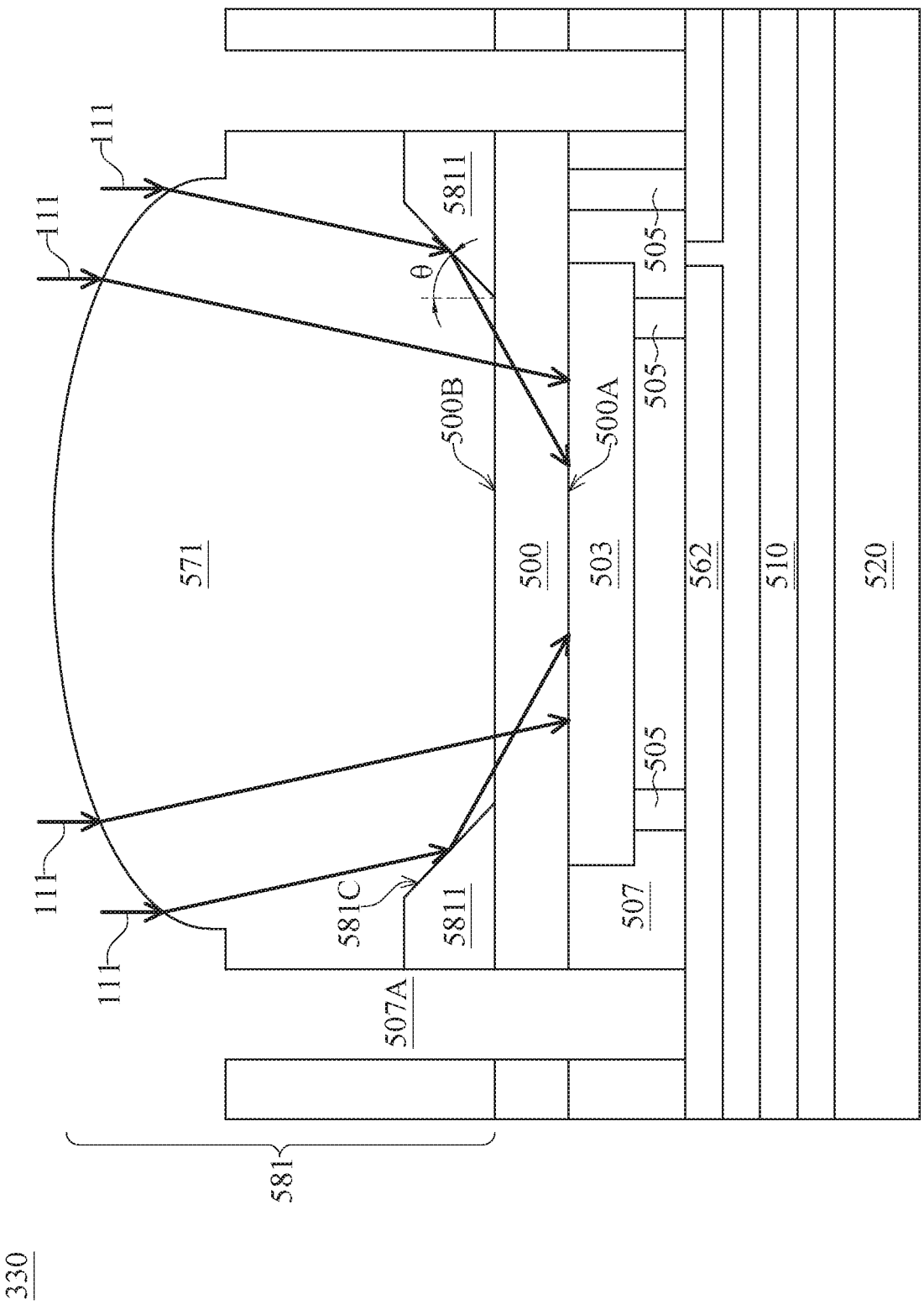
FIG. 33 illustrates a cross section of an optoelectronic device having a waveguide structure, according to some embodiments of the present disclosure.

FIG. 33 illustrates a cross section of an optoelectronic device 330 having a waveguide structure, according to some embodiments of the present disclosure. The optoelectronic device 330 is similar to the optoelectronic device 290 except that the same waveguide structure 581 is closer to a back surface 500B than a front surface 500A of the device substrate 500, wherein the back surface 500B is opposite to the front surface 500A. In some embodiments, the waveguide structure 581 and the photosensitive region 503 are at the opposite sides of the device substrate 500. In some embodiments, the device substrate 500 is between the waveguide structure 581 and the photosensitive region 503. In some embodiments, the optical signal 111 is incident on a surface of the photosensitive region 103 after propagating through the device substrate 500. In some embodiments, the material of the device substrate 500 has an absorption coefficient less than, for example, 10 times less than, 100 times less than or 1000 times less than the absorption coefficient of the material of the photosensitive region 503 at the wavelength of the optical signal 111. In some embodiments, the material of the optical element 571 of the waveguide structure 581 is different from the material of the device substrate 500. A handling substrate 520 can be further bonded over a conductive layer 562 or a conductive trace layer at the front surface 500A of the device substrate 500. In some embodiment, a bonding layer 510 is formed between the conductive layer 562 and the handling substrate 520 for connecting the conductive layer 562 with the handling substrate 520. Openings 507A may be formed from the back side 500B and penetrate at least through the device substrate 500 and the dielectric layer 507 to expose a portion of the conductive layer 562, allowing electrical signal generated by the photosensitive region 503 to be accessed.

Figure 34:
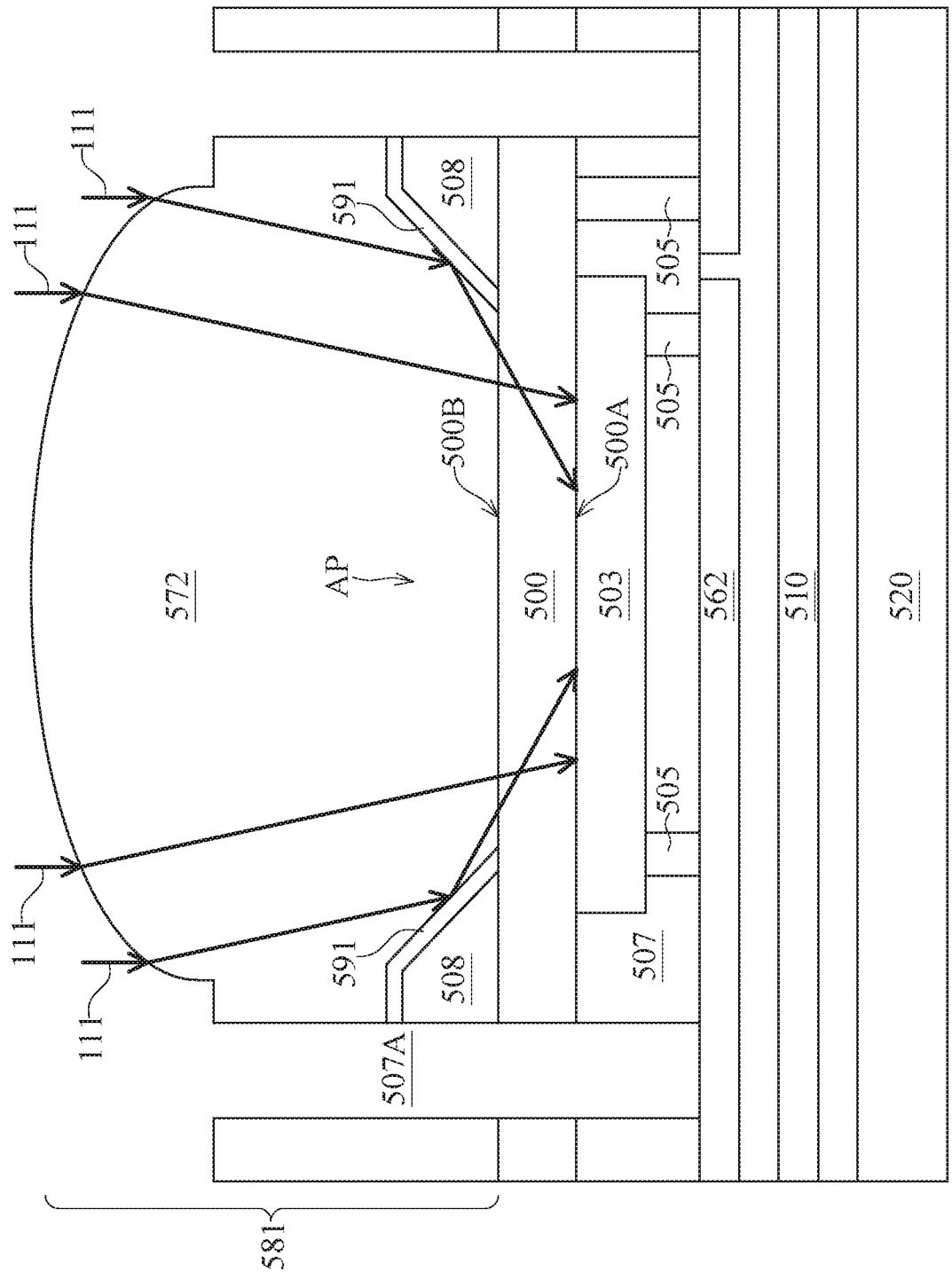
FIG. 34 illustrates a cross section of an optoelectronic device having a waveguide structure, according to some embodiments of the present disclosure.

FIG. 34 illustrates a cross section of an optoelectronic device 340 having a waveguide structure, according to some embodiments of the present disclosure. The optoelectronic device 340 is similar to the optoelectronic device 320 except that the waveguide structure 581 includes the reflective layer 591, the base portion 508 and the optical element 572 as in FIG. 32. The waveguide structure 581 is closer to a back surface 500B than a front surface 500A of the device substrate 500. Openings 507A may be formed from the second surface 500B to expose a portion of the conductive layer 562, allowing electrical signal generated by the photosensitive region 503 to be accessed.

Figure 35:
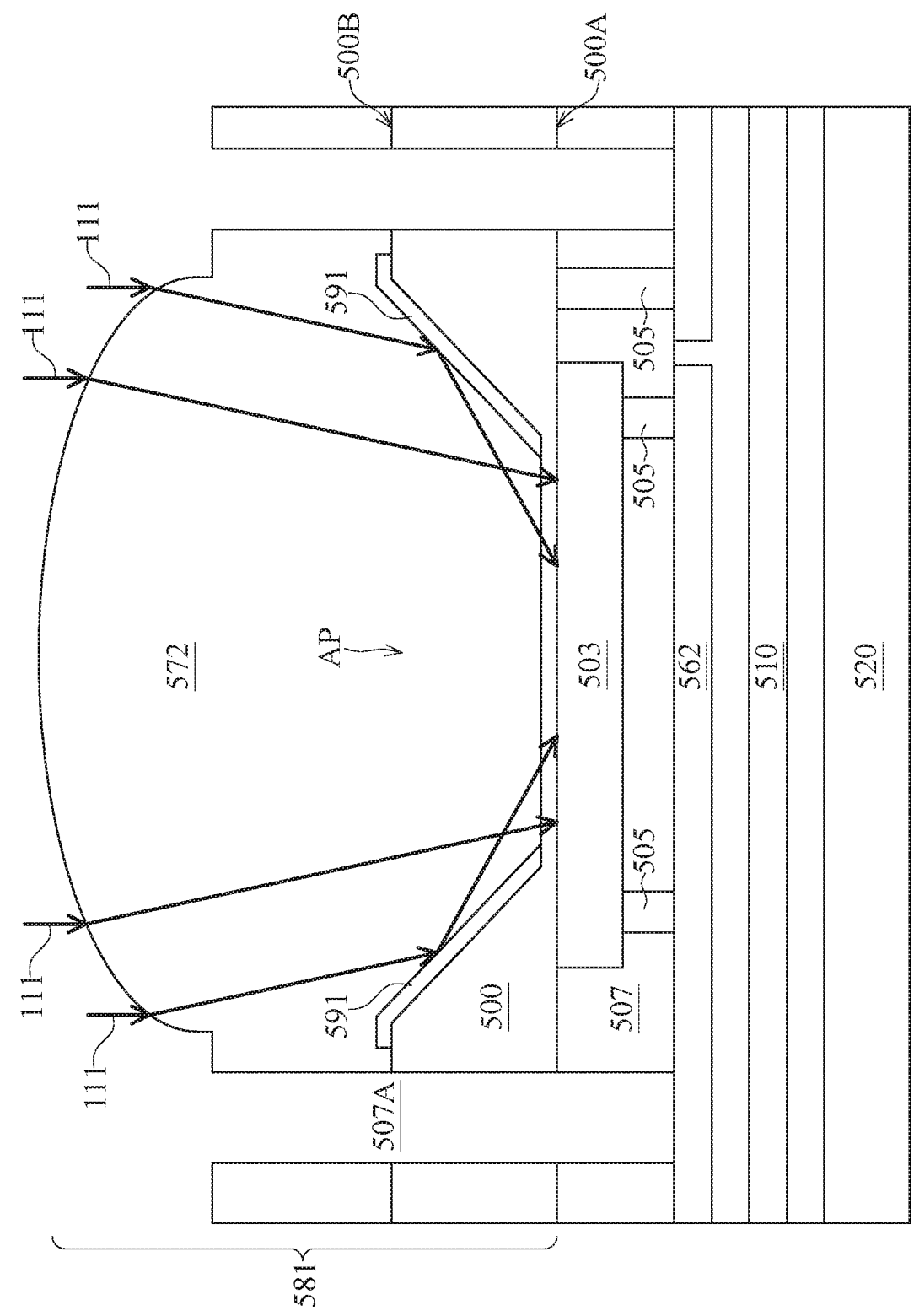
FIG. 35 illustrates a cross section of an optoelectronic device having a waveguide structure, according to some embodiments of the present disclosure.

FIG. 35 illustrates a cross section of an optoelectronic device 350 having a waveguide structure, according to some embodiments of the present disclosure. The optoelectronic device 350 is similar to the optoelectronic device 340 except that the waveguide structure 581 includes the device substrate 500. In some embodiments, the device substrate 500 is partially removed to form a channel AP directly above the photosensitive region 503. The device substrate 500 includes an inclined sidewall SW surrounding the channel AP, and the reflective layer 591 is formed over the inclined sidewall SW serving as a reflector to the incoming optical signal 111 captured by the optical element 572. Openings 507A may be formed from the second surface 500B and penetrate through at least the device substrate 500 and the dielectric layer 507 to expose a portion of the conductive layer 562, allowing electrical signal generated by the photosensitive region 503 to be accessed.

FIG. 35A to FIG. 35D illustrate cross sections of the optoelectronic device 350 of FIG. 35 during various manufacturing operations in a manufacturing method, according to some embodiments of the present disclosure. Referring to FIG. 35A, the method includes forming the photosensitive region 503 over the front surface 500A of the device substrate 500, forming the dielectric layer 507 surrounding the photosensitive region 503, forming the electrical connections 505 in the dielectric layer 507, forming the conductive layer 562 on the electrical connections 505. The electrical connections 505 are configured to transmit electronic signals generated in the photosensitive region 503 and electrically coupled to the photosensitive region 503 via the first contact region and the second contact region. The dielectric layer 507 is formed over the front surface 500A of the device substrate 500 to surround the photosensitive region 503 and the electrical connections 505. The conductive layer 562 is formed over the dielectric layer 507 and electrically connected to one or more of the electrical connections 505. The method further includes forming a bonding layer 510Y over the conductive layer 562. The method further includes providing a handling substrate 520 different from the device substrate 500, and forming a bonding layer 510X over the handling substrate 520.

Figure 35B:
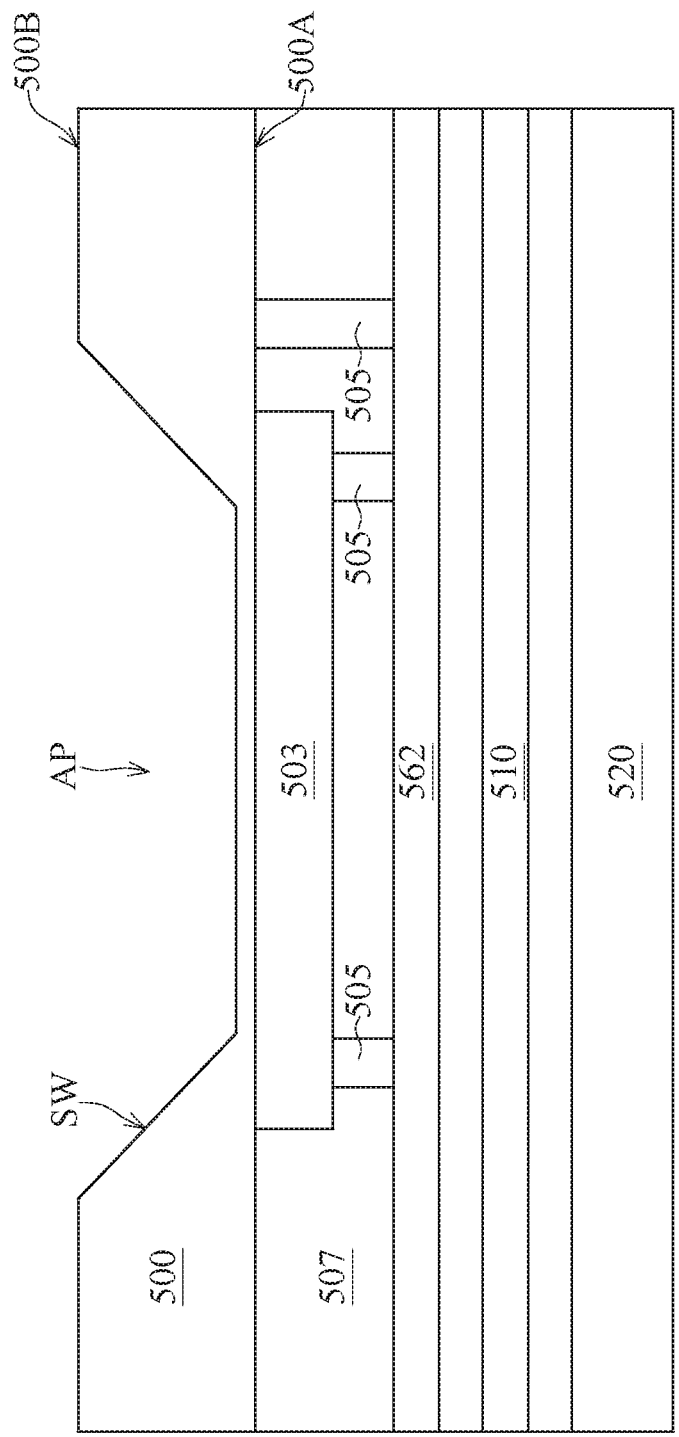

Referring to FIG. 35B, the method further includes bonding the device substrate 500 to the handling substrate 520 through the bonding layers 510X, 510Y to form congruent bonding layer 510.

The method further includes forming the waveguide structure 581. The step of forming the waveguide structure 581 includes forming a channel AP and an inclined sidewall SW surrounding the channel AP by removing a portion of the device substrate 500 from the back surface 500B of the device substrate 500 directly over the photosensitive region 503. The channel AP may be formed by any suitable method such as an etching operation. In some embodiments, a portion of the device substrate 500 over the photosensitive region 503 may be remained on the photosensitive region 503 after the removing step to remain the first contact region in the device substrate 500.

Figure 35C:
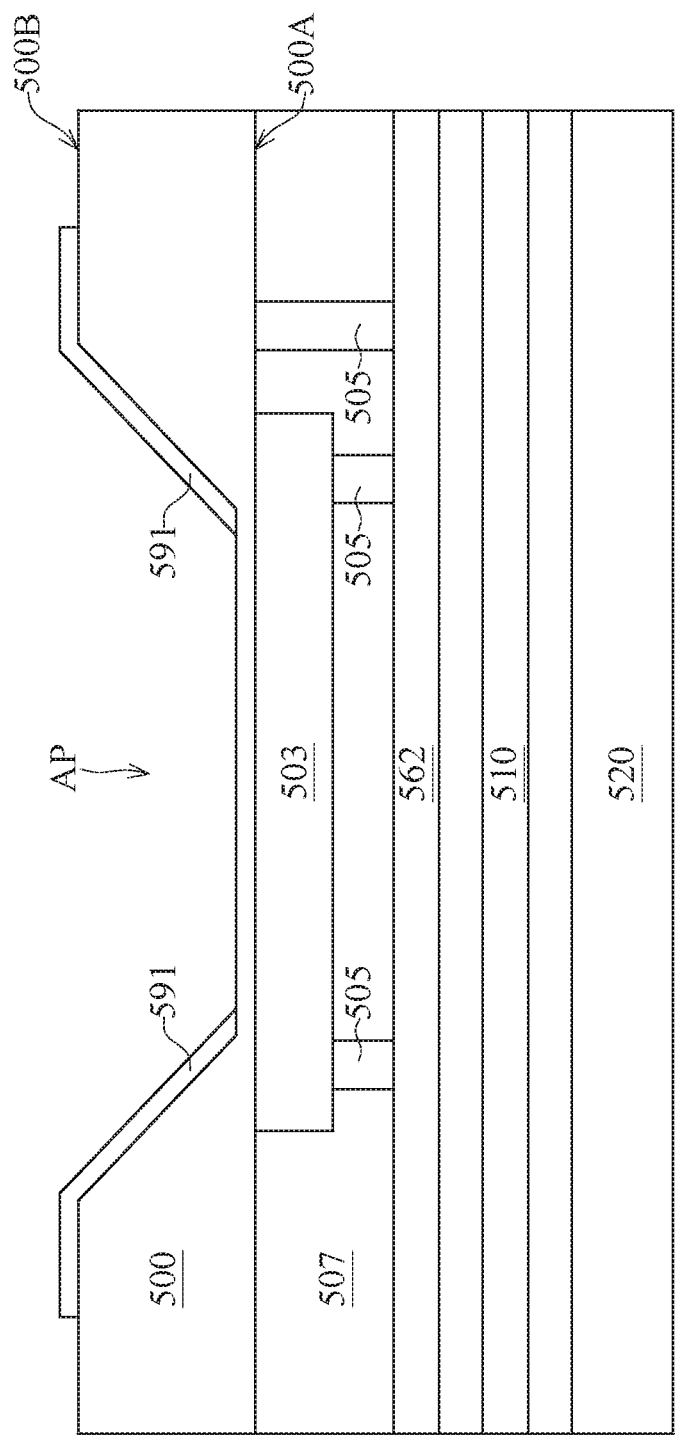
Figure 35D:
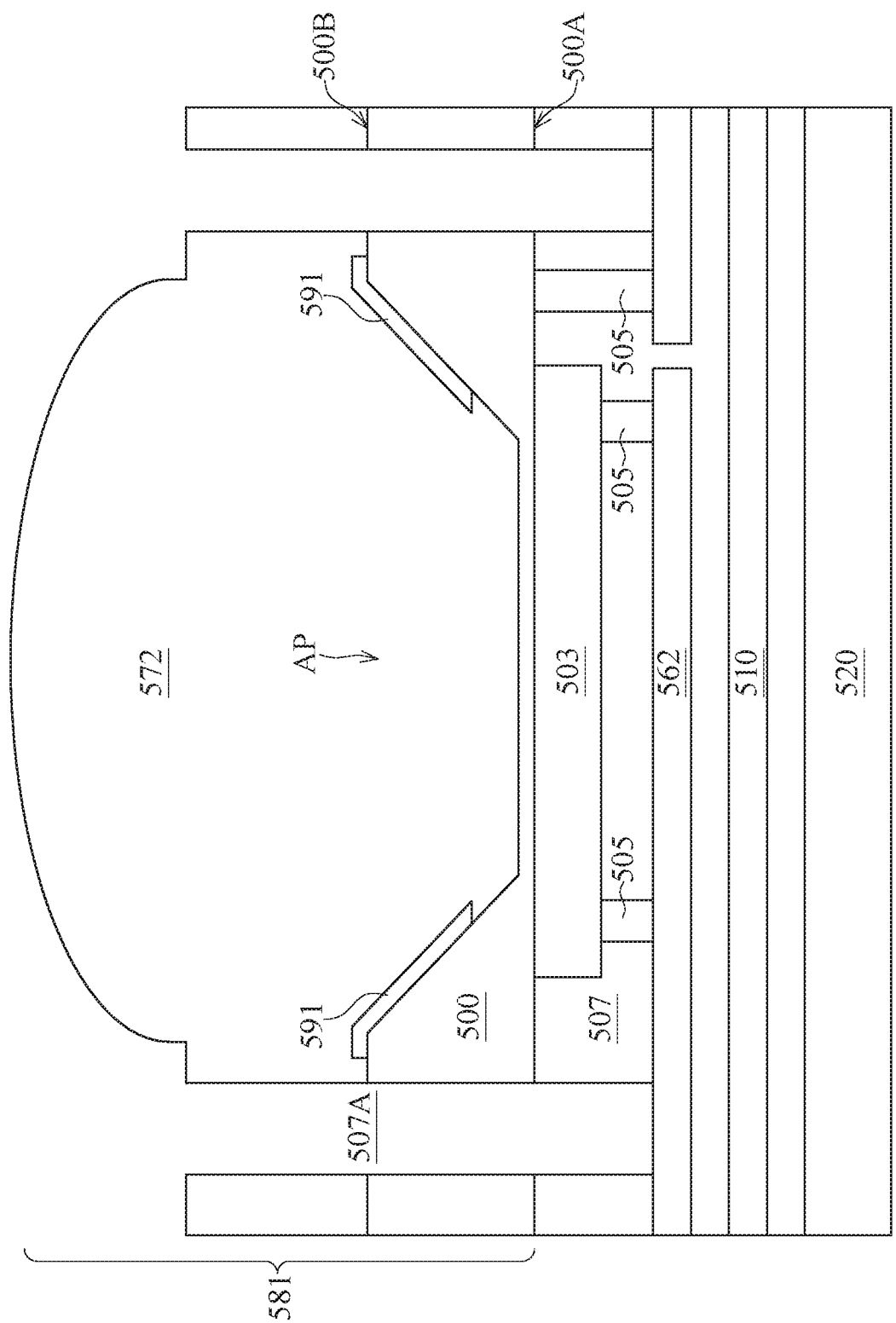

Referring to FIG. 35C, the step of forming the waveguide structure 581 further includes forming a reflective layer 591 on the inclined sidewall SW of the device substrate 500. Referring to FIG. 35D, the step of forming the waveguide structure 581 further includes forming an optical element 572 over the back surface 500B of the device substrate 500. The optical element 572 can be used as a lens configured to focus incident optical signal from various directions toward the photosensitive region 503.

Figure 36:
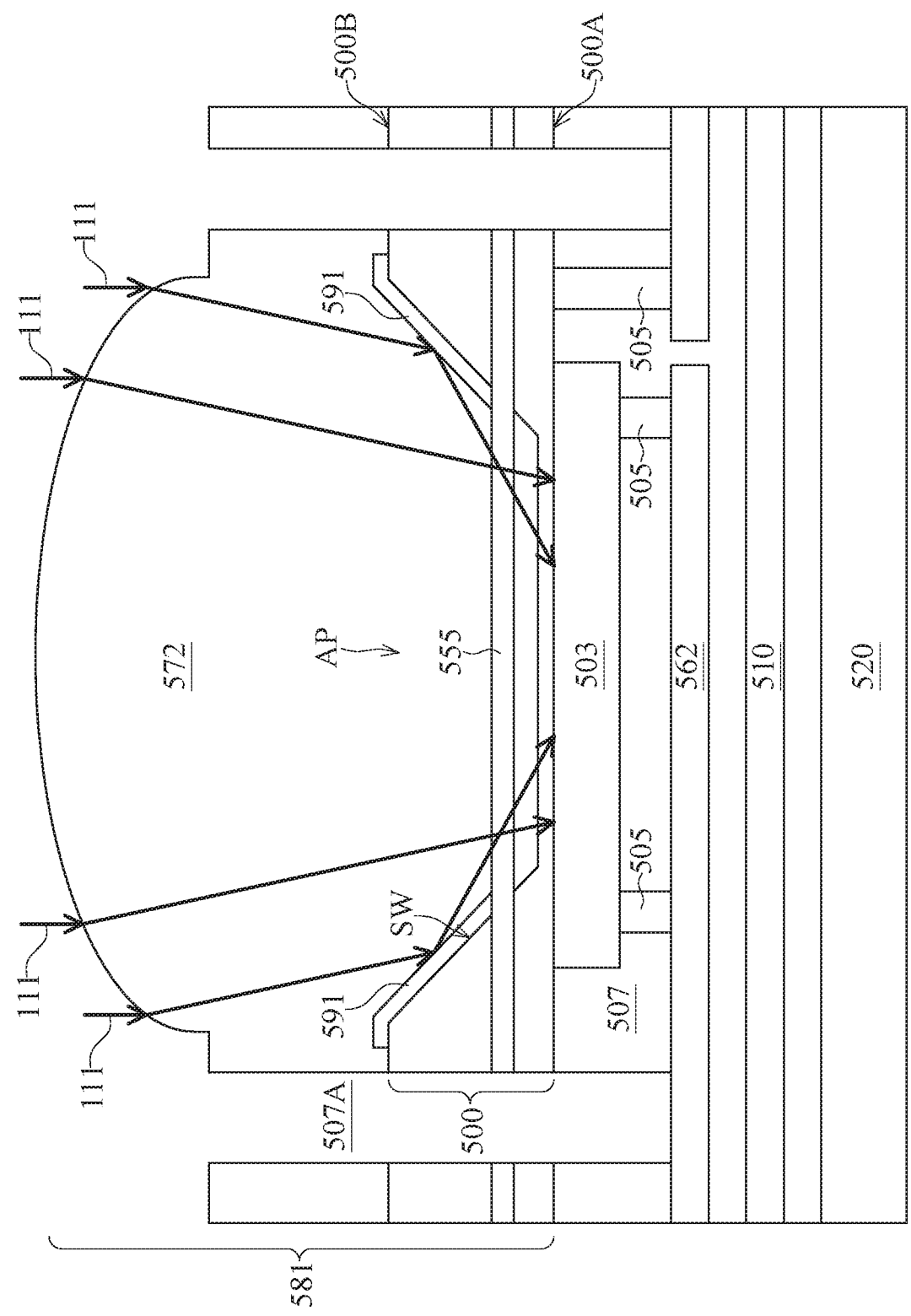
FIG. 36 illustrates a cross section of an optoelectronic device having a waveguide structure, according to some embodiments of the present disclosure.

FIG. 36 illustrates a cross section of an optoelectronic device 360 having a waveguide structure, according to some embodiments of the present disclosure. The optoelectronic device 360 is similar to the optoelectronic device 350 discussed in FIG. 35 except that the device substrate 500 is a silicon-on-insulator (SOI) substrate having a buried oxide layer 555, and a bottom of the channel AP in the device substrate 500 terminates at the buried oxide layer 555, rendering a portion of the device substrate 500 being spaced apart from the optical element 572 by the buried oxide layer 555. The buried oxide layer 555 includes oxide material that allows at least a portion of the optical signal 111 to transmit across to the other side. The reflective layer 591 is formed over the inclined sidewall SW that terminates at the buried oxide layer 555. In some embodiments, bringing the optical element 572 and the buried oxide layer 555 in contact is because the refractive index of the optical element 572 is close to the refractive index of the buried oxide layer 555, such that less reflection would occur at the interface of the optical element 572 and the buried oxide layer 555.

In some embodiments, when performing an etch operation to remove a portion of the device substrate 500 in order to form a channel AP, the buried oxide layer 555 can be used as an etch stop layer. In some embodiments, the optoelectronic device 360 can especially be incorporated into a critically coupled photodiode.

Openings 507A may further be formed from the second surface 500B to expose a portion of the conductive layer 562, allowing electrical signal generated by the photosensitive region 503 to be accessed.

Figure 37:
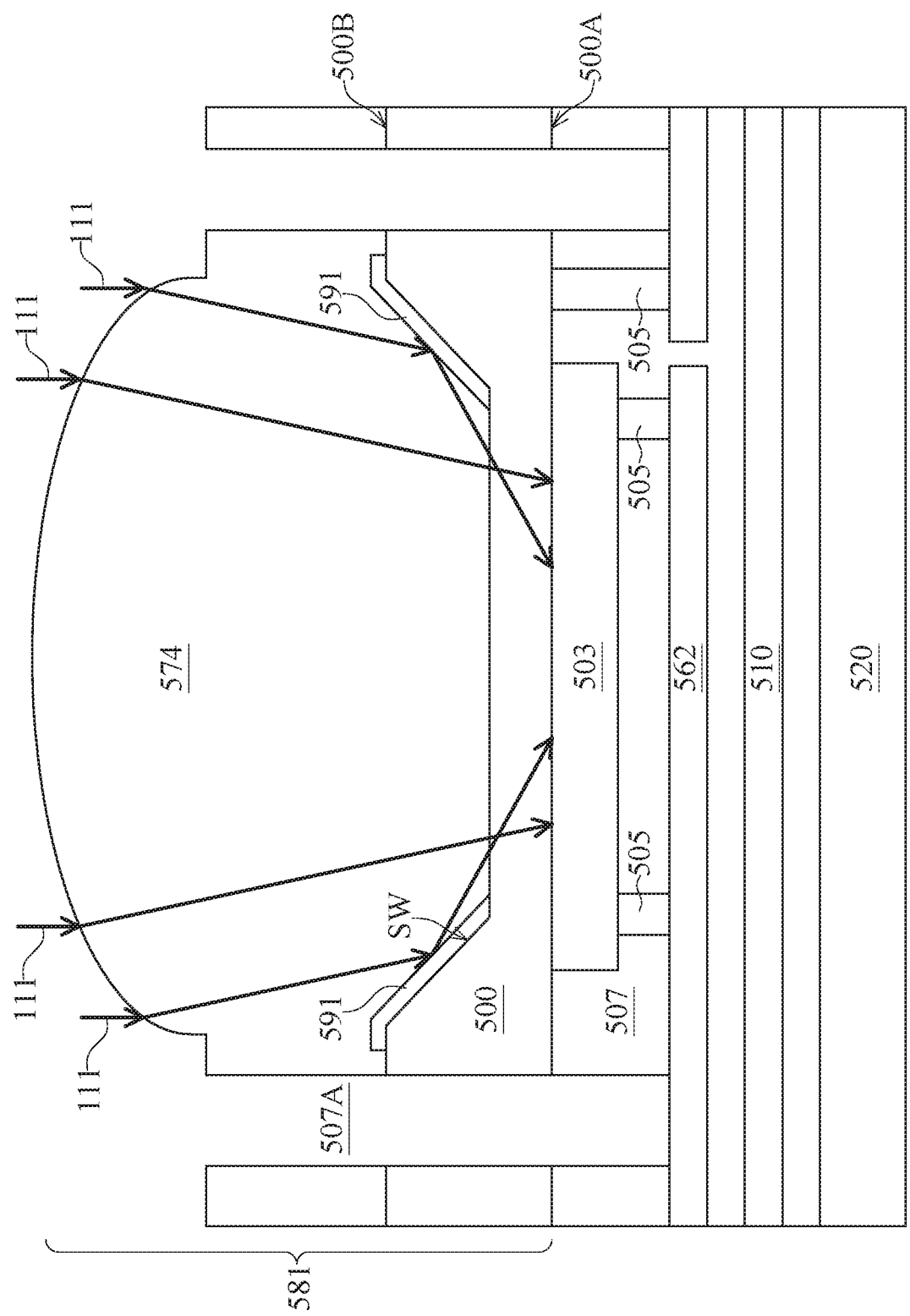
FIG. 37 illustrates a cross section of an optoelectronic device having a waveguide structure, according to some embodiments of the present disclosure.

FIG. 37 illustrates a cross section of an optoelectronic device 370 having a waveguide structure, according to some embodiments of the present disclosure. Optoelectronic device 370 is similar to the optoelectronic device 350 except that the optical element 574 of the device 350 includes semiconductor material, for example, silicon. When the optical element 574 includes silicon, the optical element 574 has a refractive index closer to the device substrate 500 than polymeric materials. The optical element 574 can be used as a lens configured to focus incident optical signal from various directions toward the photosensitive region 503. In some embodiments, a portion of the device substrate 500 is covering the photosensitive region 503. In some embodiments, a portion of the device substrate 500 is between the photosensitive region 503 and the optical element 574. Openings 507A may be formed from the second surface 500B and penetrate at least through the device substrate 500 and the dielectric layer 507 to expose a portion of the conductive layer 562, allowing electrical signal generated by the photosensitive region 503 to be accessed.

Figure 37A:
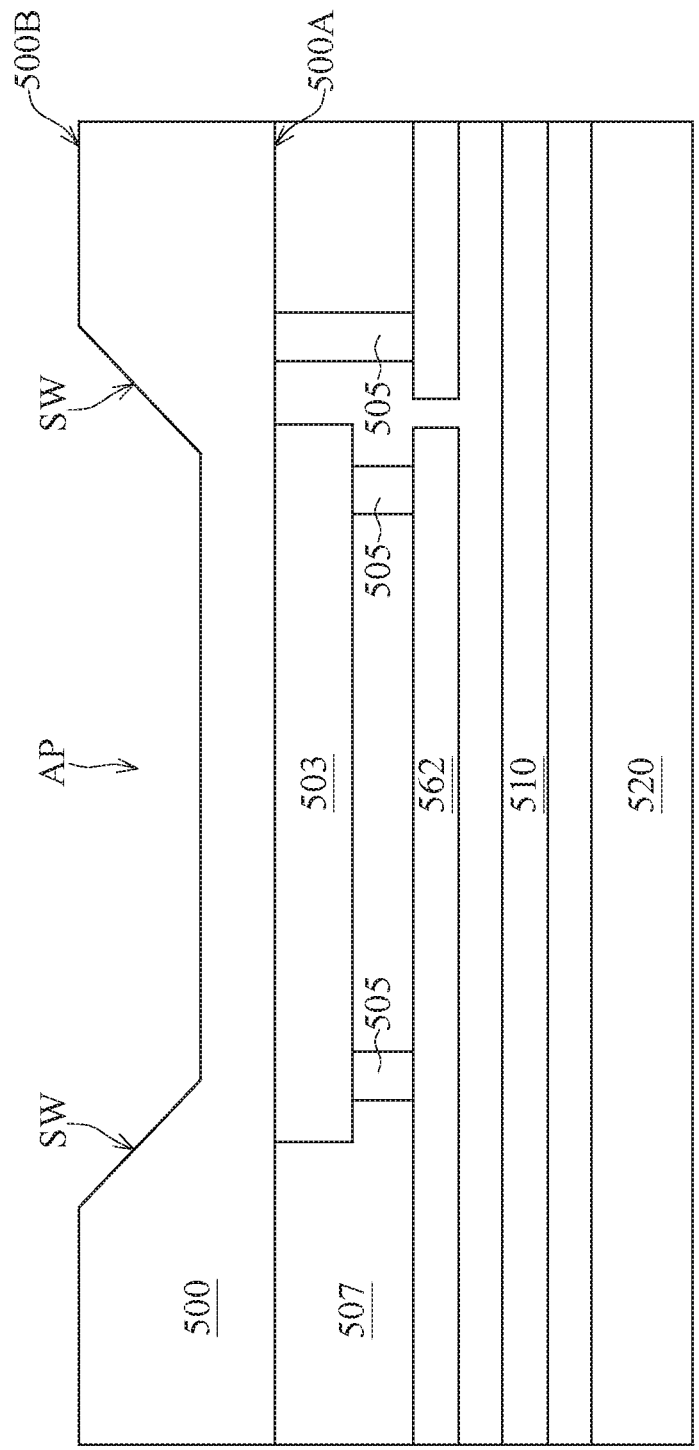
FIG. 37A to FIG. 37E illustrate cross sections of the optoelectronic device of FIG. 37 during various manufacturing operations, according to some embodiments of the present disclosure.

FIG. 37A to FIG. 37E illustrate cross sections of the optoelectronic device 370 of FIG. 37 during various manufacturing operations in a manufacturing method, according to some embodiments of the present disclosure. Referring to FIG. 37A, the method includes forming the photosensitive region 503 over the front surface 500A of the device substrate 500, forming the dielectric layer 507 surrounding the photosensitive region 503, forming the electrical connections 505 in the dielectric layer 507, forming the conductive layer 562 on the electrical connections 505 and forming the waveguide structure 581 above the photosensitive region 503. In some embodiments, the electrical connections 505 are configured to transmit electronic signals generated in the photosensitive region 503 and are electrically coupled to the photosensitive region 503 via the first contact region and the second contact region. The dielectric layer 507 is formed over the front surface 500A of the device substrate 500 to surround the photosensitive region 503 and the electrical connections 505. The conductive layer 562 is formed over the dielectric layer 507 and electrically connected to one or more of the electrical connections 505. The handling substrate 520 is bonded to the device substrate 500, similar to the operations discussed in FIG. 35A. The step of forming the waveguide structure 581 includes forming a channel AP and an inclined sidewall SW surrounding the channel AP from the back surface 500B of the device substrate 500 and directly over the photosensitive region 503. In some embodiments, a portion of the device substrate 500 covers the photosensitive region 503.

Figure 37B:
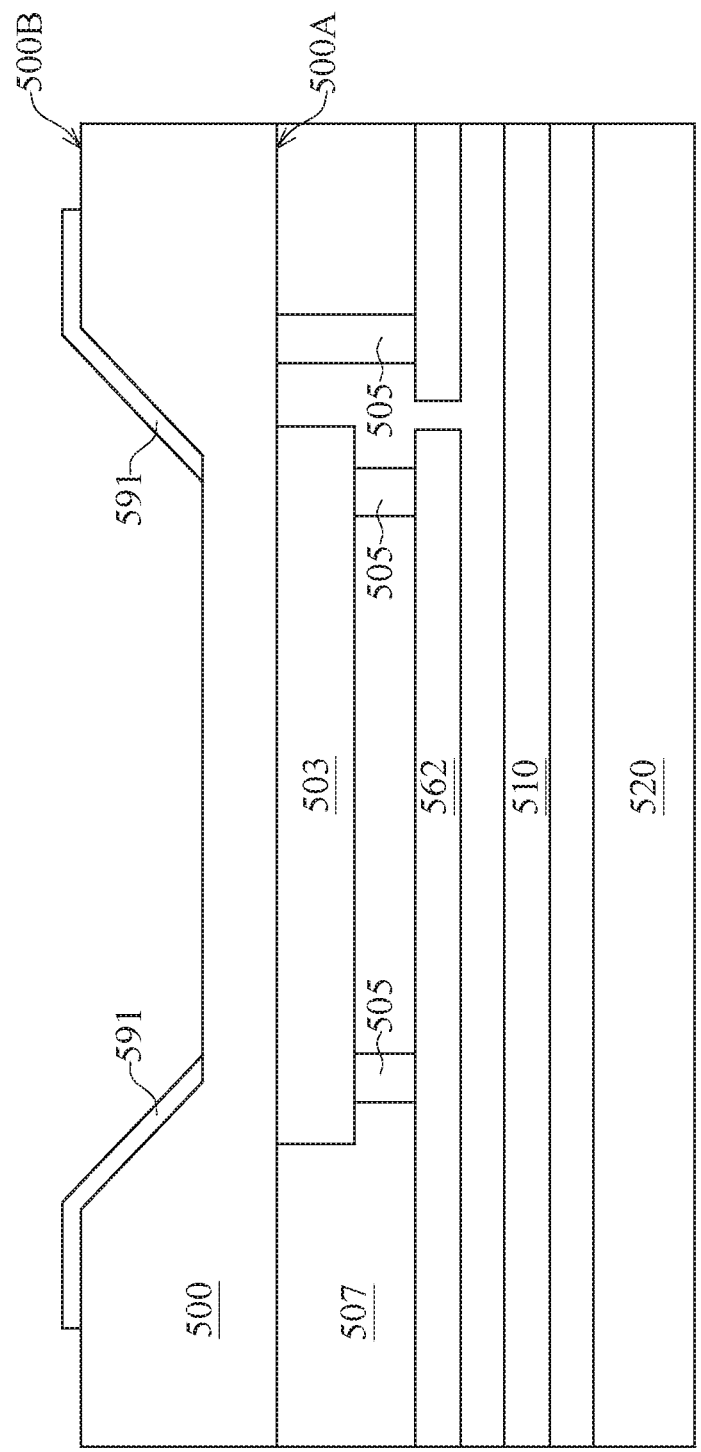
Figure 37C:
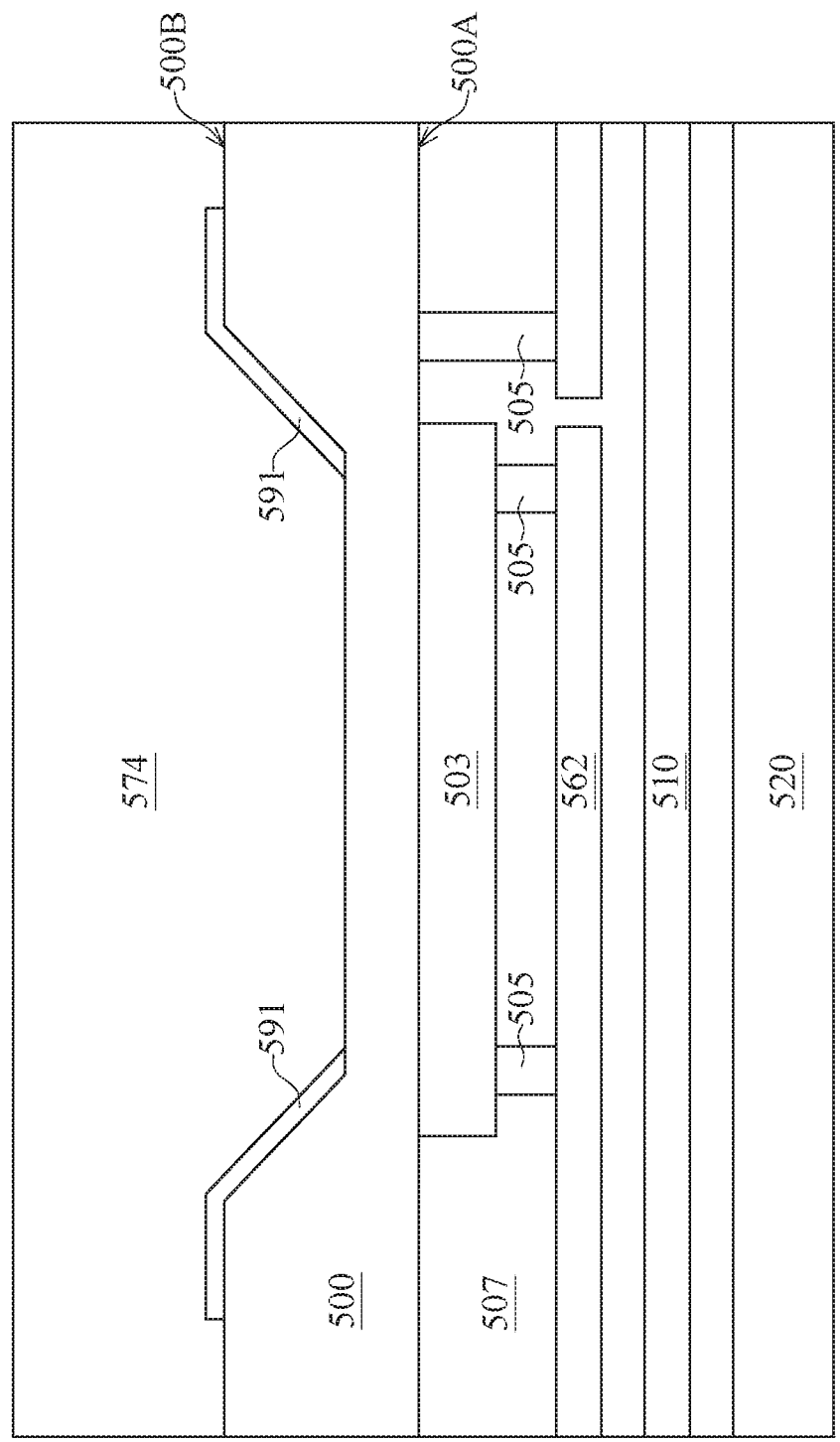
Figure 37D:
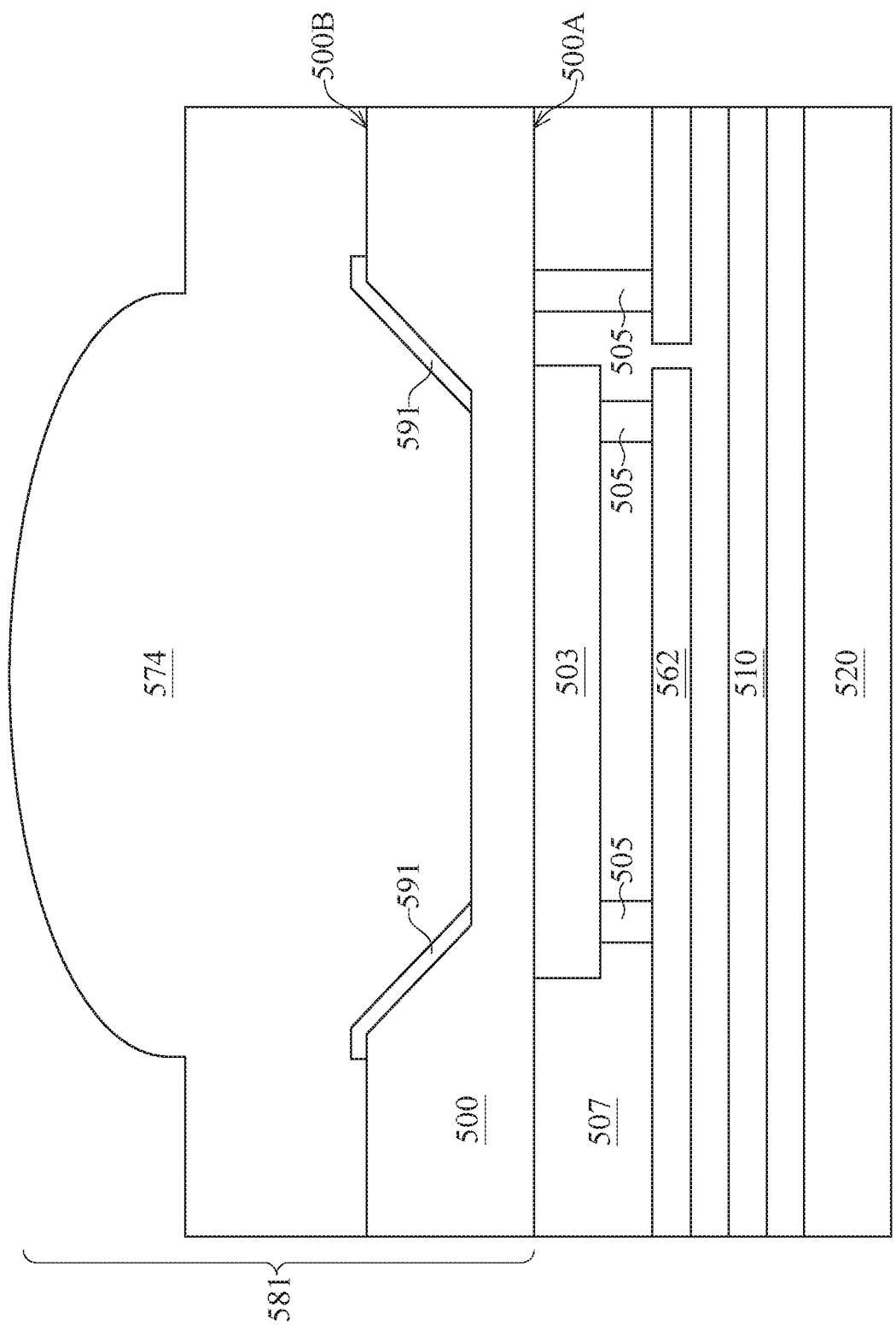
Figure 37E:
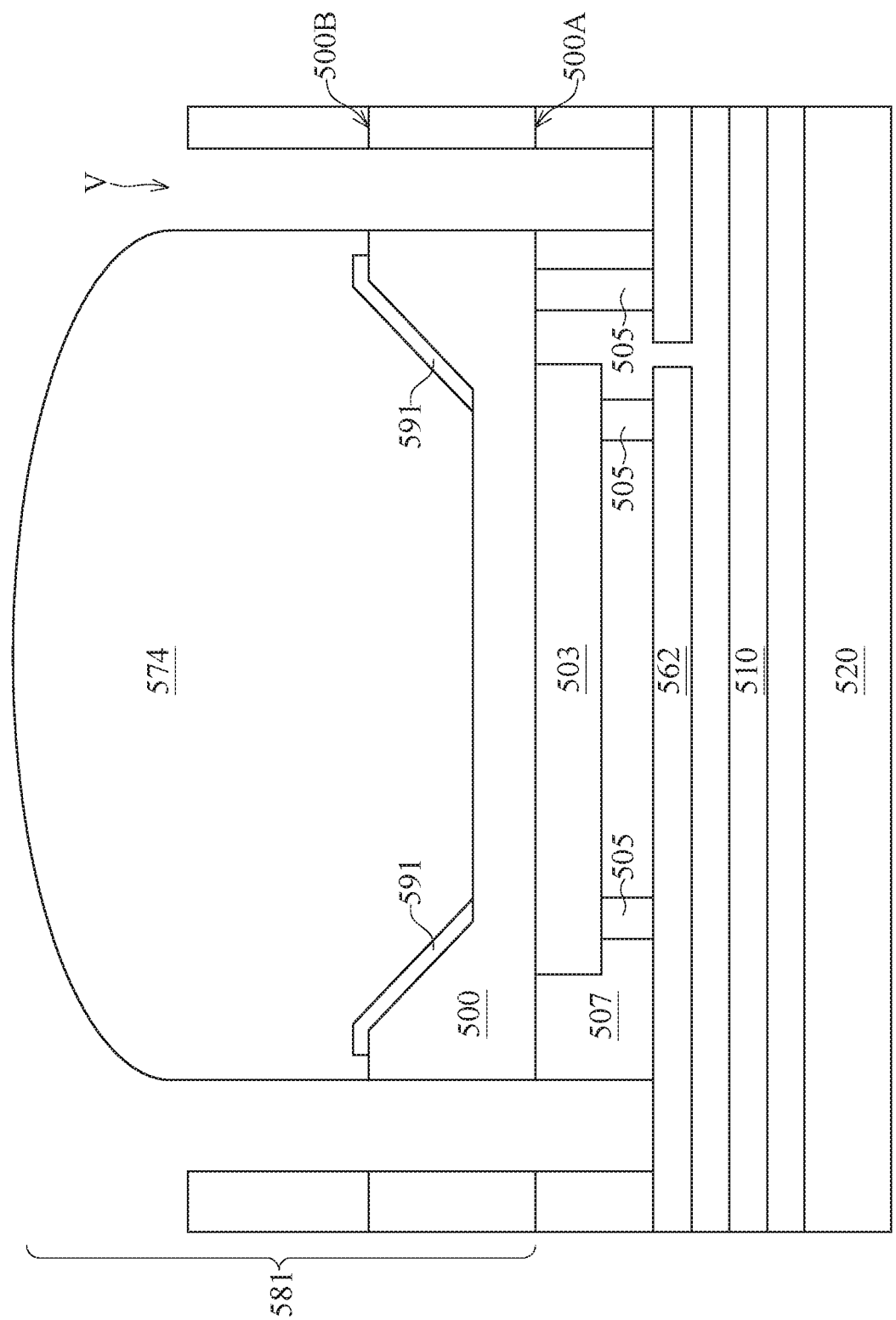

Referring to FIG. 37B, the step of forming the waveguide structure 581 further includes forming the reflective layer 591 on the inclined sidewall SW of the device substrate 500. Referring to FIG. 37C, the step of forming the waveguide structure 581 includes forming an optical element 574 over the back surface 500B of the device substrate 500, covering the channel AP and the remainder portion of the device substrate 500. The optical element 574 includes semiconductor material, for example, amorphous silicon. Referring to FIG. 37D, the step of forming the waveguide structure 581 includes removing a portion of the optical element 574. In some embodiments, the step of removing a portion of the optical element 574 can be performed by any suitable method such as etching operation. After the step, the optical element 574 includes a surface that can be used as a lens configured to focus incident optical signal from various directions toward the photosensitive region 503. A resist reflow operation can be performed with the etching operation to create a smoother surface, wherein the resist reflow operation includes melting the resist, so a dome-shaped surface may be formed due to the change of surface tension. Referring to FIG. 37E, optionally, the method may include forming openings 507A to expose a portion of the conductive layer 562. In some embodiments, the openings 507A penetrate the waveguide structure 581. In some embodiments, the openings 507A and the waveguide structure 581 are at the same side of the handling substrate 520 so as to facilitate manufacturing steps afterwards.

Figure 38A:
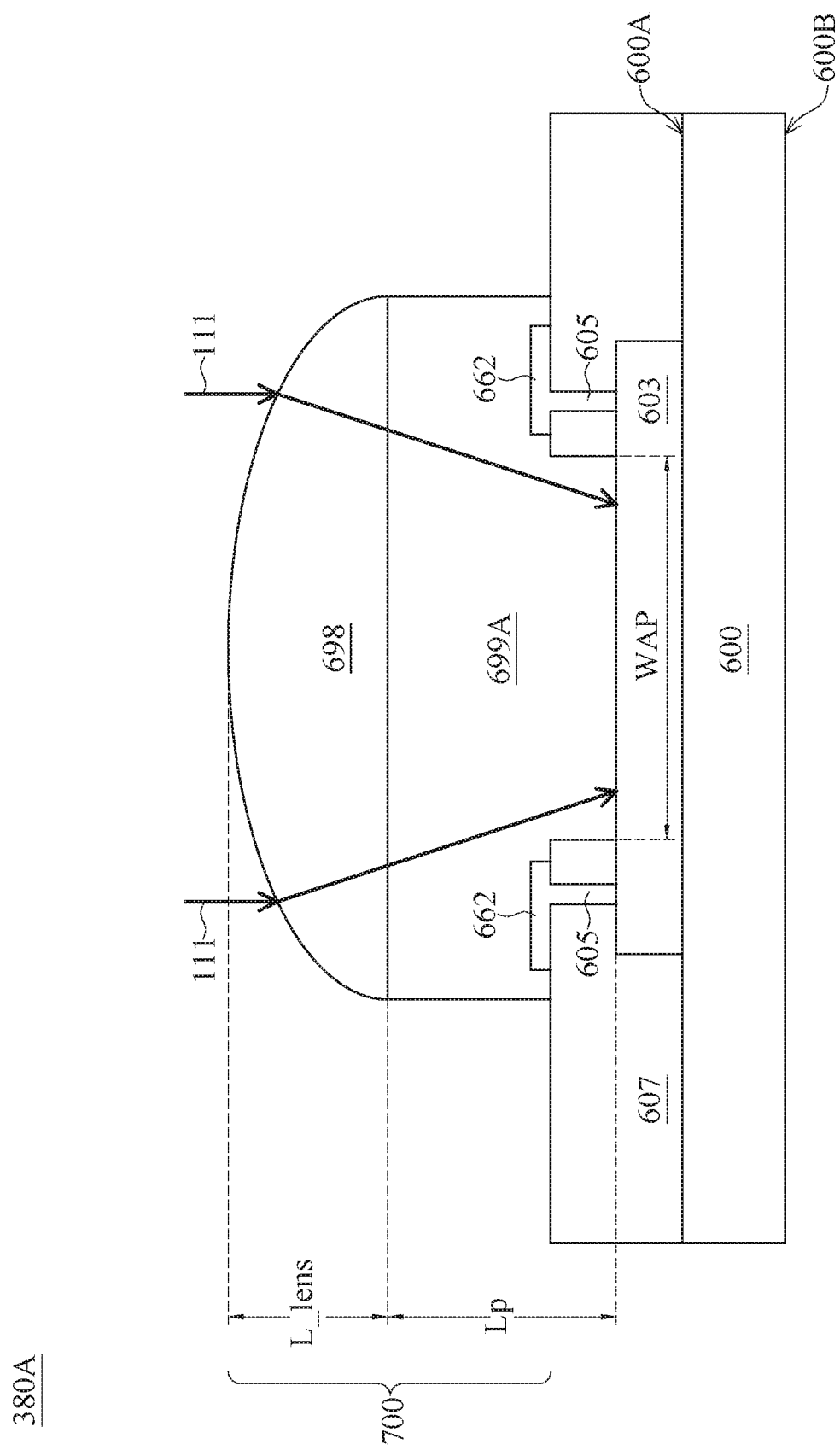
FIG. 38A illustrates a cross section of an optoelectronic device having a waveguide structure, according to some embodiments of the present disclosure.

FIG. 38A illustrates a cross section of an optoelectronic device 380A having a waveguide structure, according to some embodiments of the present disclosure. The optoelectronic device 380A at least includes a device substrate 600, a photosensitive region 603 adjacent to the device substrate 600, and a waveguide structure 700 above the photosensitive region 603. The device substrate 600 may be similar to the device substrate 100 as discussed in FIG. 1 or the device substrate 500 as discussed in FIG. 28, which includes a front surface 600A and a back surface 600B opposite to the front surface 600A. The photosensitive region 603 is closer to the front surface 600A than to the second surface 600B of the substrate 600. In some embodiments, the waveguide structure 700 and the photosensitive region 603 are at the same side of the device substrate 600. In some embodiments, the optical 111 signal enters the photosensitive region 603 without propagating through the device substrate 600. In some embodiments, the optoelectronic device 380A further includes a first contact region (not shown) and a second contact region (not shown) as described in FIG. 1. Electrical connections 605 may be formed to be electrically coupled to the photosensitive region 603 by electrically coupled to the first contact region and the second contact region. The electrical connections 605 are configured to transmit electronic signals generated in the photosensitive region 603. Generally speaking, the photosensitive region 603 may be similar to the photosensitive region 103 as discussed in FIG. 1 or the photosensitive region 503 as discussed in FIG. 28. A dielectric layer 607 laterally surrounds the electrical connections 605 and the photosensitive region 603, wherein a surface of the photosensitive region 603 is exposed from the dielectric layer 607. A conductive line 662 is disposed above the dielectric layer 607 and electrically connected to the electrical connections 605. In some embodiments, the conductive line 662 and the electrical connections 605 includes conductive materials such as, but is not limited to, metal, e.g. aluminum, copper, or the like. In some embodiment, the photosensitive region 603 has a sensing aperture having a lateral dimension WAP for receiving the optical signal. In some embodiment, the lateral dimension WAP is not more than 35 µm. In some embodiments, the lateral dimension WAP is between 20 µm and 35 µm.

In some embodiments, the waveguide structure 700 includes an optical element 698 and a pedestal layer 699A between the optical element 698 and the photosensitive region 603. By spacing the optical element 698 and the photosensitive region 603 by the pedestal layer 699A, a greater portion of the optical signal 111 can be directed to the photosensitive region 603, thereby improving the efficiency of the optoelectronic device. Besides, a problem of the optical signal 111 reflected by the conductive line 662 and/or the electrical connections 605 adjacent to the photosensitive region 603 may be avoided or alleviated. In some embodiments, the optical element 698 may be composed of or include optical transmissive material, which is transparent to the target wavelength of the optical signal 111. The optical transmissive material includes, but is not limited to, polymer, dielectric material, transparent material, partially transparent material, or the like. The dielectric material may include, and is not limited to, Si, $SiO_2$, $Si_3N_4$, or any combination thereof.

The optical element 698 may include a lens. The lens may be formed by any suitable method such as inkjet, reflow, gray scale lithography, lithography operations, or pattern transfer. In FIG. 38A, the pedestal layer 699A, spaces between the optical element 698 and the photosensitive region 603, and may optionally further cover the conductive line 662. The pedestal layer 699A may include optical transmissive material, which is transparent to the target wavelength of the optical signal 111. The optical transmissive material includes, but is not limited to, polymer, dielectric material, transparent material, partially transparent material, or the like. The material may include, and is not limited to, Si, $SiO_2$, $Si_3N_4$, or any combination thereof. In some embodiments, a material of the optical element 698 may or may not be identical with the pedestal layer 699A. A top surface of the dielectric layer 607 is exposed from the pedestal layer 699A. The pattern of the pedestal layer 699A may be formed by etching or photolithography operations. In some embodiments, the pedestal layer 699A may have a pillar shape. In some embodiments, the pedestal layer 699A has a width between the width of the photosensitive region 603 and the width of the device substrate 600 from a cross sectional view of the optoelectronic device 380A.

In some embodiments, a thickness Lp of the pedestal layer 699A is substantially equal to or near a focal length (not shown) of the optical element 698 subtracted by a thickness L_lens of the optical element 698 in order to improve the efficiency of the optoelectronic device 380A. In the cases of optical signal 111 being a plane wave or a single mode, and the pedestal layer 699A being composed of identical material as the optical element 698, the focal length of the optical element 698 can be approximated by the following equation, $$R*(n\_lens/(n\_lens-n\_ambience)),$$

wherein R is radius of curvature of the optical element 698, n_lens is the refractive index of the optical element 698, and n_ambience is the refractive index of the ambience environment. In the cases of optical signal 111 being a non-planar wave or a multi-mode, the thickness Lp of the pedestal layer 699A can be determined by practical measurement of spot size with different thicknesses Lp to obtain a thickness with optimal performance. In some embodiments, the thickness Lp of the pedestal layer 699A is not less than 5 µm. In some embodiments, the thickness Lp of the pedestal layer 699A is not more than 100 µm. In some embodiments, the thickness Lp of the pedestal layer 699A is not more than 50 µm.

Figure 38B:
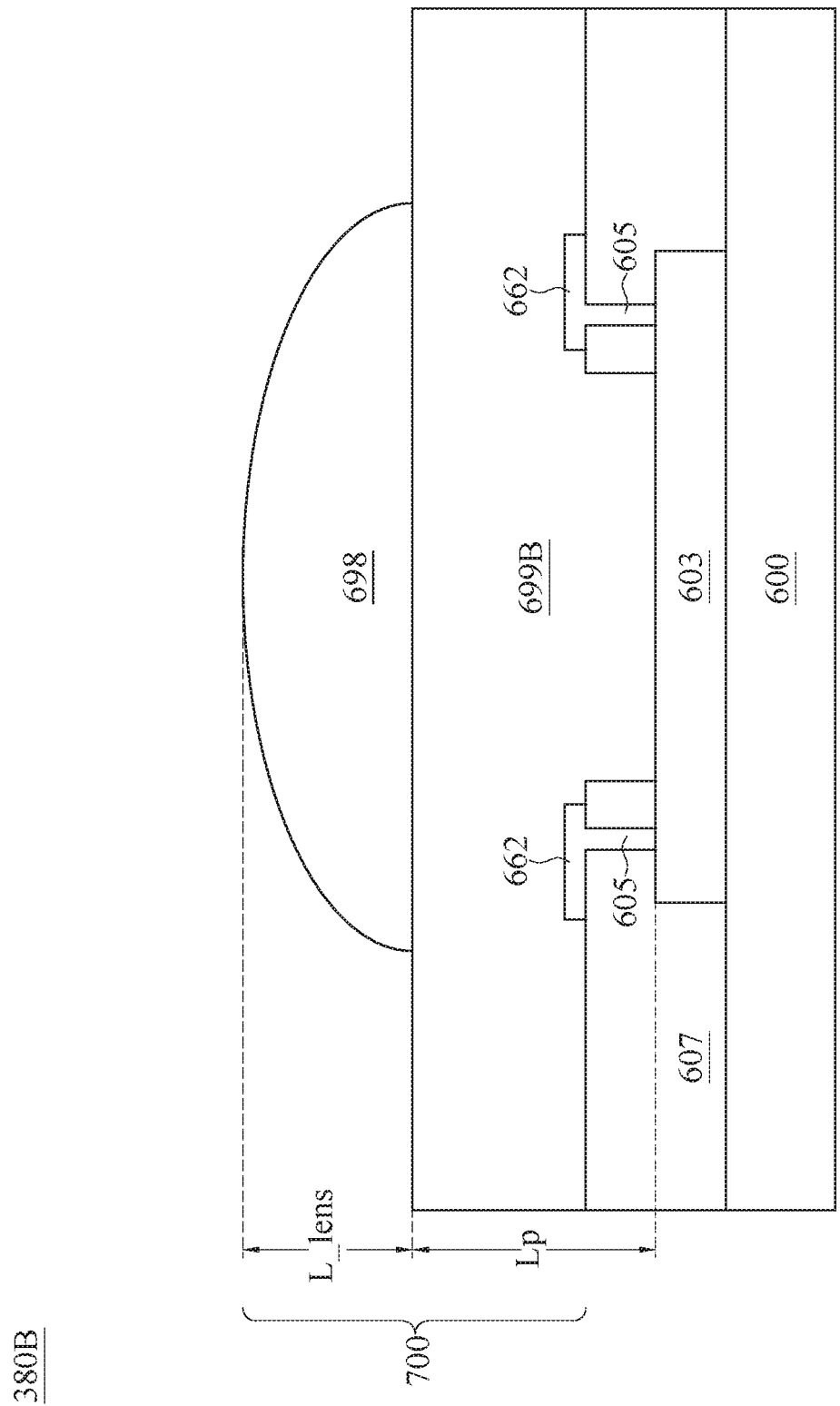
FIG. 38B illustrates a cross section of an optoelectronic device having a waveguide structure, according to some embodiments of the present disclosure.

FIG. 38B illustrates a cross section of an optoelectronic device 380B having a waveguide structure, according to some embodiments of the present disclosure. The optoelectronic device 380B is similar to the optoelectronic device 380A discussed in FIG. 38A, except the pedestal layer 699B of device 380B covers the dielectric layer 607 in a substantially uniform layer instead of a pillar locally covering the photosensitive region 603 and the nearby dielectric layer 607. In some embodiments, the width of the pedestal layer 699B is substantially the same as the width of the device substrate 600 from a cross sectional view of the optoelectronic device 380B. In some embodiments, the pedestal layer 699B can be formed by coating or deposition. In some embodiments, a thickness of the pedestal layer 699B above the dielectric layer 607 is substantially uniform.

Figure 38C:
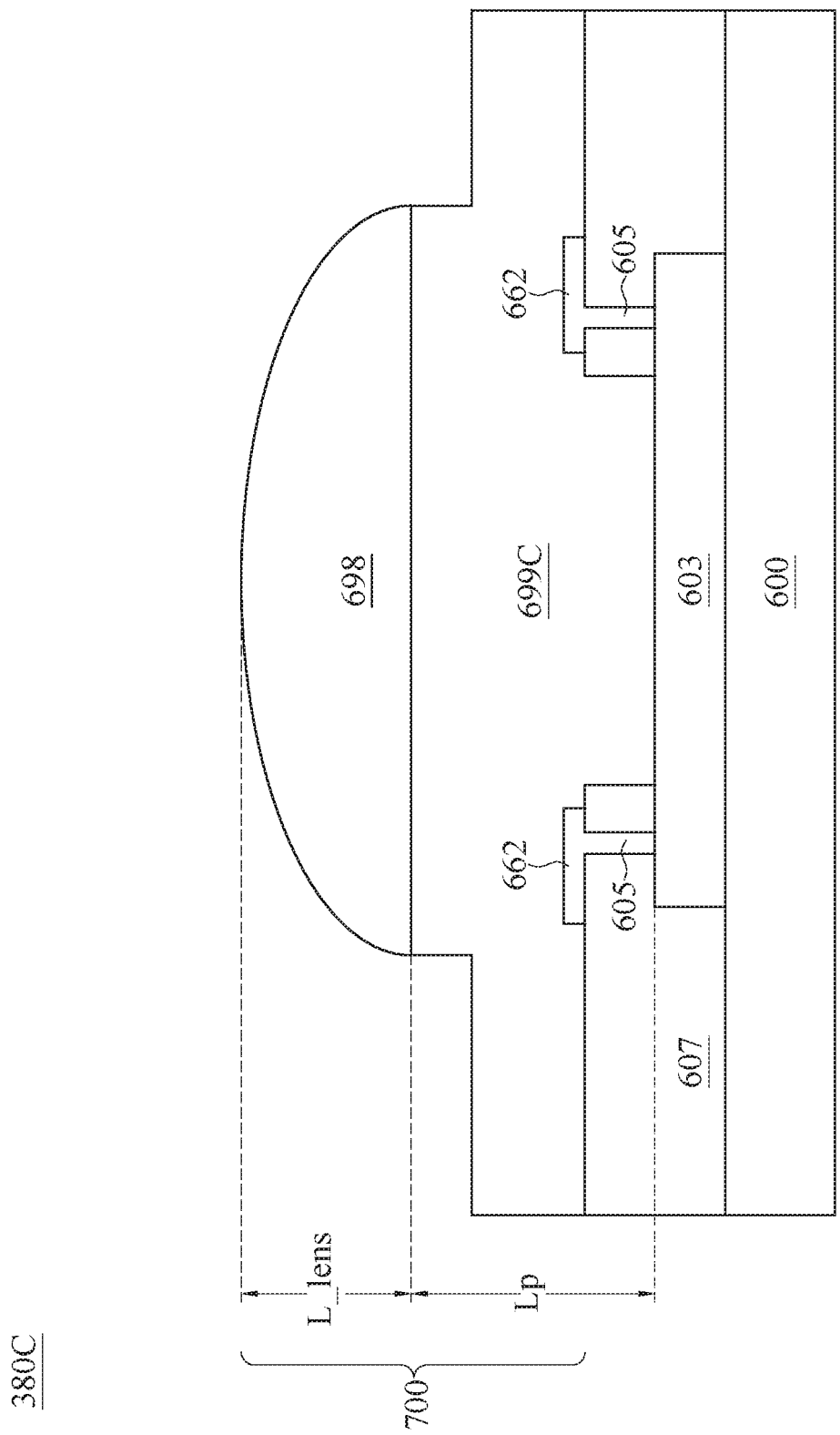
FIG. 38C illustrates a cross section of an optoelectronic device having a waveguide structure, according to some embodiments of the present disclosure.

FIG. 38C illustrates a cross section of an optoelectronic device 380C having a waveguide structure, according to some embodiments of the present disclosure. The optoelectronic device 380C is similar to the optoelectronic device 380A discussed in FIG. 38A, except that the pedestal layer 699C includes a middle portion and a periphery portion surrounding the middle portion. The middle portion may have a greater thickness than that of the periphery portion in order to possess a desired thickness Lp of the pedestal layer 699C. In some embodiments, the pedestal layer 699C can be formed by coating a uniform layer and followed by an etching operation forming the periphery portion and the middle portion. The middle portion can be any suitable shape from a top view of the optoelectronic device 380C, for example, circular, square, or rectangular.

Figure 38D:
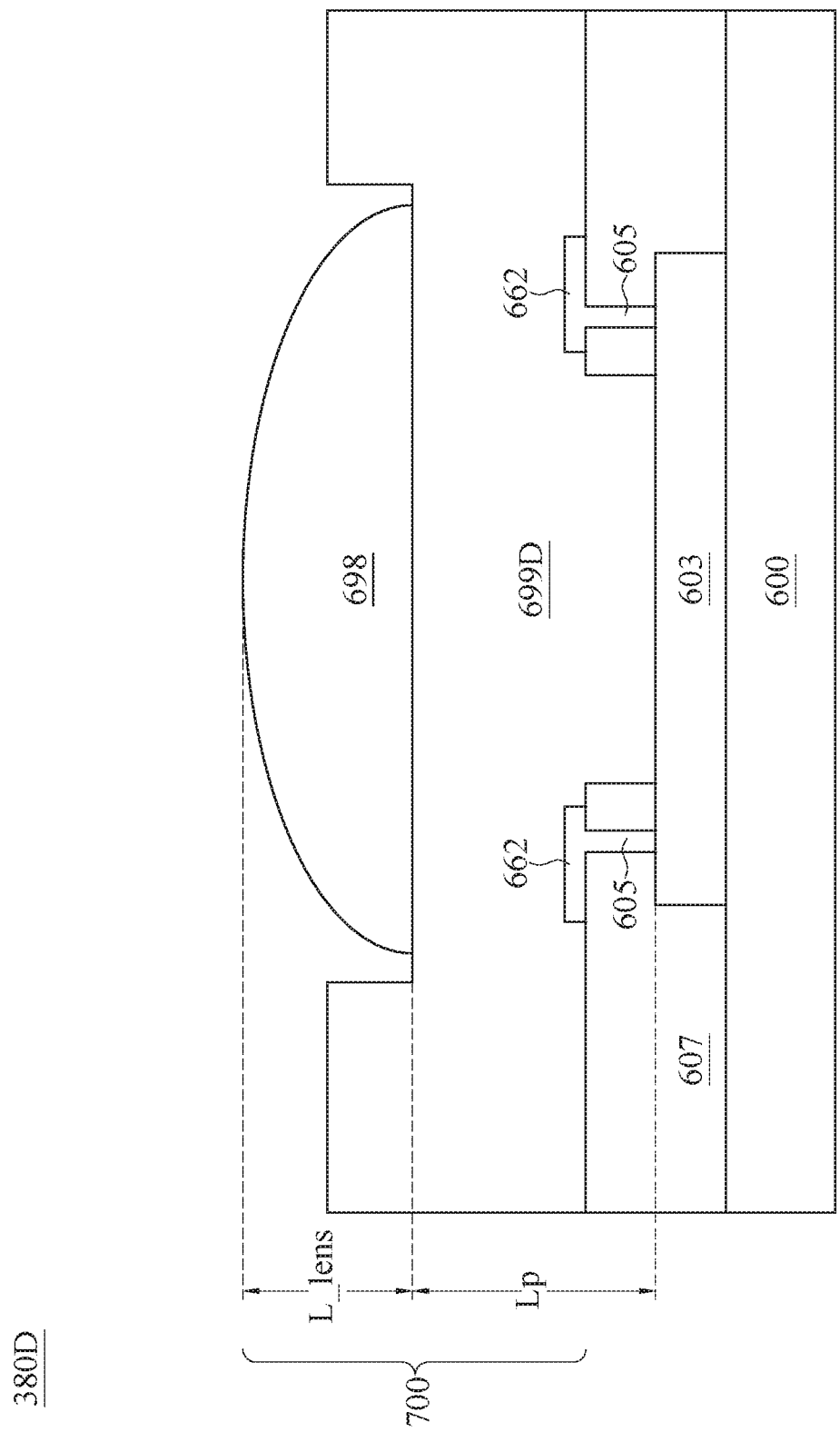
FIG. 38D illustrates a cross section of an optoelectronic device having a waveguide structure, according to some embodiments of the present disclosure.
Figure 39A:
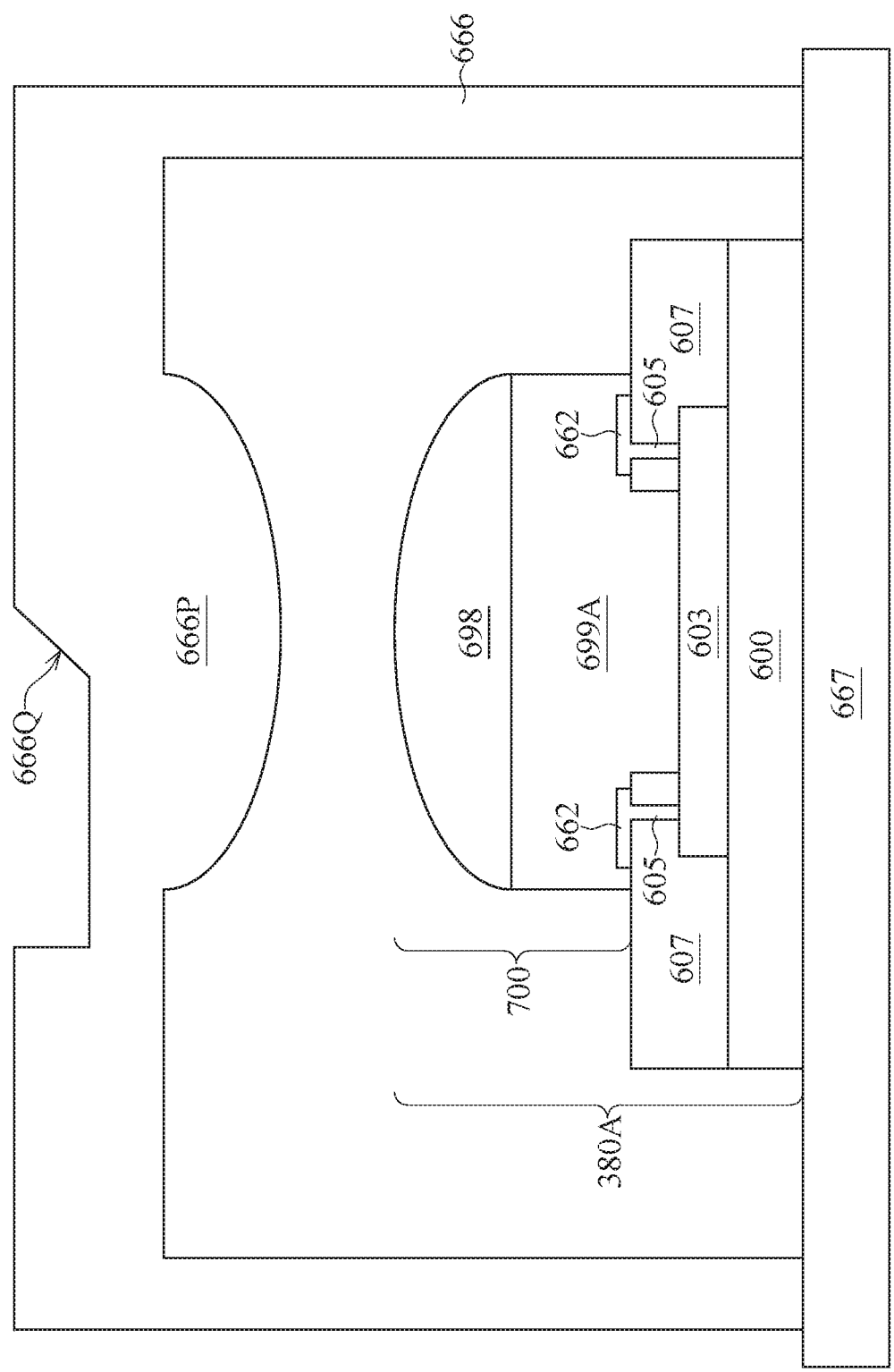
FIG. 39A illustrates a cross section of the optoelectronic device according to some embodiments of the present disclosure.
Figure 39B:
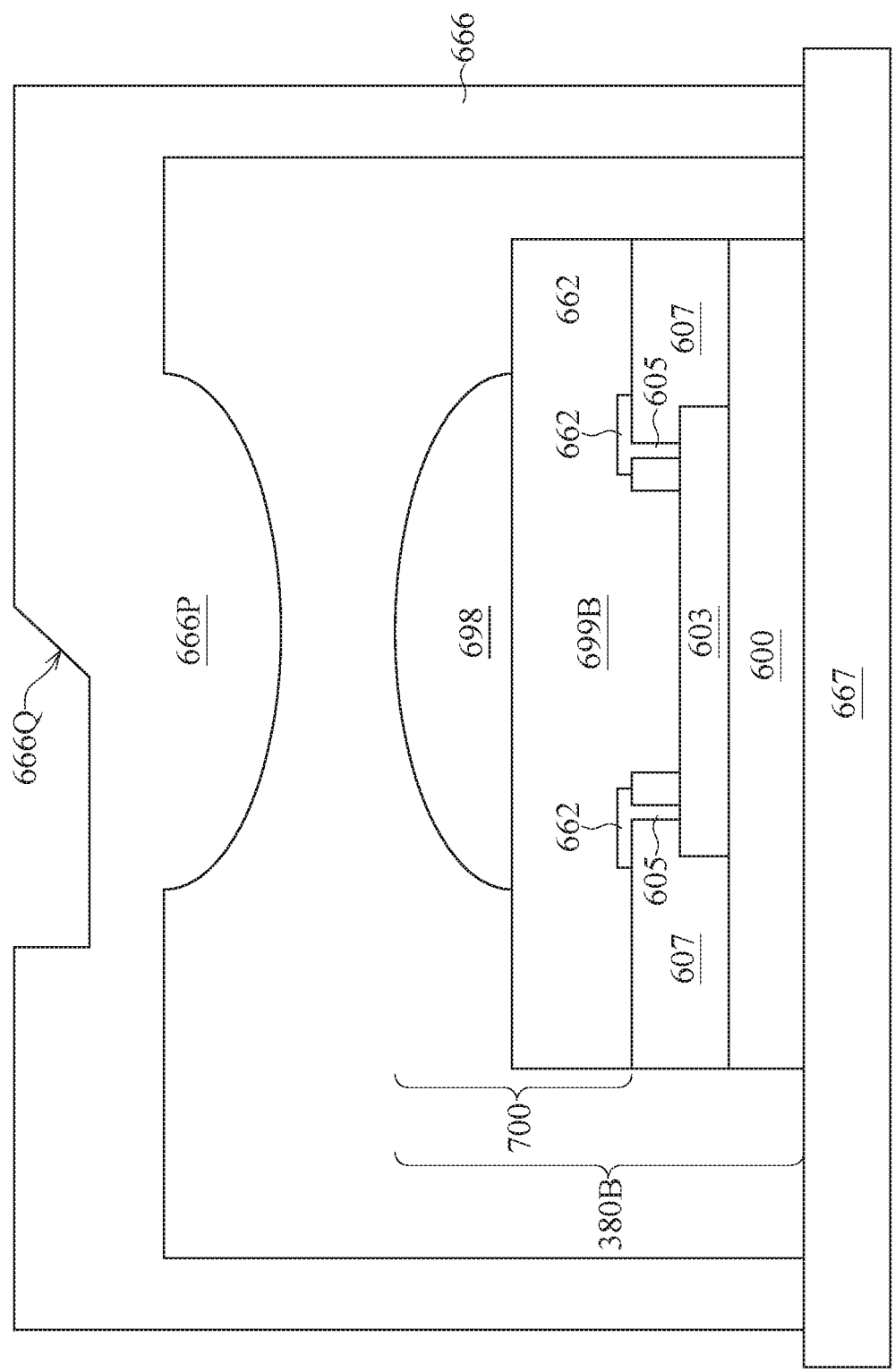
FIG. 39B illustrates a cross section of the optoelectronic device, according to some embodiments of the present disclosure.
Figure 39C:
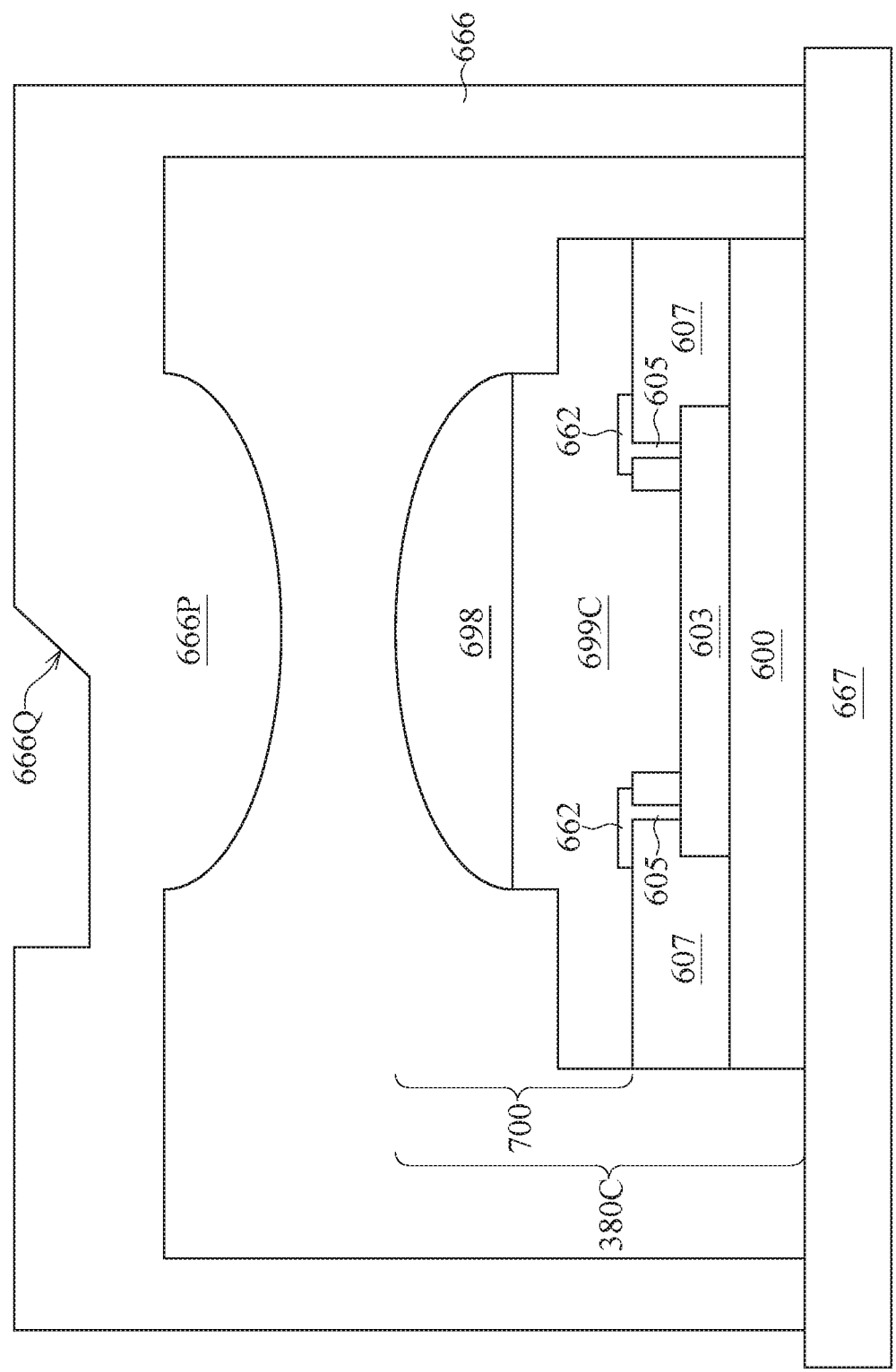
FIG. 39C illustrates a cross section of the optoelectronic device, according to some embodiments of the present disclosure.

FIG. 38D illustrates a cross section of an optoelectronic device 380D having a waveguide structure, according to some embodiments of the present disclosure. The optoelectronic device 380D is similar to the optoelectronic device 380A discussed in FIG. 38A, except that the pedestal layer 699D combines a recess portion and a periphery portion surrounding the recess portion. The optical element 698 is disposed over the recess portion, alternatively stated, the recess portion can be a cavity accommodating the optical element 698. In some embodiments, the pedestal layer 699D can be formed by coating a uniform layer and followed by an etching operation forming the recess portion.

FIG. 39A, FIG. 39B, FIG. 39C, and FIG. 39D illustrate a cross section of an optoelectronic device 390A, 390B, 390C, 390D including a case 666 and the optoelectronic device 380A of FIG. 38A, the optoelectronic device 380B of FIG. 38B, the optoelectronic device 380C of FIG. 38C, and the optoelectronic device 380D of FIG. 38D disposed under the case 666 respectively, according to some embodiments of the present disclosure. The case 666 may be utilized to further enhance the amount of light entering the photosensitive region of the optoelectronic device disposed thereunder. In some embodiments, the optoelectronic device 380A, 380B, 380C, and 380D can be disposed on a printed circuit board (PCB) 667, and the case 666 is disposed on the PCB 667 to surround the optoelectronic device 380A, 380B, 380C, and 380D. In some embodiments, the case 666 includes an optical structure 666P, such as a lens, directly above the optical element 698 of the waveguide structure 700 to facilitate the focusing of incident optical signal toward the photosensitive region 603. The optical element 698 may be aligned to, or vertically overlapping with the optical structure 666P from a top view perspective or a cross-sectional view perspective. In some embodiments, the case 666 may further include another optical structure 666Q, for example, an inclined surface better guiding the incoming light toward the optical structure 666P.

Figure 40A:
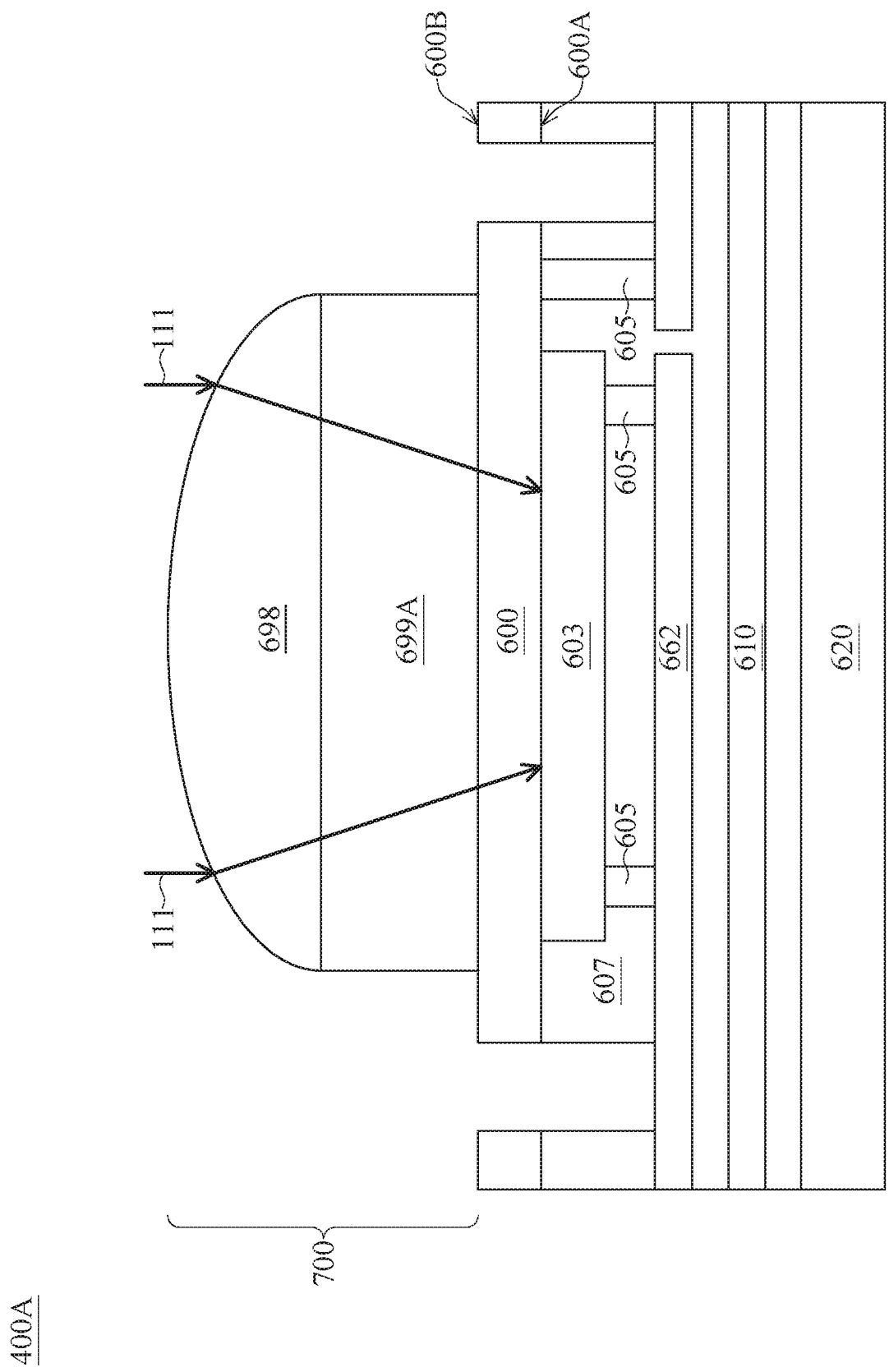
FIG. 40A illustrates a cross section of an optoelectronic device having a waveguide structure, according to some embodiments of the present disclosure.

FIG. 40A illustrates a cross section of an optoelectronic device 400A having a waveguide structure, according to some embodiments of the present disclosure. The optoelectronic device 400A is similar to the optoelectronic device 380A except that the waveguide structure 700, including the pedestal layer 699A and the optical element 698, is closer to a back surface 600B than a front surface 600A of the device substrate 600. In some embodiments, the waveguide structure 700 and the photosensitive region 603 are at the two opposite sides of the device substrate 600. In some embodiments, an optical signal 111 is incident on a surface of the photosensitive region 603 after propagating through the device substrate 600. A handling substrate 620 can be further bonded over a metal layer 662 or a conductive trace layer at the front surface 600A of the device substrate 600. In some embodiment, a bonding layer 610 is formed between the metal layer 662 and the handling substrate 620.

Figure 40B:
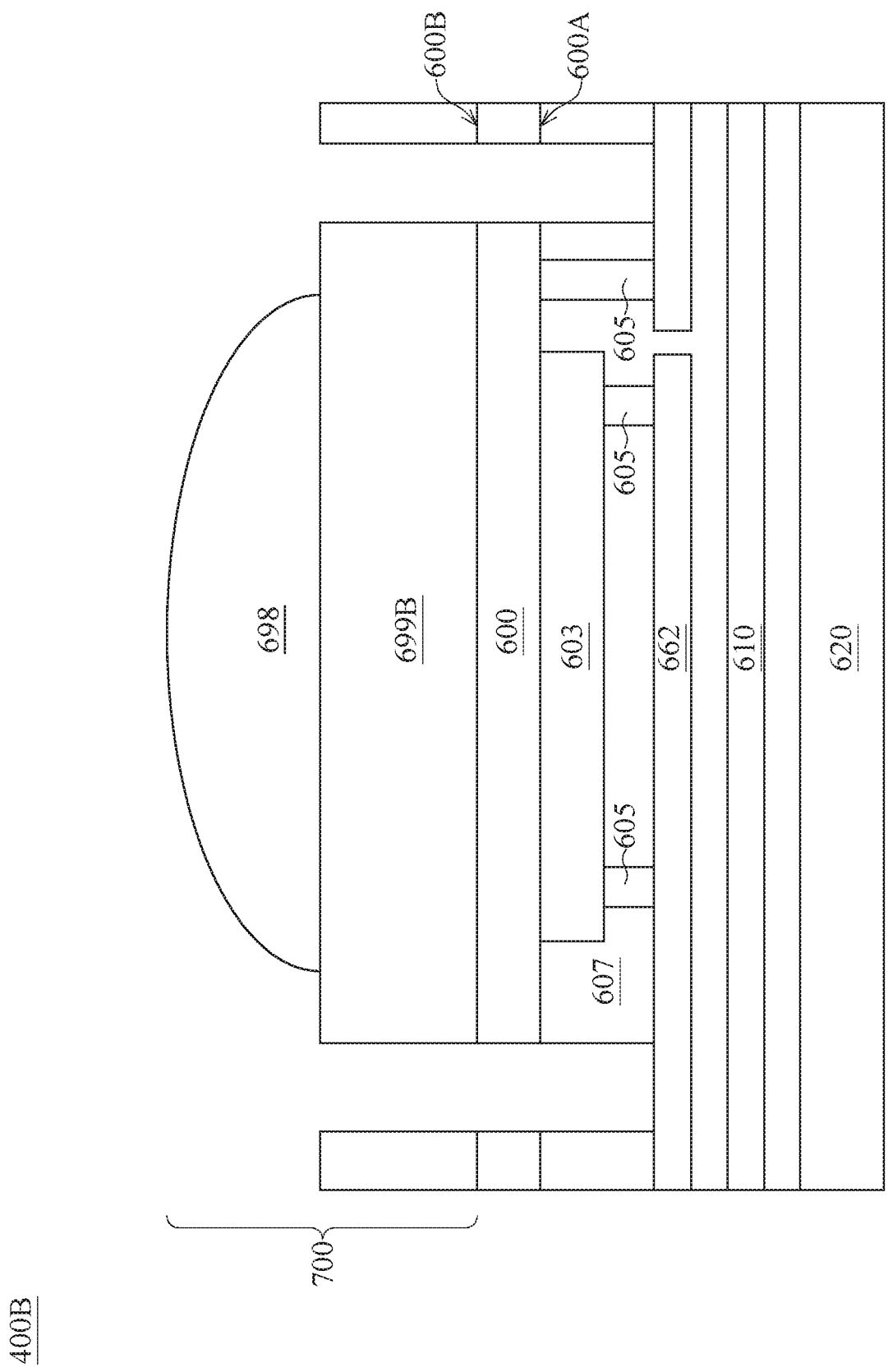
FIG. 40B illustrates a cross section of an optoelectronic device having a waveguide structure, according to some embodiments of the present disclosure.

FIG. 40B illustrates a cross section of an optoelectronic device 400B having a waveguide structure, according to some embodiments of the present disclosure. The optoelectronic device 400B is similar to the optoelectronic device 380B except that the waveguide structure 700, including the pedestal layer 699B and the optical element 698, is closer to a back surface 600B than a front surface 600A of the device substrate 600.

FIG. 40C illustrates a cross section of an optoelectronic device 400C having a waveguide structure, according to some embodiments of the present disclosure. The optoelectronic device 400C is similar to the optoelectronic device 380C except that the waveguide structure 700, including the pedestal layer 699C and the optical element 698, is closer to a back surface 600B than a front surface 600A of the device substrate 600.

Figure 40D:
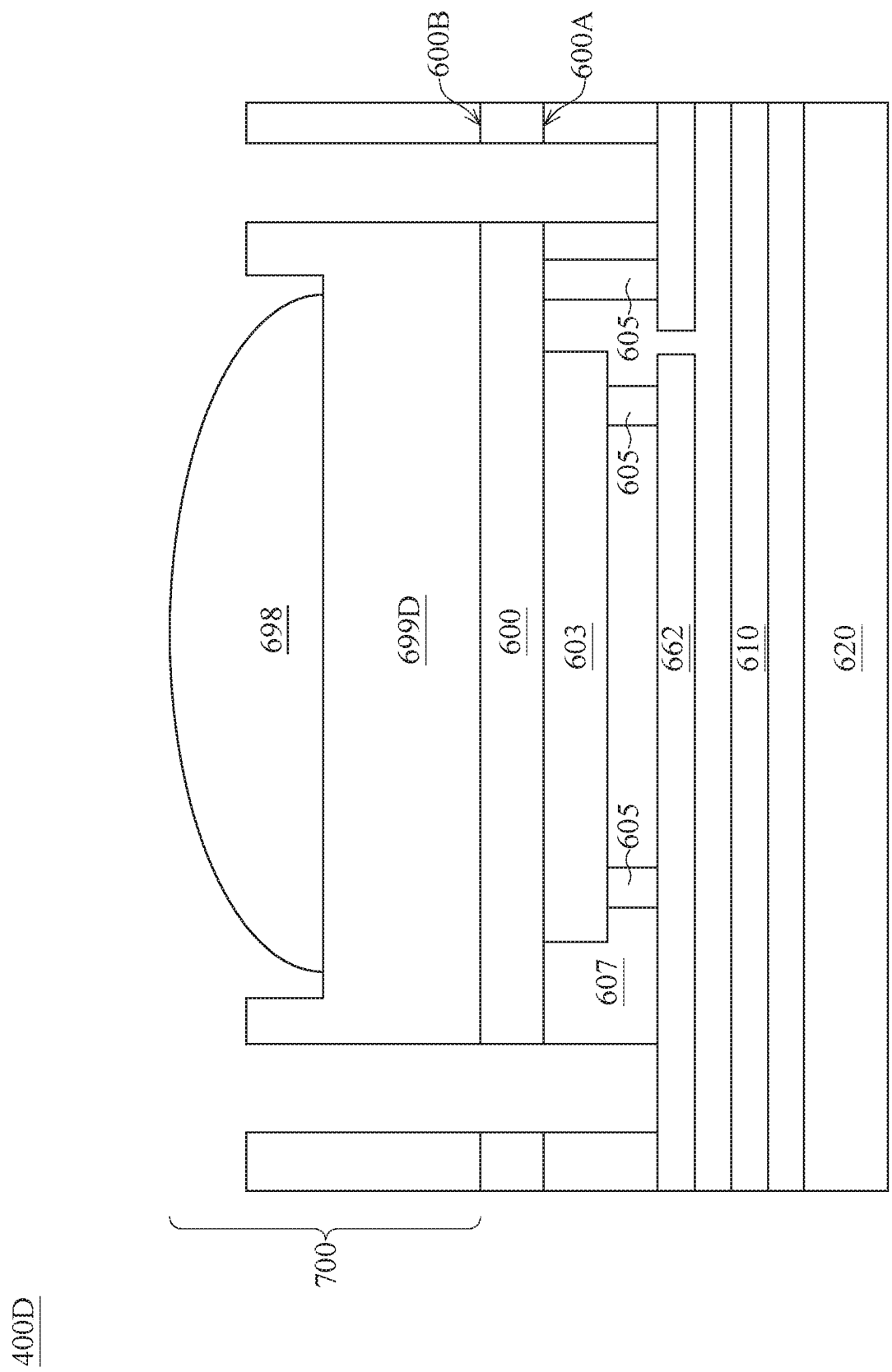
FIG. 40D illustrates a cross section of an optoelectronic device having a waveguide structure, according to some embodiments of the present disclosure.
Figure 41A:
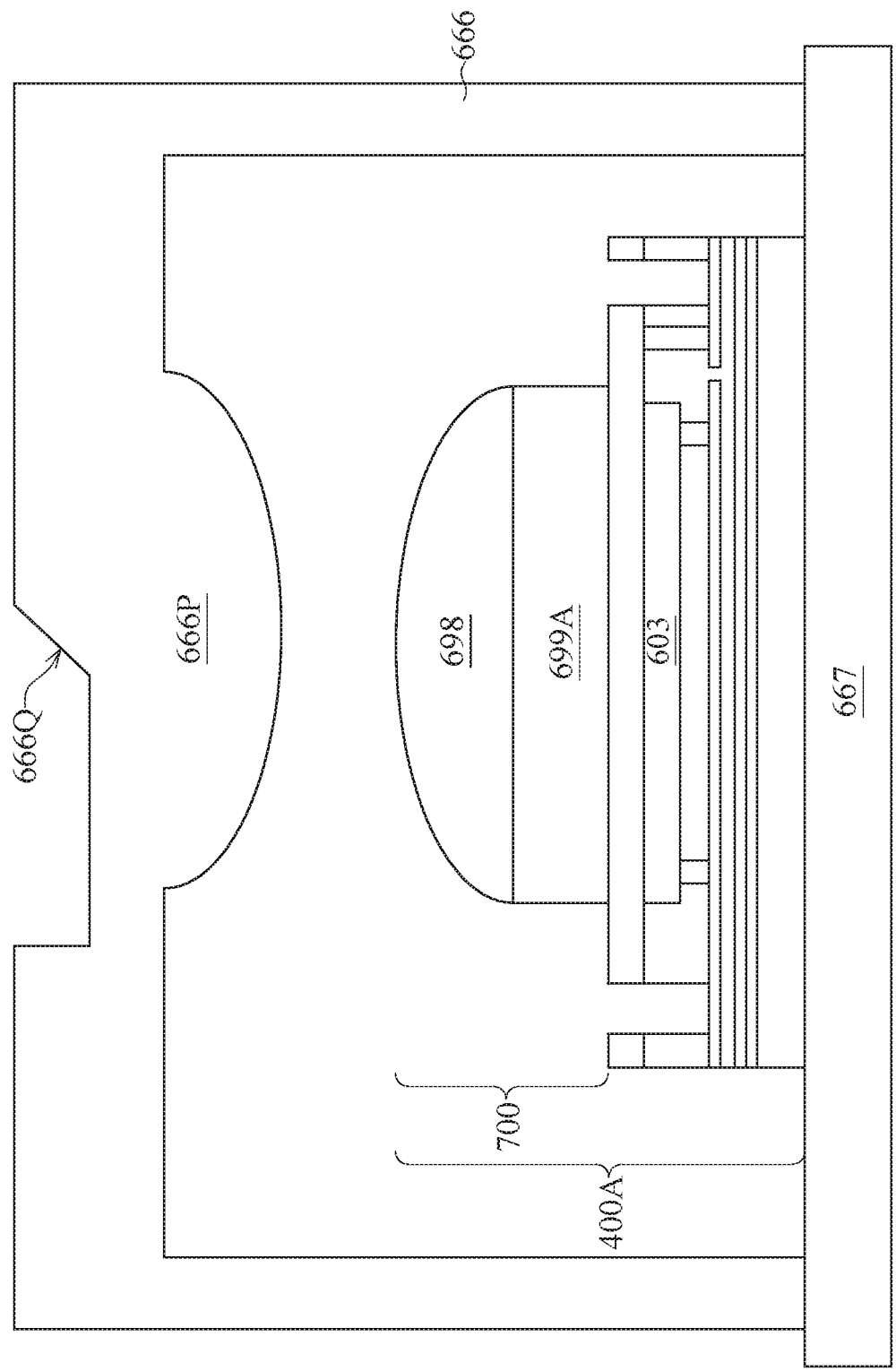
FIG. 41A illustrates a cross section of the optoelectronic device, according to some embodiments of the present disclosure.
Figure 41C:
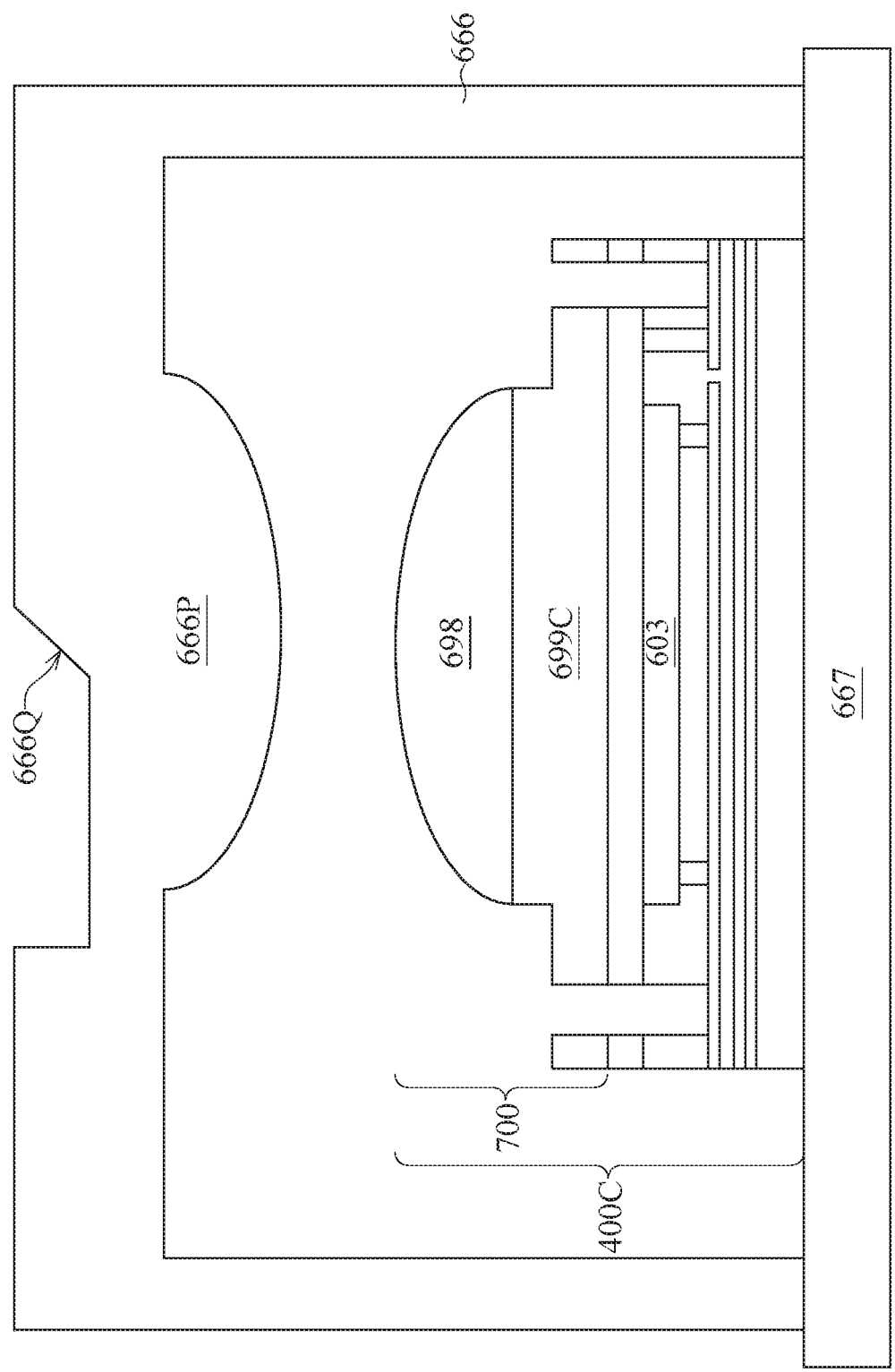
FIG. 41C illustrates a cross section of the optoelectronic device, according to some embodiments of the present disclosure.

FIG. 40D illustrates a cross section of an optoelectronic device 400D having a waveguide structure, according to some embodiments of the present disclosure. The optoelectronic device 400D is similar to the optoelectronic device 380D except that the waveguide structure 700, including the pedestal layer 699D and the optical element 698, is closer to a back surface 600B than a front surface 600A of the device substrate 600.

FIG. 41A, FIG. 41B, FIG. 41C, and FIG. 41D illustrates a cross section of a optoelectronic device 410A, 410B, 410C, 410D including a case 666 and the optoelectronic device 400A of FIG. 40A, the optoelectronic device 400B of FIG. 40B, the optoelectronic device 400C of FIG. 40C, and the optoelectronic device 400D of FIG. 40D respectively, according to some embodiments of the present disclosure. The aforesaid optoelectronic device 400A, 400B, 400C, and 400D can be disposed between the case 666 and the PCB 667, similar to the discussion in FIG. 39A to FIG. 39D. The optical element 698 may be aligned to, or vertically overlapping with the optical structure 666P from a top view perspective or a cross-sectional view perspective. Description of the optical structure 666Q of the case 666 can be referred to those addressed in FIG. 39A.

In accordance with a further embodiment of the present disclosure, the structures in the embodiments of the present disclosure can be combined or changed. For example, the waveguide structure 101 as shown in FIG. 1 can be the waveguide structure 191. For another example, the optoelectronic device 200 in FIG. 20 may also include a case 666 in FIG. 39A. For another example, the optoelectronic device array 220 in FIG. 22 may also include a case 666 in FIG. 39A, wherein all of the optoelectronic devices share one case 666. For another example, the optoelectronic device 360 in FIG. 36 may also include a case 666 in FIG. 39A As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 µm, no greater than 1 µm, or no greater than 0.5 µm.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A waveguide structure, comprising:
   a first portion, comprising:
      a first surface having a first width;
      a second surface having a second width, the second surface being opposite to the first surface; and
      a sidewall surface connecting the first surface and the second surface,
      wherein the first width is greater than the second width, wherein the sidewall surface is inclining from a normal vector of the second surface by an angle, the second width is greater than a minimal distance between the first surface and the second surface times $(\tan(2\theta)-\tan(\theta))$, wherein $\theta$ being the angle.

2. The waveguide structure of claim 1, wherein the angle is in a range of from greater than 0° to about 40°.

3. The waveguide structure of claim 1, further comprising an optical element over the first surface of the first portion.

4. The waveguide structure of claim 1, further comprising a second portion surrounding the first portion, wherein a refractive index of the second portion is smaller than a refractive index of the first portion.

5. The waveguide structure of claim 4, further comprising a reflecting layer between the first portion and the second portion.

6. The waveguide structure of claim 4, wherein the second portion further comprises a supporting layer surrounding the first portion.

7. The waveguide structure of claim 6, wherein a top surface of the supporting layer is at a level higher than a top surface of the first portion.

8. The waveguide structure of claim 7, wherein the supporting layer is spaced apart from the first portion.

9. An optoelectronic device, comprising:
a device substrate having a first surface and a second surface opposite to the first surface;
a photosensitive region adjacent to the first surface of the device substrate; and
a waveguide structure over the device substrate and the photosensitive region, comprising:
a first portion, comprising:
a first surface having a first width;
a second surface having a second width, the second surface being opposite to the first surface of the first portion and between the photosensitive region and the first surface of the first portion of the waveguide structure;
a sidewall surface connecting the first surface and the second surface of the first portion;
a dielectric layer surrounding the photosensitive region; and
an adhesion layer connecting the waveguide structure and the dielectric layer; wherein the first width is greater than the second width.

10. The optoelectronic device of claim 9, wherein the dielectric layer comprises a recess accommodating a portion of the waveguide structure.

11. The optoelectronic device of claim 9, wherein the waveguide structure further comprises a supporting layer surrounding the first portion.

12. The optoelectronic device of claim 11, wherein the waveguide structure further comprises an optical element over the first surface of the first portion.

13. The optoelectronic device of claim 9, wherein the photosensitive region includes germanium.

14. An optoelectronic device, comprising:
a device substrate having a first surface and a second surface opposite to the first surface;
a photosensitive region adjacent to the first surface of the device substrate; and
a waveguide structure over the photosensitive region, comprising:
a first portion, comprising:
a first surface having a first width;
a second surface having a second width; and
a sidewall surface connecting the first surface and the second surface of the first portion;
wherein the second width is greater than a minimal distance between the first surface and the second surface times $(\tan(2\theta)-\tan(\theta))$, wherein $\theta$ being an angle between a normal vector of the first surface of the device substrate and the sidewall surface.

15. The optoelectronic device of claim 14, wherein the waveguide structure further comprises an optical element over the first surface of the first portion.

16. The optoelectronic device of claim 14, wherein the waveguide structure further comprises a supporting layer surrounding the first portion.

17. The optoelectronic device of claim 14, wherein the photosensitive region includes germanium.

* * * * *